United States Patent
Handy et al.

(10) Patent No.: US 10,541,081 B2
(45) Date of Patent: Jan. 21, 2020

(54) METHOD FOR POTTING AN ELECTRICAL COMPONENT

(71) Applicants: Edward Handy, Goodyear, AZ (US); Grant A. MacLennan, Scottsdale, AZ (US); Hans Wennerstrom, Scottsdale, AZ (US)

(72) Inventors: Edward Handy, Goodyear, AZ (US); Grant A. MacLennan, Scottsdale, AZ (US); Hans Wennerstrom, Scottsdale, AZ (US)

( * ) Notice: Subject to any disclaimer, the term of this patent is extended or adjusted under 35 U.S.C. 154(b) by 0 days.

(21) Appl. No.: 15/939,167

(22) Filed: Mar. 28, 2018

(65) Prior Publication Data
US 2019/0027305 A1    Jan. 24, 2019

Related U.S. Application Data

(60) Division of application No. 14/988,605, filed on Jan. 5, 2016, now Pat. No. 10,312,018, which is a
(Continued)

(51) Int. Cl.
*H01F 7/06*      (2006.01)
*H01F 41/00*     (2006.01)
(Continued)

(52) U.S. Cl.
CPC .......... *H01F 41/005* (2013.01); *H01F 27/085* (2013.01); *H01F 27/255* (2013.01);
(Continued)

(58) Field of Classification Search
CPC .......... H01F 1/24; H01F 41/005; H01F 41/06; H01F 37/00; H01F 27/08; H01F 27/085; H01F 27/255; H01F 27/266; H01F 27/2823; H01F 27/2895; H01F 27/306; H05K 3/30; H01G 4/38; H01G 4/40; H02M 1/126
See application file for complete search history.

(56) References Cited

U.S. PATENT DOCUMENTS

| | | | |
|---|---|---|---|
| 6,572,830 B1 * | 6/2003 | Burdon | F04B 19/006 |
| | | | 156/89.11 |
| 6,864,774 B2 * | 3/2005 | Kanetaka | H01F 41/046 |
| | | | 336/200 |

(Continued)

*Primary Examiner* — Paul D Kim
(74) *Attorney, Agent, or Firm* — Kevin Hazen

(57) ABSTRACT

A high frequency inductor filter cooling apparatus, method of manufacture, and method of use thereof is described. In one embodiment, an inductor is potted in an epoxy-silica mixture to facilitate thermal transfer from the inductor. The inductor is optionally used with a capacitor to filter/invert/convert power. The inductor optionally comprises a distributed gap core and/or a powdered core material. In one example, a minimum carrier frequency used with the filter is above that usable by a traditional wound iron-steel inductor, such as greater than seven hundred or ten thousand Hertz at fifty or more amperes. Optionally, the inductor is used in an inverter/converter apparatus in conjunction with a notched low-pass filter, a low pass filter combined with a notch filter and a high frequency roll off filter, and/or one or more of a silicon carbide, gallium arsenide, and/or gallium nitride based transistor.

6 Claims, 27 Drawing Sheets

Related U.S. Application Data continuation-in-part of application No. 14/260,014, filed on Apr. 23, 2014, now Pat. No. 9,590,486, and a continuation-in-part of application No. 13/954,887, filed on Jul. 30, 2013, now Pat. No. 9,257,895, which is a continuation-in-part of application No. 13/470,281, filed on May 12, 2012, now Pat. No. 8,902,034, which is a continuation-in-part of application No. 13/107,828, filed on May 13, 2011, now Pat. No. 8,373,530, which is a continuation-in-part of application No. 12/098,880, filed on Apr. 7, 2008, now Pat. No. 7,973,628.

(60) Provisional application No. 60/910,333, filed on Apr. 5, 2007.

(51) Int. Cl.
| | |
|---|---|
| *H01F 41/06* | (2016.01) |
| *H05K 3/30* | (2006.01) |
| *H01F 27/08* | (2006.01) |
| *H01F 27/255* | (2006.01) |
| *H01F 27/26* | (2006.01) |
| *H01F 27/28* | (2006.01) |
| *H01F 27/30* | (2006.01) |
| *H01F 37/00* | (2006.01) |
| *H02M 1/12* | (2006.01) |
| *H01G 4/38* | (2006.01) |
| *H01G 4/40* | (2006.01) |
| *H01F 1/24* | (2006.01) |

(52) U.S. Cl.
CPC ....... *H01F 27/266* (2013.01); *H01F 27/2823* (2013.01); *H01F 27/2895* (2013.01); *H01F 27/306* (2013.01); *H01F 37/00* (2013.01); *H01F 41/06* (2013.01); *H02M 1/126* (2013.01); *H05K 3/30* (2013.01); *H01F 1/24* (2013.01); *H01F 27/08* (2013.01); *H01G 4/38* (2013.01); *H01G 4/40* (2013.01); *Y02B 70/1483* (2013.01); *Y02T 10/7022* (2013.01)

(56) References Cited

U.S. PATENT DOCUMENTS

| | | | | |
|---|---|---|---|---|
| 7,655,348 | B2* | 2/2010 | Nanno | H01M 2/30 |
| | | | | 429/163 |
| 8,203,411 | B2* | 6/2012 | MacLennan | H01F 27/327 |
| | | | | 336/55 |
| 8,519,813 | B2* | 8/2013 | MacLennan | H01F 27/10 |
| | | | | 336/67 |
| 8,624,696 | B2* | 1/2014 | MacLennan | H01F 17/06 |
| | | | | 336/61 |
| 9,553,499 | B2* | 1/2017 | Handy | H02M 1/126 |
| 2009/0128276 | A1* | 5/2009 | Horowy | H01F 17/062 |
| | | | | 336/96 |

* cited by examiner

METHOD FOR POTTING AN ELECTRICAL COMPONENT

CROSS REFERENCES TO RELATED APPLICATIONS

This application is a divisional of U.S. patent application Ser. No. 14/988,605 filed Jan. 5, 2016, now U.S. Pat. No. 10,312,018, which: is a continuation-in-part of U.S. patent application Ser. No. 14/260,014 filed Apr. 23, 2015, now U.S. Pat. No. 9,590,486; and is a continuation-in-part of U.S. patent application Ser. No. 13/954,887 filed Jul. 30, 2013, now U.S. Pat. No. 9,257,895, which is a continuation-in-part of U.S. patent application Ser. No. 13/470,281 filed May 12, 2012, now U.S. Pat. No. 8,902,034, which is a continuation-in-part of U.S. patent application Ser. No. 13/107,828 filed May 13, 2011, now U.S. Pat. No. 8,373,530, which is a continuation-in-part of U.S. patent application Ser. No. 12/098,880 filed Apr. 4, 2008, now U.S. Pat. No. 7,973,628, which claims benefit of 15 U.S. provisional patent application No. 60/910,333 filed Apr. 5, 2007, all of which are incorporated herein in their entirety by this reference thereto.

BACKGROUND OF THE INVENTION

Field of the Invention

The invention relates to a power converter apparatus, method of manufacture, and method of use thereof.

Discussion of the Prior Art

Power is generated from a number of sources. The generated power is necessarily converted, such as before entering the power grid or prior to use. In many industrial applications, electromagnetic components, such as inductors and capacitors, are used in power filtering. Important factors in the design of power filtering methods and apparatus include cost, size, efficiency, resonant points, inductor impedance, inductance at desired frequencies, and/or inductance capacity.

For example, when a metal-oxide-semiconductor field-effect transistor (MOSFET) or an insulated gate bipolar transistor (IGBT) switches at high frequencies, output from the inverter going to a motor now has substantial frequencies in the 50-100 kHz range. The power cables exiting the drive or inverter going to a system load using standard industrial power cables were designed for 60 Hz current. When frequencies in the 50-100 kHz range are added to the current spectrum, the industrial power cables overheat because of the high frequency travels only on the outside diameter of the conductor causing a severe increase in AC resistance of the cable and resultant overheating of the cables and any associated device, such as a motor.

What is needed is a more efficient inductor apparatus and method of use thereof.

SUMMARY OF THE INVENTION

The invention comprises a potted inductor apparatus, method of manufacture, and method of use thereof.

BRIEF DESCRIPTION OF THE DRAWINGS

A more complete understanding of the present invention is derived by referring to the detailed description and described embodiments when considered in connection with the following illustrative figures. In the following figures, like reference numbers refer to similar elements and steps throughout the figures.

Figure 1A:
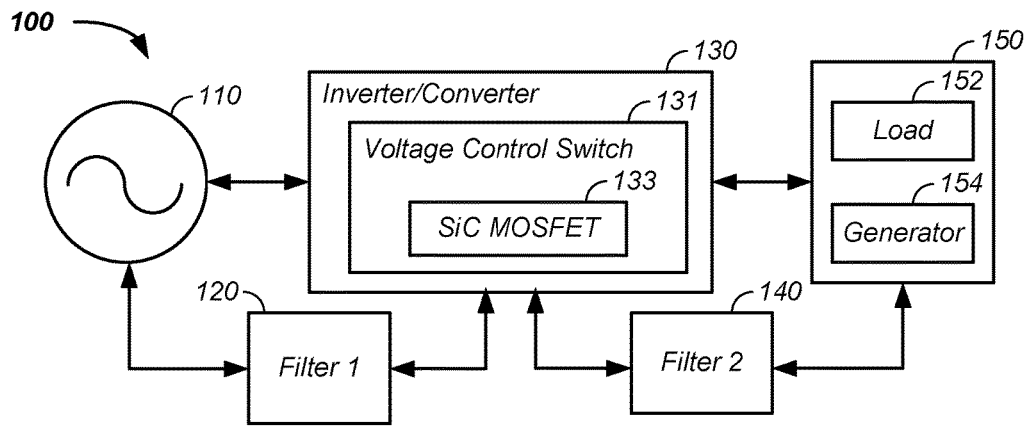
FIGS. 1(A-H) illustrate a power filtering process (FIG. 1A), a low frequency power system (FIG. 1B), a high frequency power processing system (FIG. 1C and FIG. 1H), a grid power filtering process, (FIG. 1D), an AC power processing system (FIG. 1E), an enclosed AC power processing system (FIG. 1F), and a generated power processing system (FIG. 1G)

Elements and steps in the figures are illustrated for simplicity and clarity and have not necessarily been rendered according to any particular sequence. For example, steps that are performed concurrently or in different order are illustrated in the figures to help improve understanding of embodiments of the present invention.

DETAILED DESCRIPTION OF EXEMPLARY EMBODIMENTS

The invention comprises an inductor cooling apparatus, method of manufacture, and method of use thereof, where the inductor is potted in a potting material enhanced with a heat transfer agent. In one embodiment, the invention includes a method for potting an electrical component, comprising the steps of: (1) placing the electrical component in a housing; (2) preheating both a potting agent and a heat transfer agent to in excess of ninety-five degrees Fahrenheit; (3) mixing the potting agent, comprising a thermal conductivity of less than 0.3 W/m-K, with the heat transfer agent, comprising a thermal conductivity of greater than 0.5 W/m-K, to form a potting material; and (4) dispensing the potting material about the electrical component in the housing to form a potted electrical component, the potting material positioned about the electrical component, within the housing, and within a quarter inch of the electrical component, where the heat transfer agent comprises particles, where ninety-five percent of the particles comprise a diameter of less than 1500 micrometers, where the potting agent comprises at least thirty percent by mass of the potting material, and where the heat transfer agent comprises at least thirty percent by mass of the potting material.

In one embodiment, a high frequency inductor filter cooling apparatus, method of manufacture, and method of use thereof is described. For example, an inductor is potted in a potting material comprising a potting agent and a heat transfer agent. In one case, the potting agent comprises an epoxy and the heat transfer agent comprises silica and/or a mixture of silica particles.

The inductor is optionally used to filter/invert/convert power. The inductor optionally comprises a distributed gap core and/or a powdered core material. In one example, the minimum carrier frequency is above that usable by an iron-steel inductor, such as greater than ten kiloHertz at fifty or more amperes. Optionally, the inductor is used in an inverter/converter apparatus, where output power has a carrier frequency, modulated by a fundamental frequency, and a set of harmonic frequencies, in conjunction with a notched low-pass filter, a low pass filter combined with a notch filter and a high frequency roll off filter, and/or one or more of a silicon carbide, gallium arsenide, and/or gallium nitride based transistor.

In another example, the potted inductor is an element of an inductor-capacitor filter, where the filter comprises: an inductor with a distributed gap core and/or a powdered core in a notch filter circuit, such as a notched low-pass filter or a low pass filter combined with a notch filter and a high frequency roll off filter. The resulting distributed gap inductor based notch filter efficiently passes a carrier frequency of greater than 700, 800, or 1000 Hz while still sufficiently attenuating a fundamental frequency at 1500, 2000, or 2500 Hz, which is not achievable with a traditional steel based inductor due to the physical properties of the steel at high currents and voltages, such as at fifty or more amperes.

In another example, the potted inductor is used to filter/convert power, where the inductor comprises a distributed gap core and/or a powdered core. The inductor core is wound with one or more turns, where multiple turns are optionally electrically wired in parallel. In one example, a minimum carrier frequency is above that usable by traditional inductors, such as a laminated steel inductor, an iron-steel inductor, and/or a silicon steel inductor, for at least fifty amperes at at least one kHz, as the carrier frequency is the resonant point of the inductor and harmonics are thus not filtered using the iron-steel inductor core. In stark contrast, the distributed gap core allows harmonic removal/attenuation at greater than ten kiloHertz at fifty or more amperes. The core is optionally an annular core, a rod-shaped core, a straight core, a single core, or a core used for multiple phases, such as a 'C' or 'E' core. Optionally, the inductor is used in an inductor/converter apparatus, where output power has a carrier frequency, modulated by a fundamental frequency, and a set of harmonic frequencies, in conjunction with one or more of a silicon carbide, gallium arsenide, and/or gallium nitride based transistor, such as a metal-oxide-semiconductor field-effect transistor (MOSFET).

In yet another embodiment, an inverter and/or an inverter converter system yielding high frequency harmonics, referred to herein as a high frequency inverter, is coupled with a high frequency filter to yield clean power, reduced high frequency harmonics, and/or an enhanced energy processing efficiency system. In one case, a silicon carbide metal-oxide-semiconductor field-effect transistor (MOSFET) is used in the conversion of power from the grid and the MOSFET outputs current, voltage, energy, and/or high frequency harmonics greater than 60 Hz to an output filter, such as a distributed gap inductor, which filters the output of the MOSFET. In one illustrative example, a high frequency inductor and/or converter apparatus is coupled with a high frequency filter system, such as an inductor linked to a capacitor, to yield non-sixty Hertz output. In another illustrative example, an inductor/converter apparatus using a silicon carbide transistor outputs power having a carrier frequency, modulated by a fundamental frequency, and a set of harmonic frequencies. A filter, comprising the potted inductor having a distributed gap core material and optional magnet wires, receives power output from the inverter/converter and processes the power by passing the fundamental frequency while reducing amplitude of the harmonic frequencies.

In another embodiment, a high frequency inverter/high frequency filter system is used in combination with a distributed gap inductor, optionally for use with medium voltage power, apparatus and method of use thereof, is provided for processing harmonics from greater than 60, 65, 100, 1950, 2000, 4950, 5000, 6950, 7000, 10,000, 50,000, and/or 100,000 Hertz.

In another embodiment, an inductor-capacitor filter comprises: an inductor with a distributed gap core and/or a powdered core in a notch filter circuit, such as a notched low-pass filter or a low pass filter combined with a notch filter and a high frequency roll off filter. The resulting distributed gap inductor based notch filter efficiently passes a carrier frequency of greater than 700, 800, or 1000 Hz while still sufficiently attenuating a fundamental frequency at 1500, 2000, or 2500 Hz, which is not achievable with a traditional steel based inductor due to the physical properties of the steel at high currents and voltages, such as at fifty or more amperes.

In yet still another embodiment, a high frequency inverter/high frequency filter system is used in combination with an inductor mounting and cooling system.

In still yet another embodiment, a high frequency inverter/high frequency filter system is used in combination with a distributed gap material used in an inductor couple with an inverter and/or converter.

Methods and apparatus according to various embodiments preferably operate in conjunction with an inductor and/or a capacitor. For example, an inverter/converter system using at least one inductor and at least one capacitor optionally mounts the electromagnetic components in a vertical format, which reduces space and/or material requirements. In another example, the inductor comprises a substantially annular core and a winding. The inductor is preferably configured for high current applications, such as at or above about 50, 100, or 200 amperes; for medium voltage power systems, such as power systems operating at about 2,000 to 5,000 volts; and/or to filter high frequencies, such as greater than about 60, 100, 1000, 2000, 3000, 4000, 5000, or 9000 Hz. In yet another example, a capacitor array is preferably used in processing a provided power supply. Optionally, the high frequency filter is used to selectively pass higher frequency harmonics.

Embodiments are described partly in terms of functional components and various assembly and/or operating steps. Such functional components are optionally realized by any number of components configured to perform the specified functions and to achieve the various results. For example, embodiments optionally use various elements, materials, coils, cores, filters, supplies, loads, passive components, and/or active components, which optionally carry out functions related to those described. In addition, embodiments described herein are optionally practiced in conjunction with any number of applications, environments, and/or passive circuit elements. The systems and components described herein merely exemplify applications. Further, embodiments described herein, for clarity and without loss of generality, optionally use any number of conventional techniques for manufacturing, assembling, connecting, and/or operation. Components, systems, and apparatus described herein are optionally used in any combination and/or permutation.

Electrical System

An electrical system preferably includes an electromagnetic component operating in conjunction with an electric current to create a magnetic field, such as with a transformer, an inductor, and/or a capacitor array.

Referring now to FIG. 1A, in one embodiment, the electrical system comprises an inverter/converter system configured to output: (1) a carrier frequency, the carrier frequency modulated by a fundamental frequency, and (2) a set of harmonic frequencies of the fundamental frequency. The inverter/converter 130 system optionally includes a voltage control switch 131, such as a silicon carbide insulated gate bipolar transistor 133. Optionally power output by the inverter/converter system is processed using a downstream-circuit electrical power filter, such as an inductor and a capacitor, configured to: substantially remove the carrier frequency, pass the fundamental frequency, and reduce amplitude of a largest amplitude harmonic frequency of the set of harmonic frequencies by at least ninety percent. A carrier frequency is optionally any of: a nominal frequency or center frequency of an analog frequency modulation, phase modulation, or double-sideband suppressed-carrier transmission, AM-suppressed carrier, or radio wave. For example a carrier frequency is an unmodulated electromagnetic wave or a frequency-modulated signal.

In another embodiment, the electrical system comprises an inverter/converter system having a filter circuit, such as a low-pass filter and/or a high-pass filter. The power supply or inverter/converter comprises any suitable power supply or inverter/converter, such as an inverter for a variable speed drive, an adjustable speed drive, and/or an inverter/converter that provides power from an energy device. Examples of an energy device include an electrical transmission line, a three-phase high power transmission line, a generator, a turbine, a battery, a flywheel, a fuel cell, a solar cell, a wind turbine, use of a biomass, and/or any high frequency inverter or converter system.

The electrical system described herein is optionally adaptable for any suitable application or environment, such as variable speed drive systems, uninterruptible power supplies, backup power systems, inverters, and/or converters for renewable energy systems, hybrid energy vehicles, tractors, cranes, trucks and other machinery using fuel cells, batteries, hydrogen, wind, solar, biomass and other hybrid energy sources, regeneration drive systems for motors, motor testing regenerative systems, and other inverter and/or converter applications. Backup power systems optionally include, for example, superconducting magnets, batteries, and/or flywheel technology. Renewable energy systems optionally include any of: solar power, a fuel cell, a wind turbine, hydrogen, use of a biomass, and/or a natural gas turbine.

In various embodiments, the electrical system is adaptable for energy storage or a generation system using direct current (DC) or alternating current (AC) electricity configured to backup, store, and/or generate distributed power. Various embodiments described herein are particularly suitable for high current applications, such as currents greater than about one hundred amperes (A), currents greater than about two hundred amperes, and more particularly currents greater than about four hundred amperes. Embodiments described herein are also suitable for use with electrical systems exhibiting multiple combined signals, such as one or more pulse width modulated (PWM) higher frequency signals superimposed on a lower frequency waveform. For example, a switching element may generate a PWM ripple on a main supply waveform. Such electrical systems operating at currents greater than about one hundred amperes operate within a field of art substantially different than low power electrical systems, such as those operating at low-ampere levels or at about 2, 5, 10, 20, or 50 amperes.

Various embodiments are optionally adapted for high-current inverters and/or converters. An inverter produces alternating current from a direct current. A converter processes AC or DC power to provide a different electrical waveform. The term converter denotes a mechanism for either processing AC power into DC power, which is a rectifier, or deriving power with an AC waveform from DC power, which is an inverter. An inverter/converter system is either an inverter system or a converter system. Converters are used for many applications, such as rectification from AC to supply electrochemical processes with large controlled levels of direct current, rectification of AC to DC followed by inversion to a controlled frequency of AC to supply variable-speed AC motors, interfacing DC power sources, such as fuel cells and photoelectric devices, to AC distribution systems, production of DC from AC power for subway and streetcar systems, for controlled DC voltage for speed-control of DC motors in numerous industrial applications, and/or for transmission of DC electric power between rectifier stations and inverter stations within AC generation and transmission networks.

Filtering

Referring now to FIG. 1A, a power processing system 100 is provided. The power processing system 100 operates on current and/or voltage systems. FIG. 1A figuratively shows how power is moved from a grid 110 to a load and how power is moved from a generator 154 to the grid 110 through an inverter/converter system 130. Optionally, a first filter 120 is placed in the power path between the grid 100 and the inverter/converter system 130. Optionally, a second filter 140 is positioned between the inverter/converter system 130 and a load 152 or a generator 154. The second filter 140 is optionally used without use of the first filter 120. The first filter 120 and second filter 140 optionally use any number and configuration of inductors, capacitors, resistors, junctions, cables, and/or wires.

Still referring to FIG. 1A, in a first case, power or current from the grid 110, such as an AC grid, is processed to provide current or power 150, such as to a load 152. In a second case, the current or power 150 is produced by a generator and is processed by one or more of the second filter 140, inverter/converter system 130, and/or first filter 120 for delivery to the grid 110. In the first case, a first filter 120 is used to protect the AC grid from energy reflected from the inverter/converter system 130, such as to meet or exceed IEEE 519 requirements for grid transmission. Subsequently, the electricity is further filtered, such as with the second filter 140 or is provided to the load 152 directly. In the second case, the generated power 154 is provided to the inverter/converter system 130 and is subsequently filtered, such as with the first filter 120 before supplying the power to the AC grid. Examples for each of these cases are further described, infra.

Figure 1B:
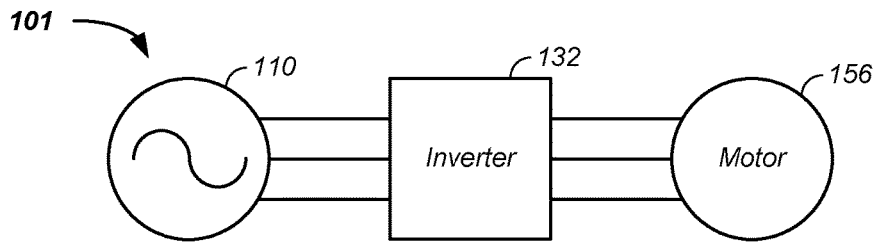

Referring now to FIG. 1B, a low frequency power processing system 101 is illustrated where power from the grid 110 is processed by a low frequency inverter 132 and the processed power is delivered to a motor 156. The low frequency power system 101 uses traditional 60 Hz/120V AC power and the low frequency inverter 132 yields output in the 30-90 Hz range, referred to herein as low frequency and/or standard frequency. If the low frequency inverter 132 outputs high frequency power, such as 60+ harmonics or higher frequency harmonics, such as about 2000, 5000, or 7000 Hz, then traditional silicon iron steel in low frequency inverters 132, low frequency inductors, and/or low frequency power lines overheat. These inductors overheat due to excessive core losses and AC resistance losses in the conductors in the circuit. The overheating is a direct result of the phenomenon known as skin loss, where the high frequencies only travel on the outside diameter of a conductor, which causes an increase in AC resistance of the cable, the resistance resultant in subsequent overheating.

Figure 1C:
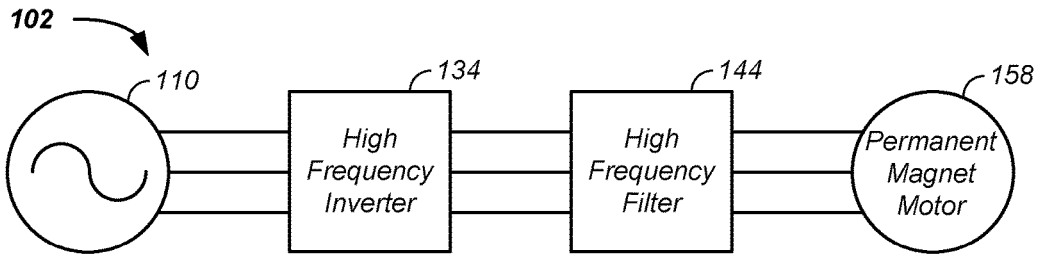

Referring now to FIG. 1C, a high frequency power processing system 102 is illustrated, where a high frequency filter 144 is inserted between the inverter/converter 130 and/or a high frequency inverter 134 and the load 152, motor 156, or a permanent magnet motor 158. For clarity of presentation and without limitation, the high frequency filter, a species of the second filter 140, is illustrated between a high frequency inverter 134 and the permanent magnet motor 158. The high frequency inverter 134, which is an example of the inverter converter 130, yields output power having frequencies or harmonics in the range of 2,000 to 100,000 Hz, such as at about 2000, 5000, and 7000 Hz. In a first example, the high frequency inverter 134 is a MOSFET inverter that uses silicon carbide and is referred to herein as a silicon carbide MOSFET. In a second example, the high frequency filter 144 uses an inductor comprising at least one of: a distributed gap material, a magnetic material and a coating agent, Sendust, and/or any of the properties described, infra, in the "Inductor Core/Distributed Gap" section. In a preferred embodiment, output from the high frequency inverter 134 is processed by the high frequency filter 144 as the high frequency output filters described herein do not overheat due to the magnetic properties of the core and/or windings of the inductor and the higher frequency filter removes high frequency harmonics that would otherwise result in overheating of an electrical component. Herein, a reduction in high frequency harmonics is greater than a 20, 40, 60, 80, 90, and/or 95 percent reduction in at least one high frequency harmonic, such as harmonic of a fundamental frequency modulating a carrier frequency. Preferably, the inductor/capacitor combination described herein reduces amplitude of the largest 1, 2, 3, 4, 5, 6, 7, 8, 9, 10 or more largest harmonic frequencies by at least 10, 20, 30, 40, 50, 60, 70, 80, 90, 95, or 99 percent. In one particular case, the distributed gap material used in the inductor described herein, processes output from a silicon carbide MOSFET with significantly less loss than an inductor using silicon iron steel.

Herein, for clarity of presentation, silicon carbide and/or a compound of silicon and carbon is used to refer to any of the 250+ forms of silicon carbide, alpha silicon carbide, beta silicon carbide, a polytype crystal form of silicon carbide, and/or a compound, where at least 80, 85, 90, 95, 96, 97, 98, or 99 percent of the compound comprises silicon and carbon by weight, such as produced by the Lely method or as produced using silicon oxide found in plant matter. The compound and/or additives of silicon and carbon is optionally pure or contains substitutions/impurities of any of nitrogen, phosphorus, aluminum, boron, gallium, and beryllium. For example, doping the silicon carbide with boron, aluminum, or nitrogen is performed to enhance conductivity. Further, silicon carbide refers to the historically named carborundum and the rare natural mineral moissanite.

Insulated gate bipolar transistors are used in examples herein for clarity and without loss of generality. Generally, MOSFETs and insulate gate bipolar transistors (IGBTs) are examples of the switching devices, which also include free-wheeling diodes (FWDs) also known as freewheeling diodes. Further, a metal-oxide-semiconductor field-effect transistor (MOSFET) is optionally used in place or in combination with an IGBT. Both the IGBT and MOSFET are transistors, such as for amplifying or switching electronic signals and/or as part of an electrical filter system. While a MOSFET is used as jargon in the field, the metal in the acronym MOSFET is optionally and preferably a layer of polycrystalline silicon or polysilicon. Generally an IGBT or MOSFET uses a form of gallium arsenide, silicon carbide, and/or gallium nitride based transistor.

The use of the term silicon carbide MOSFET includes use of silicon carbide in a transistor. More generally, silicon carbide (SiC) crystals, or wafers are used in place of silicon (Si) and/or gallium arsenide (GaAs) in a switching device, such as a MOSFET, an IGBT, or a FWD. More particularly, a Si PiN diode is replaced with a SiC diode and/or a SiC Schottky Barrier Diode (SBD). In one preferred case, the IGBT or MOSFET is replaced with a SiC transistor, which results in switching loss reduction, higher power density modules, and cooler running temperatures. Further, SiC has an order of magnitude greater breakdown field strength compared to Si allowing use in high voltage inverters. For clarity of presentation, silicon carbide is used in examples, but gallium arsenide and/or gallium nitride based transistors are optionally used in conjunction with or in place of the silicon carbide crystals.

Still referring to FIG. 1C, silicon carbide MOSFETs have considerably lower switching losses than conventional MOSFET technologies. These lower losses allow the silicon carbide MOSFET module to switch at significantly higher switching frequencies and still maintain the necessary low switching losses needed for the efficiency ratings of the inverter system. In a preferred embodiment, three phase AC power is processed by an inverter/converter and further processed by an output filter before delivery to a load. The output filter optionally uses any of the inductor materials, windings, shapes, configurations, mounting systems, and/or cooling systems described herein.

Figure 1D:
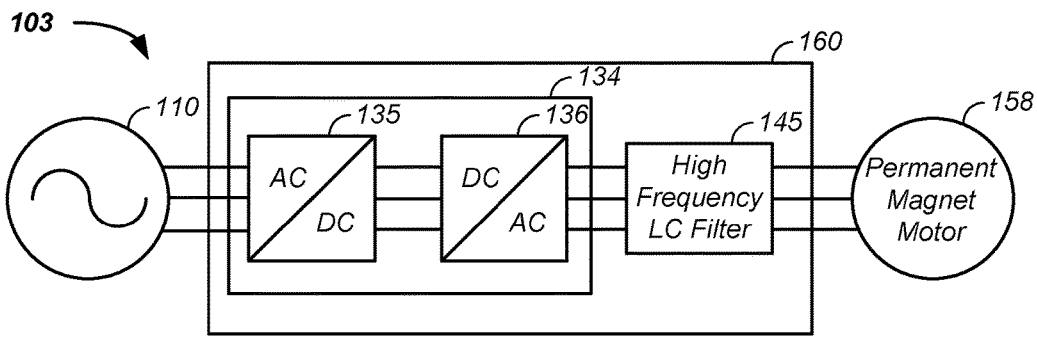

Referring now to FIG. 1D, an example of the high frequency inverter 134 and a high frequency inductor-capacitor filter 145 in a single containing unit 160 or housing is figuratively illustrated in a combined power filtering system 103. In this example, the high frequency inverter 134 is illustrated as an alternating current to direct current converter 135 and as a direct current to alternating current converter 136, the second filter 140 is illustrated as the high frequency LC filter 145, and the load 152 is illustrated as a permanent magnet motor 158. Herein, the permanent magnet motor operates using frequencies of 90-2000 Hz, such as greater than 100, 200, 500, or 1000 Hz and less than 2000, 1500, 1000, or 500 Hz. The inventor has determined that use of the single containing unit 160 to contain an inverter 132 and high frequency filter 145 is beneficial when AC drives begin to use silicon carbide MOSFET's and the switching frequency on high power drives goes up, such as to greater than 2000, 40,000, or 100,000 Hz. The inventor has further determined that when MOSFET's operate at higher frequencies an output filter, such as an L-C filter or the high frequency filter 144, is required because the cables overheat from high harmonic frequencies generated using a silicon carbide MOSFET if not removed.

Still referring to FIG. 1D, the alternating current to direct current converter 135 and the direct current to alternating current converter 136 are jointly referred to as an inverter, a variable speed drive, an adjustable speed drive, an adjustable frequency drive, and/or an adjustable frequency inverter. For clarity of presentation and without loss of generality, the term variable speed drive is used herein to refer to this class of drives. The inventor has determined that use of a distributed gap filter, as described supra, in combination with the variable speed drive is used to remove higher frequency harmonics from the output of the variable speed drive and/or to pass selected frequencies, such as frequencies from 90 to 2000 Hz to a permanent magnet motor. The inventor has further determined that the high frequency filter 144, such as the high frequency inductor-capacitor filter 145 is preferably coupled with the direct current to alternating current converter 136 of the inverter 132 or high frequency inverter 134.

Cooling the output filter is described, infra, however, the cooling units described, infra, preferably contain the silicon carbide MOSFET or a silicon carbide IGBT inverter so that uncooled output wires are not used between the silicon carbide inverter and the high frequency LC filter 145 where loss and/or failure due to heating would occur. Hence, the conductors from the inverter 145 are preferably cooled, in one container or multiple side-by-side containers, without leaving a cooled environment until processed by the high frequency filter 144 or high frequency LC filter 145.

Still referring to FIG. 1D, where the motor or load 152 is a long distance from an AC drive, the capacitance of the long cables amplifies the harmonics leaving the AC drive where the amplified harmonics hit the motor. A resulting corona on the motor windings causes magnet wire in the motor windings to short between turns, which results in motor failure. The high frequency filter 144 is used in these cases to remove harmonics, increase the life of the motor, enhance reliability of the motor, and/or increase the efficiency of the motor. Particularly, the silicon carbide MOSFET/high frequency filter 144 combination finds uses in electro submersible pumps, for lifting oil deep out of the ground, and/or in fracking applications. Further, the silicon carbide MOSFET/high frequency filter 144 combination finds use generally in permanent motor applications, which spin at much higher speeds and require an AC drive to operate. For example, AC motors used in large tonnage chillers and air compressors will benefit from the high frequency LC filter 145/silicon carbide MOSFET combination.

Figure 1E:
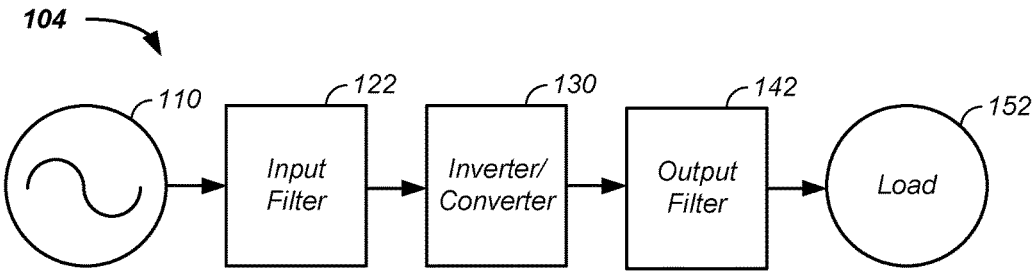

Referring now to FIG. 1E, an example of AC power processing system 104 processing AC power from the grid 110 is provided. In this case, electricity flows from the AC grid to the load 152. In this example, AC power from the grid 110 is passed through an optional input filter 122 to the inverter/converter system 130. The input filter 122 uses at least one inductor and optionally uses at least one capacitor and/or other electrical components. The input filter functions to protect quality of power on the AC grid from harmonics or energy reflected from the inverter/converter system 130 and/or to filter power from the grid 110. Output from the inverter/converter system 130 is subsequently passed through an output filter 142, which is an example of a second filter 140 in FIG. 1A. The output filter 142 includes at least one inductor and optionally includes one or more additional electrical components, such as one or more capacitors. Output from the output filter 142 is subsequently delivered to the load 152, such as to a motor, chiller, or pump. In a first instance, the load 152 is an inductor motor, such as an inductor motor operating at about 50 or 60 Hz or in the range of 30-90 Hz. In a second instance, the load 152 is a permanent magnet motor, such as a motor having a fundamental frequency range of about 90 to 2000 Hz or more preferably in the range of 250 to 1000 Hz.

Figure 1F:
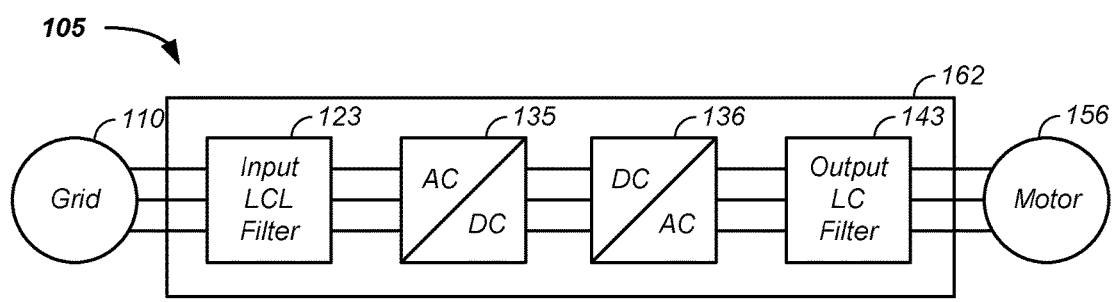

Referring now to FIG. 1F, an enclosed AC power processing system 105 is illustrated. In this example, the input filter 122, inverter/converter 130, and output filter 142 are enclosed in a single container 162, for cooling, weight, durability, and/or safety reasons. Optionally, the single container 162 is a series of 2, 3, 4 or more containers proximate each other, such as where closest sided elements are within less than 0.1, 0.5, 1, or 5 meters from each other or are joined to each other. In the illustrated case, the input filter 122 is an input inductor/capacitor/inductor filter 123, the output filter 142 is an output inductor/capacitor filter 143, and the load 152 is a motor 152.

Figure 1G:
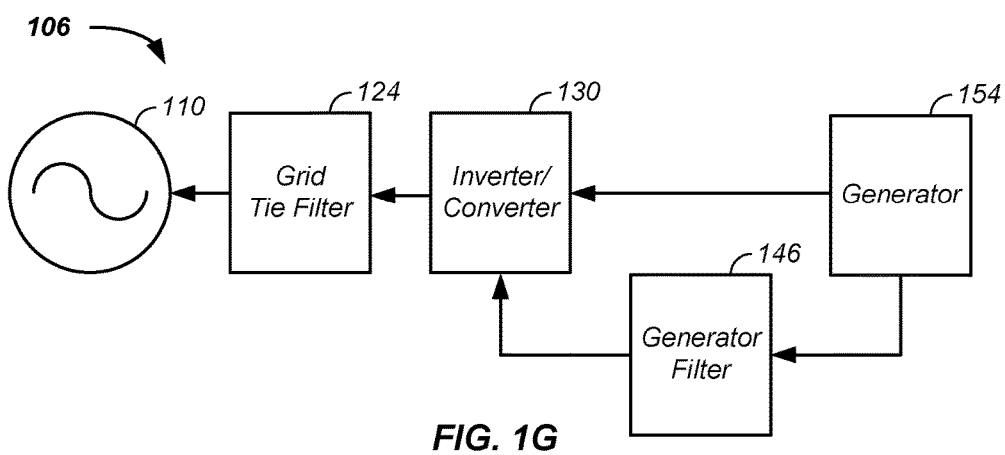
Figure 1H:
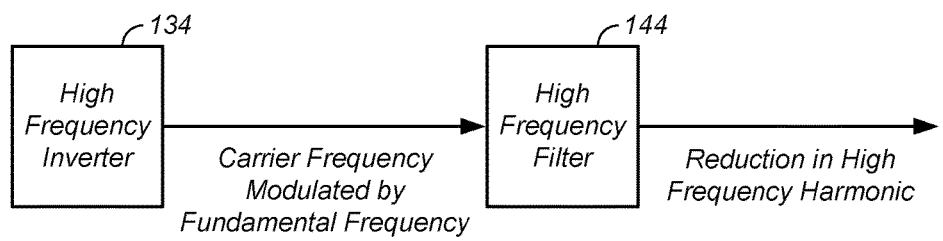

Referring now to FIG. 1G, an example of a generated power processing system 106 processing generated power from the generator 154 is provided. In this case, electricity flows from the generator 154 to the grid 110. The generator 154 provides power to the inverter/converter system 130. Optionally, the generated power is processed through a generator filter 146 before delivery to the inverter/converter system 130. Power from the inverter/converter system 130 is filtered with a grid tie filter 124, which includes at least one inductor and optionally includes one or more additional electrical components, such as a capacitor and/or a resistor. Output from the grid tie filter 124, which is an example of the first filter 120 in FIG. 1A, is delivered to the grid 110. A first example of a grid tie filter 124 is a filter using an inductor. A second example of a grid tie filter 124 is a filter using a first inductor, a capacitor, and a second inductor for each phase of power. Optionally, generated output from the generator 154 after processing with the inverter/converter system 130 is filtered using at least one inductor and passed directly to a load, such as a motor, without going to the grid 110.

In the power processing system 100, the power supply system or input power includes any other appropriate elements or systems, such as a voltage or current source and a switching system or element. The supply optionally operates in conjunction with various forms of modulation, such as pulse width modulation, resonant conversion, quasi-resonant conversion, and/or phase modulation.

Filter circuits in the power processing system 100 are configured to filter selected components from the supply signal. The selected components include any elements to be attenuated or eliminated from the supply signal, such as noise and/or harmonic components. For example, filter circuits reduce total harmonic distortion. In one embodiment, the filter circuits are configured to filter higher frequency harmonics over the fundamental frequency. Examples of fundamental frequencies include: direct current (DC), 50 Hz, 60 Hz, and/or 400 Hz signals. Examples of higher frequency harmonics include harmonics over about 300, 500, 600, 800, 1000, 2000, 5000, 7000, 10,000, 50,000 and 100,000 Hz in the supply signal, such as harmonics induced by the operating switching frequency of insulated gate bipolar transistors (IGBTs) and/or any other electrically operated switches, such as via use of a MOSFET. The filter circuit optionally includes passive components, such as an inductor-capacitor filter comprised of an inductor, a capacitor, and in some embodiments a resistor. The values and configuration of the inductor and the capacitor are selected according to any suitable criteria, such as to configure the filter circuits to a selected cutoff frequency, which determines the frequencies of signal components filtered by the filter circuit. The inductor is preferably configured to operate according to selected characteristics, such as in conjunction with high current without excessive heating or operating within safety compliance temperature requirements.

Power Processing System

The power processing system 100 is optionally used to filter single or multi-phase power, such as three phase power. Herein, for clarity of presentation AC input power from the grid 110 or input power is used in the examples. Though not described in each example, the components and/or systems described herein additionally apply generator systems, such as the system for processing generated power.

Figure 2:
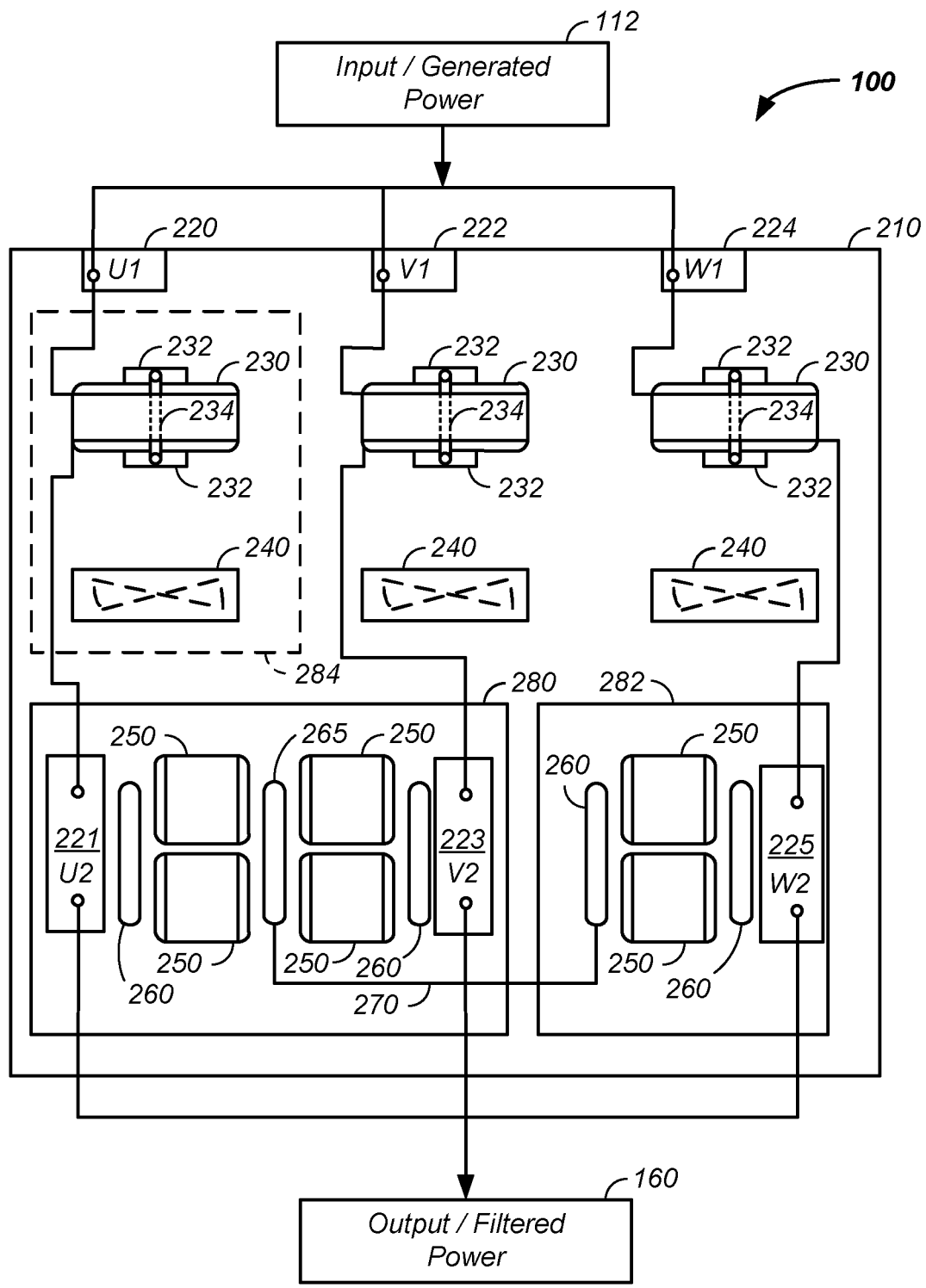
FIG. 2 illustrates multi-phase inductor/capacitor component mounting and a filter circuit for power processing.

Referring now to FIG. 2, an illustrative example of multi-phase power filtering is provided. Input power 112 is processed using the power processing system 100 to yield filtered and/or transformed output power 160. In this example, three-phase power is processed with each phase separately filtered with an inductor-capacitor filter. The three phases, of the three-phase input power, are denoted U1, V1, and W1. The input power 112 is connected to a corresponding phase terminal U1 220, V1 222, and/or W1 224, where the phase terminals are connected to or integrated with the power processing system 100. For clarity, processing of a single phase is described, which is illustrative of multi-phase power processing. The input power 112 is then processed by sequential use of an inductor 230 and a capacitor 250. The inductor and capacitor system is further described, infra. After the inductor/capacitor processing, the three phases of processed power, corresponding to U1, V1, and W1 are denoted U2, V2, and W2, respectively. The power is subsequently output as the processed and/or filtered power 150. Additional elements of the power processing system 100, in terms of the inductor 230, a cooling system 240, and mounting of the capacitors 250, are further described infra.

Isolators

Figure 3:
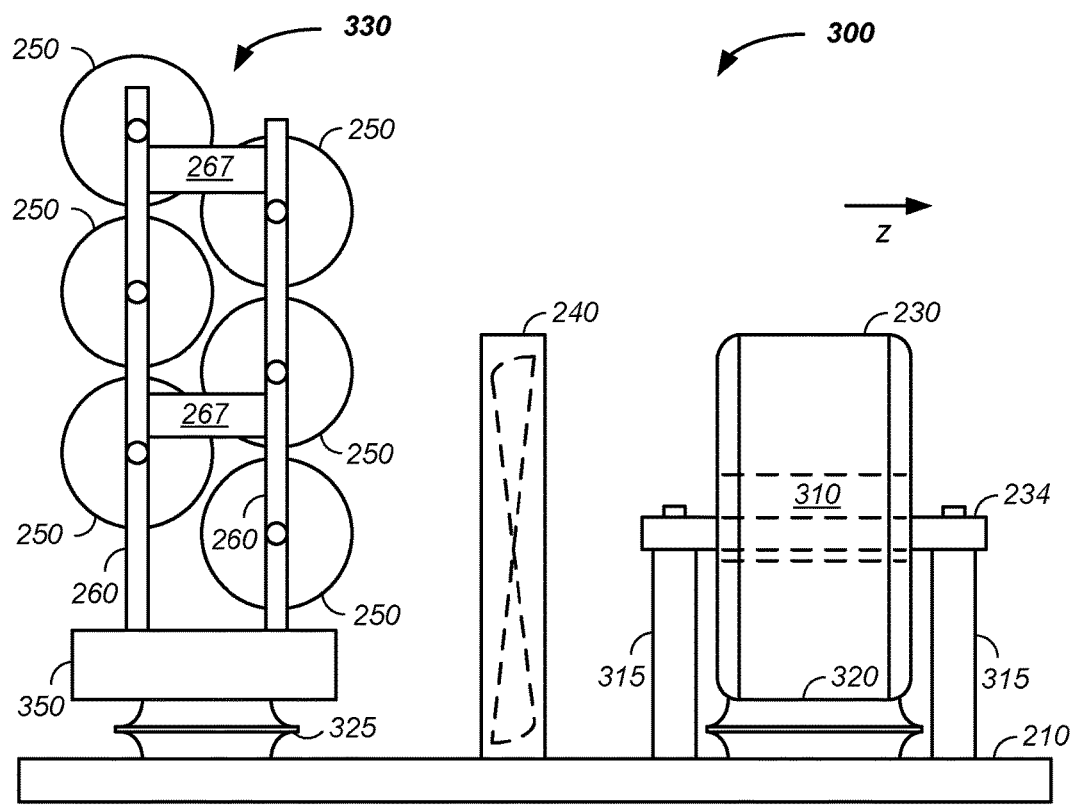
FIG. 3 further illustrates capacitor mounting.

Referring still to FIG. 2 and now to FIG. 3, in the power processing system 100, the inductor 230 is optionally mounted, directly or indirectly, to a base plate 210 via a mount 232, via an inductor isolator 320, and/or via a mounting plate 284. Preferably, the inductor isolator 320 is used to attach the mount 232 indirectly to the base plate 210. The inductor 230 is additionally preferably mounted using a cross-member or clamp bar 234 running through a central opening 310 in the inductor 230. The capacitor 250 is preferably similarly mounted with a capacitor isolator 325 to the base plate 210. The isolators 320, 325 are preferably vibration, shock, and/or temperature isolators. The isolators 320, 325 are preferably a glass-reinforced plastic, a glass fiber-reinforced plastic, a fiber reinforced polymer made of a plastic matrix reinforced by fine fibers made of glass, and/or a fiberglass material, such as a Glastic® (Rochling Glastic Composites, Ohio) material.

Cooling System

Figure 4:
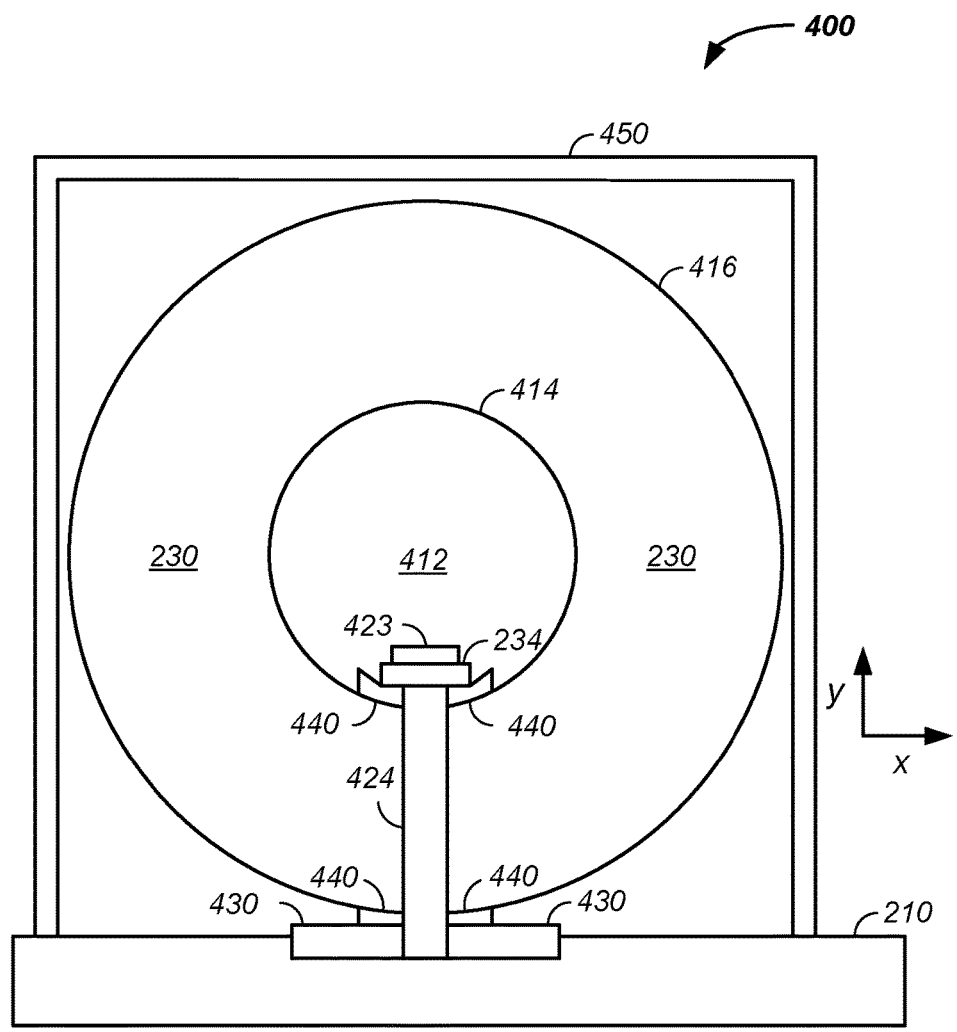
FIG. 4 illustrates a face view of an inductor.

Referring still to FIG. 2 and now to FIG. 4, an optional cooling system 240 is used in the power processing system 100. In the illustrated embodiment, the cooling system 240 uses a fan to move air across the inductor 230. The fan either pushes or pulls an air flow around and through the inductor 230. An optional air guide shroud 450 is placed over 1, 2, 3, or more inductors 230 to facilitate focused air movement resultant from the cooling system 240, such as airflow from a fan, around the inductors 230. The shroud preferably encompasses at least three sides of the one or more inductors. To achieve enhanced cooling, the inductor is preferably mounted on an outer face 416 of the toroid. For example, the inductor 230 is mounted in a vertical orientation using the clamp bar 234. Vertical mounting of the inductor is further described, infra. Optional liquid based cooling systems 240 are further described, infra.

Buss Bars

Referring again to FIG. 2 and FIG. 3, in the power processing system 100, the capacitor 250 is preferably an array of capacitors connected in parallel to achieve a specific capacitance for each of the multi-phases of the power supply 110. In FIG. 2, two capacitors 250 are illustrated for each of the multi-phased power supply U1, V1, and W1. The capacitors are mounted using a series of busbars or buss bars 260. A buss bar 260 carries power from one point to another or connects one point to another.

Common Neutral Buss Bar

A particular type of buss bar 260 is a common neutral buss bar 265, which connects two phases. In one example of an electrical embodiment of a delta capacitor connection in a poly phase system, it is preferable to create a common neutral point for the capacitors. Still referring to FIG. 2, an example of two phases using multiple capacitors in parallel with a common neutral buss bar 265 is provided. The common neutral buss bar 265 functions as both a mount and a parallel bus conductor for two phases. This concept minimizes the number of parallel conductors, in a 'U' shape or in a parallel '‖' shape in the present embodiment, to the number of phases plus two. In a traditional parallel buss bar system, the number of buss bars 260 used is the number of phases multiplied by two or number of phases times two. Hence, the use of 'U' shaped buss bars 260 reduces the number of buss bars used compared to the traditional mounting system. Minimizing the number of buss bars required to make a poly phase capacitor assembly, where multiple smaller capacitors are positioned in parallel to create a larger capacitance, minimizes the volume of space needed and the volume of buss bar conductors. Reduction in buss bar 260 volume and/or quantity minimizes cost of the capacitor assembly. After the two phases that share a common neutral bus conductor are assembled, a simple jumper 270 bus conductor is optionally used to jumper those two phases to any quantity of additional phases as shown in FIG. 2. The jumper optionally includes as little as two connection points. The jumper optionally functions as a handle on the capacitor assembly for handling. It is also typical that this common neutral bus conductor is the same shape as the other parallel bus conductors throughout the capacitor assembly. This common shape theme, a 'U' shape in the present embodiment, allows for symmetry of the assembly in a poly phase structure as shown in FIG. 2.

Parallel Buss Bars Function as Mounting Chassis

Herein, the buss bars 260, 265 preferably mechanically support the capacitors 250. The use of the buss bars 260, 265 for mechanical support of the capacitors 250 has several benefits. The parallel conducting buss bar connecting multiple smaller value capacitors to create a larger value, which can be used in a 'U' shape, also functions as a mounting chassis. Incorporating the buss bar as a mounting chassis removes the requirement of the capacitor 250 to have separate, isolated mounting brackets. These brackets typically would mount to a ground point or metal chassis in a filter system. In the present embodiment, the capacitor terminals and the parallel buss bar support the capacitors and eliminate the need for expensive mounting brackets and additional mounting hardware for these brackets. This mounting concept allows for optimal vertical or horizontal packaging of capacitors.

Parallel Buss Bar

A parallel buss bar is optionally configured to carry smaller currents than an input/output terminal. The size of the buss bar 260 is minimized due to its handling of only the capacitor current and not the total line current, where the capacitor current is less than about 10, 20, 30, or 40 percent of the total line current. The parallel conducting buss bar, which also functions as the mounting chassis, does not have to conduct full line current of the filter. Hence the parallel conducting buss bar is optionally reduced in cross-section area when compared to the output terminal 350. This smaller sized buss bar reduces the cost of the conductors required for the parallel configuration of the capacitors by reducing the conductor material volume. The full line current that is connected from the inductor to the terminal is substantially larger than the current that travels through the capacitors. For example, the capacitor current is less than about 10, 20, 30, or 40 percent of the full line current. In addition, when an inductor is used that impedes the higher frequencies by about 20, 100, 200, 500, 1000, 1500, or 2000 KHz before they reach the capacitor buss bar and capacitors, this parallel capacitor current is lower still than when an inferior filter inductor, whose resonant frequency is below 5, 10, 20, 40, 50, 75, 100 KHz, is used which cannot impede the higher frequencies due to its high internal capacitive construction or low resonant frequency. In cases where there exist high frequency harmonics and the inductor is unable to impede these high frequencies, the capacitors must absorb and filter these currents which causes them to operate at higher temperatures, which decreases the capacitors usable life in the circuit. In addition, these un-impeded frequencies add to the necessary volume requirement of the capacitor buss bar and mounting chassis, which increases cost of the power processing system 100.

Staggered Capacitor Mounting

Use of a staggered capacitor mounting system reduces and/or minimizes volume requirements for the capacitors.

Figure 15:
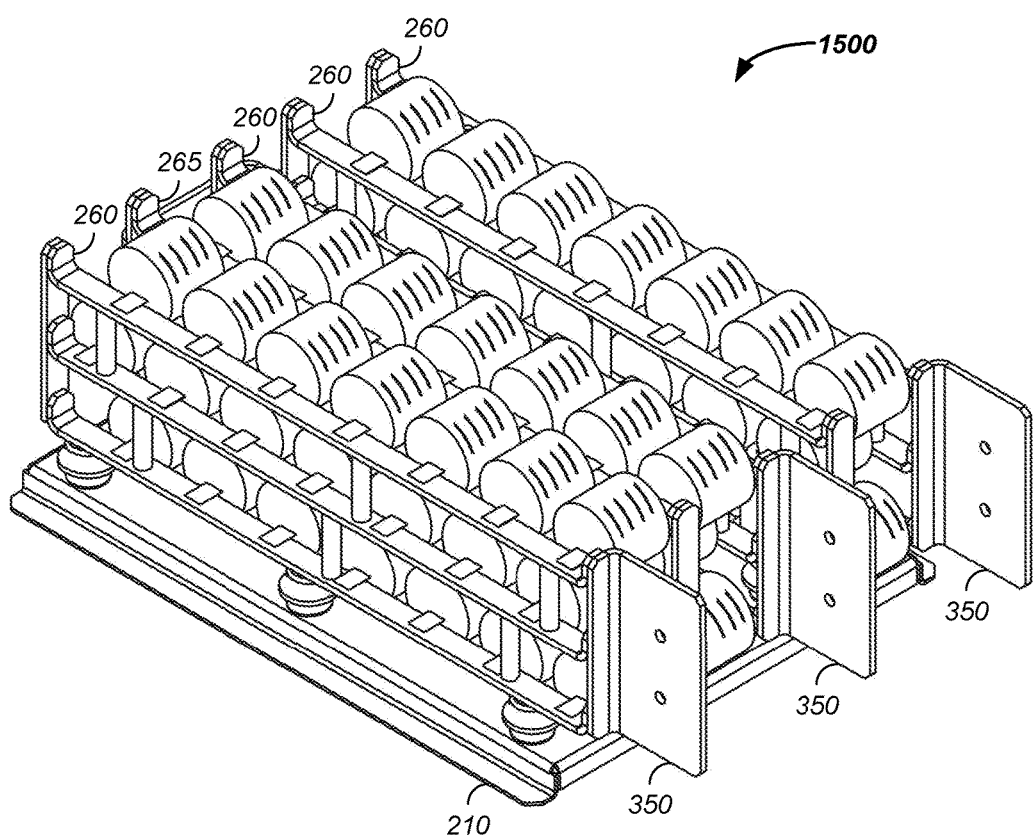
FIG. 15 illustrates a capacitor array.

Referring now to FIG. 3, a filter system 300 is illustrated. The filter system 300 preferably includes a mounting plate or base plate 210. The mounting plate 210 attaches to the inductor 230 and a set of capacitors 330. The capacitors are preferably staggered in an about close packed arrangement having a spacing between rows and staggered columns of less than about 0.25, 0.5, or 1 inch. The staggered packaging allows optimum packaging of multiple smaller value capacitors in parallel creating a larger capacitance in a small, efficient space. Buss bars 260 are optionally used in a 'U' shape or a parallel '||' shape to optimize packaging size for a required capacitance value. The 'U' shape with staggered capacitors 250 are optionally mounted vertically to the mounting surface, as shown in FIG. 3 or horizontally to the mounting surface as shown in FIG. 15. The 'U' shape buss bar is optionally two about parallel bars with one or more optional mechanical stabilizing spacers, 267, at selected locations to mechanically stabilize both about parallel sides of the 'U' shape buss bar as the buss bar extends from the terminal 350, as shown in FIG. 3 and FIG. 15.

In this example, the capacitor bus work 260 is in a 'U' shape that fastens to a terminal 350 attached to the base plate 210 via an insulator 325. The 'U' shape is formed by a first buss bar 260 joined to a second buss bar 260 via the terminal 350. The 'U' shape is alternatively shaped to maintain the staggered spacing, such as with an m by n array of capacitors, where m and n are integers, where m and n are each two or greater. The buss bar matrix or assembly contains neutral points 265 that are preferably shared between two phases of a poly-phase system. The neutral buss bars 260, 265 connect to all three-phases via the jumper 270. The shared buss bar 265 allows the poly-phase system to have x+2 buss bars where x is the number of phases in the poly-phase system instead of the traditional two buss bars per phase in a regular system. Optionally, the common buss bar 265 comprises a metal thickness of approximately twice the size of the buss bar 260. The staggered spacing enhances packaging efficiency by allowing a maximum number of capacitors in a given volume while maintaining a minimal distance between capacitors needed for the optional cooling system 240, such as cooling fans and/or use of a coolant fluid. Use of a coolant fluid directly contacting the inductor 230 is described, infra. The distance from the mounting surface 210 to the bottom or closest point on the body of the second closest capacitor 250, is less than the distance from the mounting surface 210 to the top or furthest point on the body of the closest capacitor. This mounting system is designated as a staggered mounting system for parallel connected capacitors in a single or poly phase filter system.

Module Mounting

In the power processing system 100, modular components are optionally used. For example, a first mounting plate 280 is illustrated that mounts three buss bars 260 and two arrays of capacitors 250 to the base plate 210. A second mounting plate 282 is illustrated that mounts a pair of buss bars 260 and a set of capacitors to the base plate 210. A third mounting plate 284 is illustrated that vertically mounts an inductor and optionally an associated cooling system 240 or fan to the base plate 210. Generally, one or more mounting plates are used to mount any combination of inductor 230, capacitor 240, buss bar 260, and/or cooling system 240 to the base plate 210.

Referring now to FIG. 3, an additional side view example of a power processing system 100 is illustrated. FIG. 3 further illustrates a vertical mounting system 300 for the inductor 230 and/or the capacitor 250. For clarity, the example illustrated in FIG. 3 shows only a single phase of a multi-phase power filtering system. Additionally, wiring elements are removed in FIG. 3 for clarity. Additional inductor 230 and capacitor 250 detail is provided, infra.

Inductor

Preferable embodiments of the inductor 230 are further described herein. Particularly, in a first section, vertical mounting of an inductor is described. In a second section, inductor elements are described.

For clarity, an axis system is herein defined relative to an inductor 230. An x/y plane runs parallel to an inductor face 417, such as the inductor front face 418 and/or the inductor back face 419. A z-axis runs through the inductor 230 perpendicular to the x/y plane. Hence, the axis system is not defined relative to gravity, but rather is defined relative to an inductor 230.

Vertical Inductor Mounting

FIG. 3 illustrates an indirect vertical mounting system of the inductor 230 to the base plate 210 with an optional intermediate vibration, shock, and/or temperature isolator 320. The isolator 320 is preferably a Glastic® material, described supra. The inductor 230 is preferably an edge mounted inductor with a toroidal core, described infra.

Figure 6A:
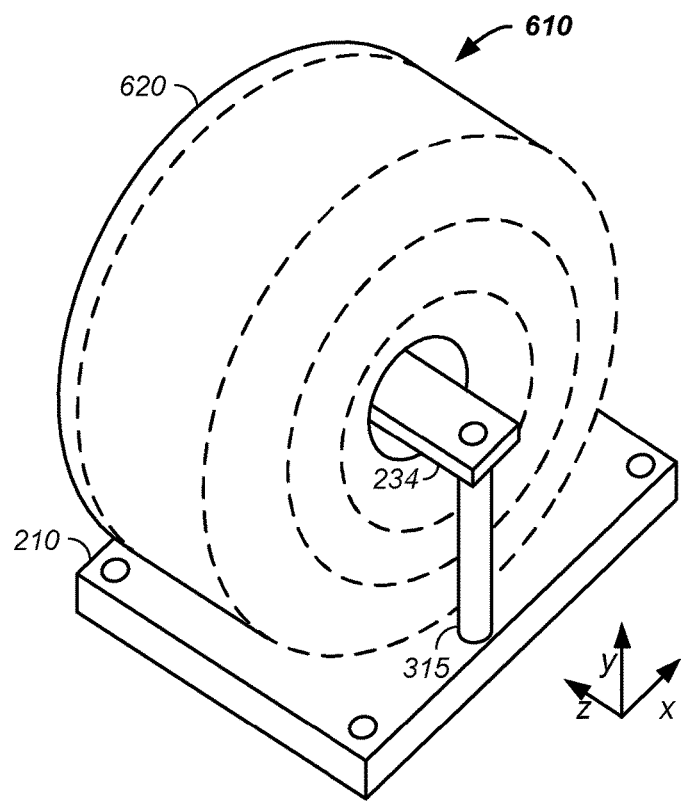
FIG. 6A illustrates an inductor core and an inductor winding and FIG. 6B illustrated inductor core particles.

Referring now to FIG. 6A, an inductor 230 optionally includes an inductor core 610 and a winding 620. The winding 620 is wrapped around the inductor core 610. The inductor core 610 and the winding 620 are suitably disposed on a base plate 210 to support the inductor core 610 in any suitable position and/or to conduct heat away from the inductor core 610 and the winding 620. The inductor 610 optionally includes any additional elements or features, such as other items required in manufacturing.

Figure 6B:
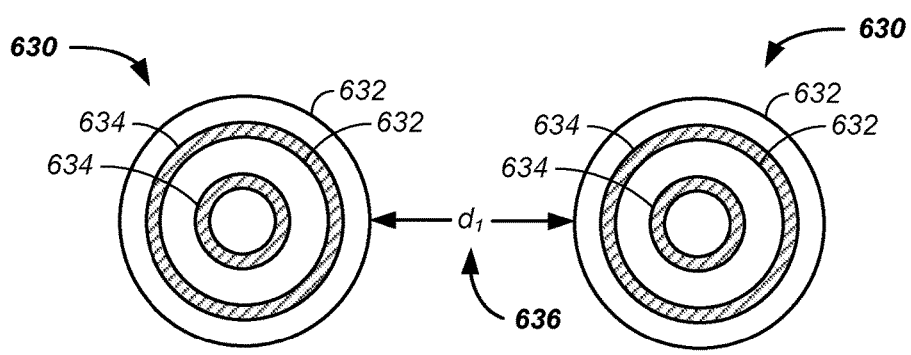

Referring now to FIG. 6B, an inductor core of the inductor 230 optionally and preferably comprises a distributed gap material of coated particles 630 than have alternating magnetic layers 632 and substantially non-magnetic layers 634, where the coated particles 630 are separated by an average distance, $d_1$.

In one embodiment, an inductor 230 or toroidal inductor is mounted on the inductor edge, is vibration isolated, and/or is optionally temperature controlled.

Figure 5:
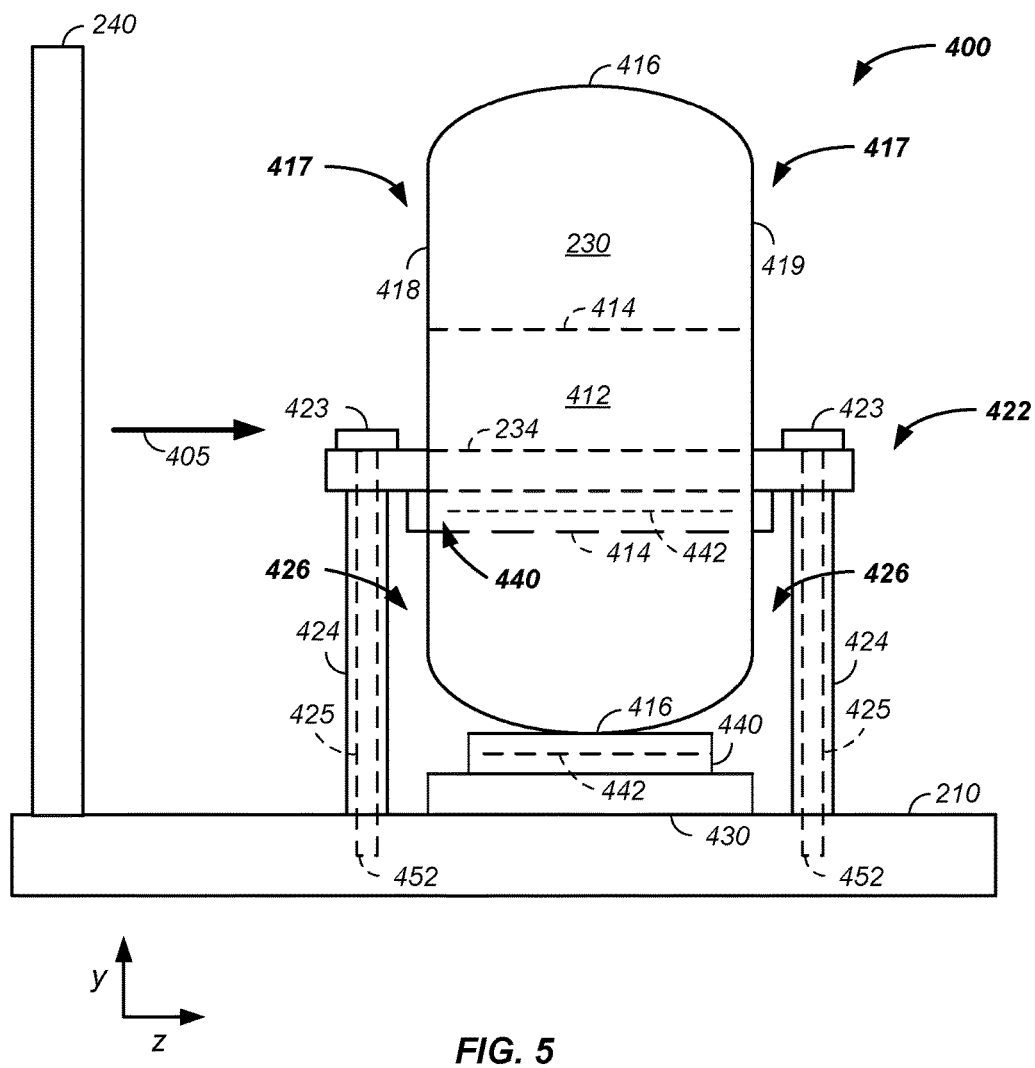
FIG. 5 illustrates a side view of an inductor.

Referring now to FIG. 4 and FIG. 5, an example of an edge mounted inductor system 400 is illustrated. FIG. 4 illustrates an edge mounted toroidal inductor 230 from a face view. FIG. 5 illustrates the inductor 230 from an edge view. When looking through a center hole 412 of the inductor 230, the inductor 230 is viewed from its face. When looking at the inductor 230 along an axis-normal to an axis running through the center hole 412 of the inductor 230, the inductor 230 is viewed from the inductor edge. In an edge mounted inductor system, the edge of the inductor is mounted to a surface. In a face mounted inductor system, the face of the inductor 230 is mounted to a surface. Elements of the edge mounted inductor system 400 are described, infra.

Referring still to FIG. 4, the inductor 230 is optionally mounted in a vertical orientation, where a center line through the center hole 412 of the inductor runs along an axis 405 that is about horizontal or parallel to a mounting surface 430 or base plate 210. The mounting surface is optionally horizontal or vertical, such as parallel to a floor, parallel to a wall, or parallel to a mounting surface on a slope. In FIG. 4, the inductor 230 is illustrated in a vertical position relative to a horizontal mounting surface with the axis 405 running parallel to a floor. While descriptions herein use a horizontal mounting surface to illustrate the components of the edge mounted inductor mounting system 400, the system is equally applicable to a vertical mounting surface. To further clarify, the edge mounted inductor system 400 described herein also applies to mounting the edge of the inductor to a vertical mounting surface or an angled mounting surface. The angled mounting surface is optionally angled at least 10, 20, 30, 40, 50, 60, 70, or 80 degrees off of horizontal. In these cases, the axis 405 still runs about parallel to the mounting surface, such as about parallel to the vertical mounting surface or about parallel to a sloped mounting surface 430, base plate 210, or other surface.

Still referring to FIG. 4 and to FIG. 5, the inductor 230 has an inner surface 414 surrounding the center opening, center aperture, or center hole 412; an outer edge 416 or outer edge surface; and two faces 417, including a front face 418 and a back face 419. An inductor section refers to a portion of the about annular inductor between a point on the inner surface 414 and a closest point on the outer edge 416. The surface of the inductor 230 includes: the inner surface 414, outer edge 416 or outer edge surface, and faces 417. The surface of the inductor 230 is typically the outer surface of the magnet wire windings surrounding the core of the inductor 230. Magnet wire or enamelled wire is a copper or aluminium wire coated with a very thin layer of insulation. In one case, the magnet wire comprises a fully annealed electrolytically refined copper. In another case, the magnet wire comprises aluminum magnet wire. In still another case, the magnet wire comprises silver or another precious metal to further enhance current flow while reducing operating temperatures. Optionally, the magnet wire has a cross-sectional shape that is round, square, and/or rectangular. A preferred embodiment uses rectangular magnet wire to wind the annular inductor to increase current flow in the limited space in a central aperture within the inductor and/or to increase current density. The insulation layer includes 1, 2, 3, 4, or more layers of an insulating material, such as a polyvinyl, polyimide, polyamide, and/or fiberglass based material. The magnet wire is preferably a wire with an aluminum oxide coating for minimal corona potential. The magnet wire is preferably temperature resistant or rated to at least two hundred degrees Centigrade. The winding of the wire or magnet wire is further described, infra. The minimum weight of the inductor is optionally about 2, 5, 10, or 20 pounds.

Still referring to FIG. 4, an optional clamp bar 234 runs through the center hole 412 of the inductor 230. The clamp bar 234 is preferably a single piece, but is optionally composed of multiple elements. The clamp bar 234 is connected directly or indirectly to the mounting surface 430 and/or to a base plate 210. The clamp bar 234 is composed of a non-conductive material as metal running through the center hole of the inductor 230 functions as a magnetic shorted turn in the system. The clamp bar 234 is preferably a rigid material or a semi-rigid material that bends slightly when clamped, bolted, or fastened to the mounting surface 430. The clamp bar 234 is preferably rated to a temperature of at least 130 degrees Centigrade. Preferably, the clamp bar material is a fiberglass material, such as a thermoset fiberglass-reinforced polyester material, that offers strength, excellent insulating electrical properties, dimensional stability, flame resistance, flexibility, and high property retention under heat. An example of a fiberglass clamp bar material is Glastic®. Optionally the clamp bar 234 is a plastic, a fiber reinforced resin, a woven paper, an impregnated glass fiber, a circuit board material, a high performance fiberglass composite, a phenolic material, a thermoplastic, a fiberglass reinforced plastic, a ceramic, or the like, which is preferably rated to at least 150 degrees Centigrade. Any of the mounting hardware 422 is optionally made of these materials.

Still referring to FIG. 4 and to FIG. 5, the clamp bar 234 is preferably attached to the mounting surface 430 via mounting hardware 422. Examples of mounting hardware include: a bolt, a threaded bolt, a rod, a clamp bar 234, a mounting insulator 424, a connector, a metal connector, and/or a non-metallic connector. Preferably, the mounting hardware is non-conducting. If the mounting hardware 422 is conductive, then the mounting hardware 422 is preferably contained in or isolated from the inductor 230 via a mounting insulator 424. Preferably, an electrically insulating surface is present, such as on the mounting hardware. The electrically insulating surface proximately contacts the faces of the inductor 230. Alternatively, an insulating gap 426 of at least about one millimeter exists between the faces 417 of the inductor 230 and the metallic or insulated mounting hardware 422, such as a bolt or rod.

An example of a mounting insulator is a hollow rod where the outer surface of the hollow rod is non-conductive and the hollow rod has a center channel 425 through which mounting hardware, such as a threaded bolt, runs. This system allows a stronger metallic and/or conducting mounting hardware to connect the clamp bar 234 to the mounting surface 430. FIG. 5 illustrates an exemplary bolt head 423 fastening a threaded bolt into the base plate 210 where the base plate has a threaded hole 452. An example of a mounting insulator 424 is a mounting rod. The mounting rod is preferably composed of a material or is at least partially covered with a material where the material is electrically isolating.

The mounting hardware 422 preferably covers a minimal area of the inductor 230 to facilitate cooling with a cooling element 240, such as via one or more fans. In one case, the mounting hardware 422 does not contact the faces 417 of the inductor 230. In another case, the mounting hardware 422 contacts the faces 417 of the inductor 230 with a contact area. Preferably the contact area is less than about 1, 2, 5, 10, 20, or 30 percent of the surface area of the faces 417. The minimal contact area of the mounting hardware with the inductor surface facilitates temperature control and/or cooling of the inductor 230 by allowing airflow to reach the majority of the inductor 230 surface. Preferably, the mounting hardware is temperature resistant to at least 130 degrees centigrade. Preferably, the mounting hardware 422 comprises curved surfaces circumferential about its length to facilitate airflow around the length of the mounting hardware 422 to the faces 417 of the inductor 230.

Still referring to FIG. 5, the mounting hardware 422 connects the clamp bar 234, which passes through the inductor, to the mounting surface 430. The mounting surface is optionally non-metallic and is rigid or semi-rigid. Generally, the properties of the clamp bar 234 apply to the properties of the mounting surface 430. The mounting surface 430 is optionally (1) composed of the same material as the clamp bar 234 or is (2) a distinct material type from that of the clamp bar 234.

Still referring to FIG. 5, in one example the inductor 230 is held in a vertical position by the clamp bar 234, mounting hardware 422, and mounting surface 430 where the clamp bar 234 contacts the inner surface 414 of the inductor 230 and the mounting surface 430 contacts the outer edge 416 of the inductor 230.

Still referring to FIG. 5, in a second example one or more vibration isolators 440 are used in the mounting system. As illustrated, a first vibration isolator 440 is positioned between the clamp bar 234 and the inner surface 414 of the inductor 230 and a second vibration isolator 440 is positioned between the outer edge 416 of the inductor 230 and the mounting surface 430. The vibration isolator 440 is a shock absorber. The vibration isolator optionally deforms under the force or pressure necessary to hold the inductor 230 in a vertical position or edge mounted position using the clamp bar 234, mounting hardware 422, and mounting surface 430. The vibration isolator preferably is temperature rated to at least two hundred degrees Centigrade. Preferably the vibration isolator 440 is about ⅛, ¼, ⅜, or ½ inch in thickness. An example of a vibration isolator is silicone rubber. Optionally, the vibration isolator 440 contains a glass weave 442 for strength. The vibration isolator optionally is internal to the inductor opening or extends out of the inductor 230 central hole 412.

Still referring to FIG. 5, a common mounting surface 430 is optionally used as a mount for multiple inductors. Alternatively, the mounting surface 430 is connected to a base plate 210. The base plate 210 is optionally used as a base for multiple mounting surfaces connected to multiple inductors, such as three inductors used with a poly-phase power system where one inductor handles each phase of the power system. The base plate 210 optionally supports multiple cooling elements, such as one or more cooling elements per inductor. The base plate is preferably metal for strength and durability. The system reduces cost associated with the mounting surface 430 as the less expensive base plate 210 is used for controlling relative position of multiple inductors and the amount of mounting surface 430 material is reduced and/or minimized. Further, the contact area ratio of the mounting surface 430 to the inductor surface is preferably minimized, such as to less than about 1, 2, 4, 6, 8, 10, or 20 percent of the surface of the inductor 230, to facilitate efficient heat transfer by maximizing the surface area of the inductor 230 available for cooling by the cooling element 240 or by passive cooling.

Still referring to FIG. 4, an optional cooling system 240 is used to cool the inductor. In one example, a fan blows air about one direction, such as horizontally, onto the front face 418, through the center hole 412, along the inner edge 414 of the inductor 230, and/or along the outer edge 416 of the inductor 230 where the clamp bar 234, vibration isolator 440, mounting hardware 422, and mounting surface 430 combined contact less than about 1, 2, 5, 10, 20, or 30 percent of the surface area of the inductor 230, which yields efficient cooling of the inductor 230 using minimal cooling elements and associated cooling element power due to a large fraction of the surface area of the inductor 230 being available for cooling. To aid cooling, an optional shroud 450 about the inductor 230 guides the cooling air flow about the inductor 230 surface. The shroud 450 optionally circumferentially encloses the inductor along 1, 2, 3, or 4 sides. The shroud 450 is optionally any geometric shape.

Preferably, mounting hardware 422 is used on both sides of the inductor 230. Optionally, the inductor 230 mounting hardware 422 is used beside only one face of the inductor 230 and the clamp bar 234 or equivalent presses down or hooks over the inductor 230 through the hole 412 or over the entire inductor 230, such as over the top of the inductor 230.

In yet another embodiment, a section or row of inductors 230 are elevated in a given airflow path. In this layout, a single airflow path or thermal reduction apparatus is used to cool a maximum number of toroid filter inductors in a filter circuit, reducing additional fans or thermal management systems required as well as overall packaging size. This increases the robustness of the filter with fewer moving parts to degrade as well as minimizes cost and packaging size. The elevated layout of a first inductor relative to a second inductor allows air to cool inductors in the first row and then to also cool inductors in an elevated rear row without excessive heating of the air from the front row and with a single airflow path and direction from the thermal management source. Through elevation, a single fan is preferably used to cool a plurality of inductors approximately evenly, where multiple fans would have been needed to achieve the same result. This efficient concept drastically reduces fan count and package size and allows for cooling airflow in a single direction.

An example of an inductor mounting system is provided. Preferably, the pedestal or non-planar base plate, on which the inductors are mounted, is made out of any suitable material. In the current embodiment, the pedestal is made out of sheet metal and fixed to a location behind and above the bottom row of inductors. Multiple orientations of the pedestal and/or thermal management devices are similarly implemented to achieve these results. In this example, toroid inductors mounted on the pedestal use a silicone rubber shock absorber mounting concept with a bottom plate, base plate, mounting hardware 122, a center hole clamp bar with insulated metal fasteners, or mounting hardware 122 that allows them to be safe for mounting at this elevated height. The mounting concept optionally includes a non-conductive material of suitable temperature and mechanical integrity, such as Glastic®, as a bottom mounting plate. The toroid sits on a shock absorber of silicone rubber material of suitable temperature and mechanical integrity. In this example, the vibration isolator 440, such as silicone rubber, is about 0.125 inch thick with a woven fiber center to provide mechanical durability to the mounting. The toroid is held in place by a center hole clamp bar of Glastic® or other non-conductive material of suitable temperature and mechanical integrity. The clamp bar fits through the center hole of the toroid and preferably has a minimum of one hole on each end, two total holes, to allow fasteners to fasten the clamp bar to the bottom plate and pedestal or base plate. Beneath the center clamp bar is another shock absorbing piece of silicone rubber with the same properties as the bottom shock absorbing rubber. The clamp bar is torqued down on both sides using fasteners, such as standard metal fasteners. The fasteners are preferably an insulated non-conductive material of suitable temperature and mechanical integrity. The mounting system allows for mounting of the elevated pedestal inductors with the center hole parallel to the mounting chassis and allows the maximum surface area of the toroid to be exposed to the moving air, thus maximizing the efficiency of the thermal management system. In addition, this mounting system allows for the two shock absorbing rubber or equivalent materials to both hold the toroid inductor in an upright position. The shock absorbing material also absorbs additional shock and vibration resulting during operation, transportation, or installation so that core material shock and winding shock is minimized.

Inductor Elements

The inductor 230 is further described herein. Preferably, the inductor includes a pressed powder highly permeable and linear core having a BH curve slope of about 11 $\Delta B/\Delta H$ surrounded by windings and/or an integrated cooling system.

Referring now to FIG. 6, the inductor 230 comprises a inductor core 610 and a winding 620. The inductor 230 preferably includes any additional elements or features, such as other items required in manufacturing. The winding 620 is wrapped around the inductor core 610. The inductor core 610 provides mechanical support for the winding 620 and is characterized by a permeability for storing or transferring a magnetic field in response to current flowing through the winding 620. Herein, permeability is defined in terms of a slope of $\Delta B/\Delta H$. The inductor core 610 and winding 620 are suitably disposed on or in a mount or housing 210 to support the inductor core 610 in any suitable position and/or to conduct heat away from the inductor core 610 and the winding 620.

The inductor core optionally provides mechanical support for the inductor winding and comprises any suitable core for providing the desired magnetic permeability and/or other characteristics. The configuration and materials of the inductor core 610 are optionally selected according to any suitable criteria, such as a BH curve profile, permeability, availability, cost, operating characteristics in various environments, ability to withstand various conditions, heat generation, thermal aging, thermal impedance, thermal coefficient of expansion, curie temperature, tensile strength, core losses, and/or compression strength. For example, the inductor core 610 is optionally configured to exhibit a selected permeability and BH curve.

For example, the inductor core 610 is configured to exhibit low core losses under various operating conditions, such as in response to a high frequency pulse width modulation or harmonic ripple, compared to conventional materials. Conventional core materials are laminated silicon steel or conventional silicon iron steel designs. The inventor has determined that the core preferably comprises an iron powder material or multiple materials to provide a specific BH curve, described infra. The specified BH curve allows creation of inductors having: smaller components, reduced emissions, reduced core losses, and increased surface area in a given volume when compared to inductors using the above described traditional materials.

BH Curve

There are two quantities that physicists use to denote magnetic field, B and H. The vector field, H, is known among electrical engineers as the magnetic field intensity or magnetic field strength, which is also known as an auxiliary magnetic field or a magnetizing field. The vector field, H, is a function of applied current. The vector field, B, is known as magnetic flux density or magnetic induction and has the international system of units (SI units) of Teslas (T). Thus, a BH curve is induction, B, as a function of the magnetic field, H.

Inductor Core/Distributed Gap

In one exemplary embodiment, the inductor core 610 comprises at least two materials. In one example, the core includes two materials, a magnetic material and a coating agent. In one case, the magnetic material includes a first transition series metal in elemental form and/or in any oxidation state. In a second case, the magnetic material is a form of iron. The second material is optionally a non-magnetic material and/or is a highly thermally conductive material, such as carbon, a carbon allotrope, and/or a form of carbon. A form of carbon includes any arrangement of elemental carbon and/or carbon bonded to one or more other types of atoms.

In one case, the magnetic material is present as particles and the particles are each coated with the coating agent to form coated particles. For example, particles of the magnetic material are each substantially coated with one, two, three, or more layers of a coating material, such as a form of carbon. The carbon provides a shock absorber affect, which minimized high frequency core loss from the inductor 230. In a preferred embodiment, particles of iron, or a form thereof, are coated with multiple layers of carbon to form carbon coated particles. The coated particles are optionally combined with a filler, such as a thermosetting polymer or an epoxy. The filler provides an average gap distance between the coated particles.

In another case, the magnetic material is present as a first layer in the form of particles and the particles are each at least partially coated, in a second layer, with the coating agent to form coated particles. The coated particles 630 are subsequently coated with another layer of a magnetic material, which is optionally the first magnetic material, to form a three layer particle. The three layer particle is optionally coated with a fourth layer of a non-magnetic material, which is optionally the non-magnetic material of the second layer. The process is optionally repeated to form particles of n layers, where n is a positive integer, such as about 2, 3, 4, 5, 10, 15, or 20. The n layers optionally alternate between a magnetic layer 632 and a non-magnetic layer 634. Optionally, the innermost particle of each coated particle is a non-magnetic particle.

Optionally, the magnetic material of one or more of the layers in the coated particle is an alloy. In one example, the alloy contains at least 70, 75, 80, 85, or 90 percent iron or a form of iron, such as iron at an oxidation state or bound to another atom. In another example, the alloy contains at least 1, 2, 3, 4, 5, 6, 7, 8, 9, or 10 percent aluminum or a form of aluminum. Optionally, the alloy contains a metalloid, such as boron, silicon, germanium, arsenic, antimony, and/or tellurium. An example of an alloy is sendust, which contains about eighty-five percent iron, nine percent silicon, and six percent aluminum. Sendust exhibits about zero magnetostriction.

The coated particles preferably have, with a probability of at least ninety percent, an average cross-sectional length of less than about one millimeter, one-tenth of a millimeter (100 μm), and/or one-hundredth of a millimeter (10 μm). While two or more coated particles in the core are optionally touching, the average gap distance, $d_1$, 636 between two coated particles is optionally a distance greater than zero and less than about one millimeter, one-tenth of a millimeter (100 μm), one-hundredth of a millimeter (10 μm), and/or one-thousandth of a millimeter (1 μm). With a large number of coated particles in the inductor 230, there exist a large number of gaps between two adjacent coated particles that are about evenly distributed within at least a portion of the inductor. The about evenly distributed gaps between particles in the inductor is optionally referred to as a distributed gap.

In one exemplary manufacturing process, the carbon coated particles are mixed with a filler, such as an epoxy. The resulting mixture is optionally pressed into a shape, such as an inductor shape, an about toroidal shape, an about annular shape, or an about doughnut shape. Optionally, during the pressing process, the filler or epoxy is melted out. The magnetic path in the inductor goes through the distributed gaps. Small air pockets optionally exist in the inductor 230, such as between the coated particles. In use, the magnetic field goes from coated particle to coated particle through the filler gaps and/or through the air gaps.

The distributed gap nature of the inductor 230 yields an about even Eddy loss, gap loss, or magnetic flux loss. Substantially even distribution of the bonding agent within the iron powder of the core results in the equally distributed gap of the core. The resultant core loss at the switching frequencies of the electrical switches substantially reduces core losses when compared to silicon iron steel used in conventional iron core inductor design.

Further, conventional inductor construction requires gaps in the magnetic path of the steel lamination, which are typically outside the coil construction and are, therefore, unshielded from emitting flux, causing electromagnetically interfering radiation. The electromagnetic radiation can adversely affect the electrical system.

The distributed gaps in the magnetic path of the present inductor core 610 material are microscopic and substantially evenly distributed throughout the inductor core 610. The smaller flux energy at each gap location is also surrounded by a winding 620 which functions as an electromagnetic shield to contain the flux energy. Thus, a pressed powder core surrounded by windings results in substantially reduced electromagnetic emissions.

Figure 7:
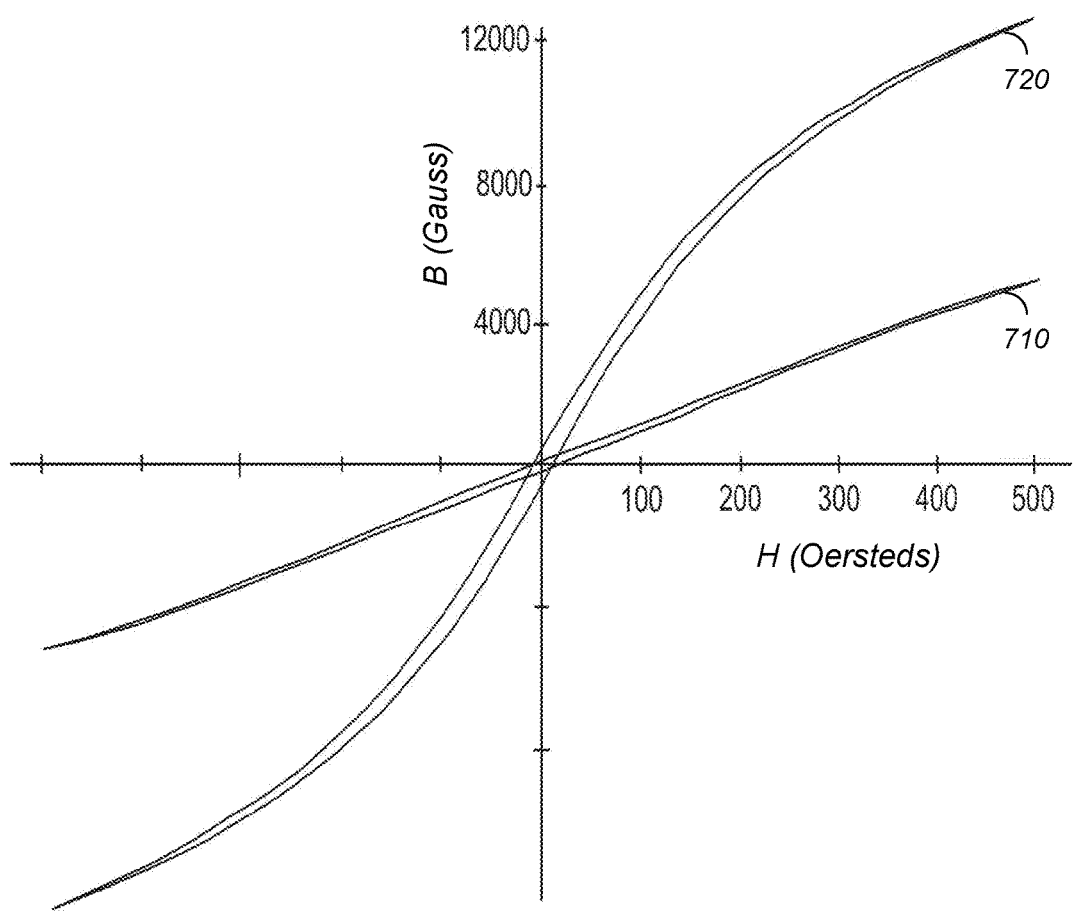
FIG. 7 provides exemplary BH curve results.

Referring now to FIG. 7 and to Table 1, preferred inductance, B, levels as a function of magnetic force strength are provided. The inductor core 610 material preferably comprises: an inductance of about −4400 to 4400 B over a range of about −400 to 400 H with a slope of about 11 $\Delta B/\Delta H$. Herein, permeability refers to the slope of a BH curve and has units of $\Delta B/\Delta H$. Core materials having a substantially linear BH curve with $\Delta B/\Delta H$ in the range of ten to twelve are usable in a preferred embodiment. Less preferably, core materials having a substantially linear BH curve with a permeability, $\Delta B/\Delta H$, in the range of nine to thirteen are acceptable. Two exemplary BH curves 710, 720 are provided in FIG. 7.

TABLE 1

BH Response
(Permeability of Eleven)

| B (Tesla/Gauss) | H (Oersted) |
|---|---|
| −4400 | −400 |
| −2200 | −200 |
| −1100 | −100 |
| 1100 | 100 |
| 2200 | 200 |
| 4400 | 400 |

Optionally, the inductor 230 is configured to carry a magnetic field of at least one of:
- less than about 2000, 2500, 3000, or 3500 Gauss at an absolute Oersted value of at least 100;
- less than about 4000, 5000, 6000, or 7000 Gauss at an absolute Oersted value of at least 200;
- less than about 6000, 7500, 9000, or 10,500 Gauss at an absolute Oersted value of at least 300; and
- less than about 8000, 10,000, 12,000, or 14,000 Gauss at an absolute Oersted value of at least 400.

In one embodiment, the inductor core 610 material exhibits a substantially linear flux density response to magnetizing forces over a large range with very low residual flux, $B_R$. The inductor core 610 preferably provides inductance stability over a range of changing potential loads, from low load to full load to overload.

The inductor core 610 is preferably configured in an about toroidal, about circular, doughnut, or annular shape where the toroid is of any size. The configuration of the inductor core 610 is preferably selected to maximize the inductance rating, $A_L$, of the inductor core 610, enhance heat dissipation, reduce emissions, facilitate winding, and/or reduce residual capacitances.

Medium Voltage

Herein, a corona potential is the potential for long term breakdown of winding wire insulation due to high electric potentials between winding turns winding a mid-level power inductor in a converter system. The high electric potential creates ozone, which breaks down insulation coating the winding wire and results in degraded performance or failure of the inductor.

Herein, power is described as a function of voltage. Typically, homes and buildings use low voltage power supplies, which range from about 100 to 690 volts. Large industry, such as steel mills, chemical plants, paper mills, and other large industrial processes optionally use medium voltage filter inductors and/or medium voltage power supplies. Herein, medium voltage power refers to power having about 1,500 to 35,000 volts or optionally about 2,000 to 5,000 volts. High voltage power refers to high voltage systems or high voltage power lines, which operate from about 20,000 to 150,000 volts.

In one embodiment, a power converter method and apparatus is described, which is optionally part of a filtering method and apparatus. The inductor is configured with inductor winding spacers, such as a main inductor spacer and/or inductor segmenting winding spacers. The spacers are used to space winding turns of a winding coil about an inductor. The insulation of the inductor spacer minimizes energy transfer between windings and thus minimizes corona potential, formation of corrosive ozone through ionization of oxygen, correlated breakdown of insulation on the winding wire, and/or electrical shorts in the inductor.

More particularly, the inductor configured with winding spacers uses the winding spacers to separate winding turns of a winding wire about the core of the inductor, which reduces the volts per turn. The reduction in volts per turn minimizes corona potential of the inductor. Additional electromagnetic components, such as capacitors, are integrated with the inductor configured with winding spacers to facilitate power processing and/or power conversion. The inductors configured with winding spacers described herein are designed to operate on medium voltage systems and to minimize corona potential in a mid-level power converter. The inductors configured with winding spacers, described infra, are optionally used on low and/or high voltage systems.

Inductor Winding Spacers

In still yet another embodiment, the inductor 230 is optionally configured with inductor winding spacers. Generally, the inductor winding spacers or simply winding spacers are used to space winding turns to reduce corona potential, described infra.

For clarity of presentation, initially the inductor winding is described. Subsequently, the corona potential is further described. Then the inductor spacers are described. Finally, the use of the inductor spacers to reduce corona potential through controlled winding with winding turns separated by the insulating inductor spacers is described.

Inductor Winding

The inductor 230 includes a inductor core 610 that is wound with a winding 620. The winding 620 comprises a conductor for conducting electrical current through the inductor 230. The winding 620 optionally comprises any suitable material for conducting current, such as conventional wire, foil, twisted cables, and the like formed of copper, aluminum, gold, silver, or other electrically conductive material or alloy at any temperature.

Preferably, the winding 620 comprises a set of wires, such as copper magnet wires, wound around the inductor core 610 in one or more layers. Preferably, each wire of the set of wires is wound through a number of turns about the inductor core 610, where each element of the set of wires initiates the winding at a winding input terminal and completes the winding at a winding output terminal. Optionally, the set of wires forming the winding 620 nearly entirely covers the inductor core 610, such as a toroidal shaped core. Leakage flux is inhibited from exiting the inductor 230 by the winding 620, thus reducing electromagnetic emissions, as the windings 620 function as a shield against such emissions. In addition, the soft radii in the geometry of the windings 620 and the inductor core 610 material are less prone to leakage flux than conventional configurations. Stated again, the toroidal or doughnut shaped core provides a curved outer surface upon which the windings are wound. The curved surface allows about uniform support for the windings and minimizes and/or reduced gaps between the winding and the core.

Corona Potential

A corona potential is the potential for long term breakdown of winding wire insulation due to the high electric potentials between winding turns near the inductor 230, which creates ozone. The ozone breaks down insulation coating the winding wire, results in degraded performance, and/or results in failure of the inductor 230.

Inductor Spacers

The inductor 230 is optionally configured with inductor winding spacers, such as a main inductor spacer 810 and/or inductor segmenting winding spacers 820. Generally, the spacers are used to space winding turns, described infra. Collectively, the main inductor spacer 810 and segmenting winding spacers 820 are referred to herein as inductor spacers. Generally, the inductor spacer comprises a non-conductive material, such as air, a plastic, or a dielectric material. The insulation of the inductor spacer minimizes energy transfer between windings and thus minimizes or reduces corona potential, formation of corrosive ozone through ionization of oxygen, correlated breakdown of insulation on the winding wire, and/or electrical shorts in the inductor 230.

A first low power example, of about 690 volts, is used to illustrate need for a main inductor spacer 810 and lack of need for inductor segmenting winding spacers 820 in a low power transformer. In this example, the inductor 230 includes a inductor core 610 wound twenty times with a winding 620, where each turn of the winding about the core is about evenly separated by rotating the inductor core 610 about eighteen degrees (360 degrees/20 turns) for each turn of the winding. If each turn of the winding 620 about the core results in 34.5 volts, then the potential between turns is only about 34.5 volts, which is not of sufficient magnitude to result in a corona potential. Hence, inductor segmentation winding spacers 820 are not required in a low power inductor/conductor system. However, potential between the winding input terminal and the winding output terminal is about 690 volts (34.5 volts times 20 turns). More specifically, the potential between a winding wire near the input terminal and the winding wire near the output terminal is about 690 volts, which can result in corona potential. To minimize the corona potential, an insulating main inductor spacer 810 is placed between the input terminal and the output terminal. The insulating property of the main inductor spacer 810 minimizes or prevents shorts in the system, as described supra.

A second medium power example illustrates the need for both a main inductor spacer 810 and inductor segmenting winding spacers 820 in a medium power system. In this example, the inductor 230 includes a inductor core 610 wound 20 times with a winding 620, where each turn of the winding about the core is about evenly separated by rotating the inductor core 610 about 18 degrees (360 degrees/20 turns) for each turn of the winding. If each turn of the winding 620 about the core results in about 225 volts, then the potential between individual turns is about 225 volts, which is of sufficient magnitude to result in a corona potential. Placement of an inductor winding spacer 820 between each turn reduces the corona potential between individual turns of the winding. Further, potential between the winding input terminal and the winding output terminal is about 4500 volts (225 volts times 20 turns). More specifically, the potential between a winding wire near the input terminal and the winding wire near the output terminal is about 4500 volts, which results in corona potential. To minimize the corona potential, an insulating main inductor spacer 810 is placed between the input terminal and the output terminal. Since the potential between winding wires near the input terminal and output terminal is larger (4500 volts) than the potential between individual turns of wire (225 volts), the main inductor spacer 810 is preferably wider and/or has a greater insulation than the individual inductor segmenting winding spacers 820.

In a low power system, the main inductor spacer 810 is optionally about 0.125 inch in thickness. In a mid-level power system, the main inductor spacer is preferably about 0.375 to 0.500 inch in thickness. Optionally, the main inductor spacer 810 thickness is greater than about 0.125, 0.250, 0.375, 0.500, 0.625, or 0.850 inch. The main inductor spacer 810 is preferably thicker, or more insulating, than the individual segmenting winding spacers 820. Optionally, the individual segmenting winding spacers 820 are greater than about 0.0312, 0.0625, 0.125, 0.250, 0.375 inches thick. Generally, the main inductor spacer 810 has a greater thickness or cross-sectional width that yields a larger electrically insulating resistivity versus the cross-section or width of one of the individual segmenting winding spacers 820. Preferably, the electrical resistivity of the main inductor spacer 810 between the first turn of the winding wire proximate the input terminal and the terminal output turn proximate the output terminal is at least about 10, 20, 30, 40, 50, 60, 70, 80, 90, or 100 percent greater than the electrical resistivity of a given inductor segmenting winding spacer 820 separating two consecutive turns of the winding 620 about the inductor core 610 of the inductor 230. The main inductor spacer 810 is optionally a first material and the inductor segmenting spacers are optionally a second material, where the first material is not the same material as the second material. The main inductor spacer 810 and inductor segmenting winding spacers 820 are further described, infra.

In yet another example, the converter operates at levels exceeding about 2000 volts at currents exceeding about 400 amperes. For instance, the converter operates at above about 1000, 2000, 3000, 4000, or 5000 volts at currents above any of about 500, 1000, or 1500 amperes. Preferably the converter operates at levels less than about 15,000 volts.

Figure 8:
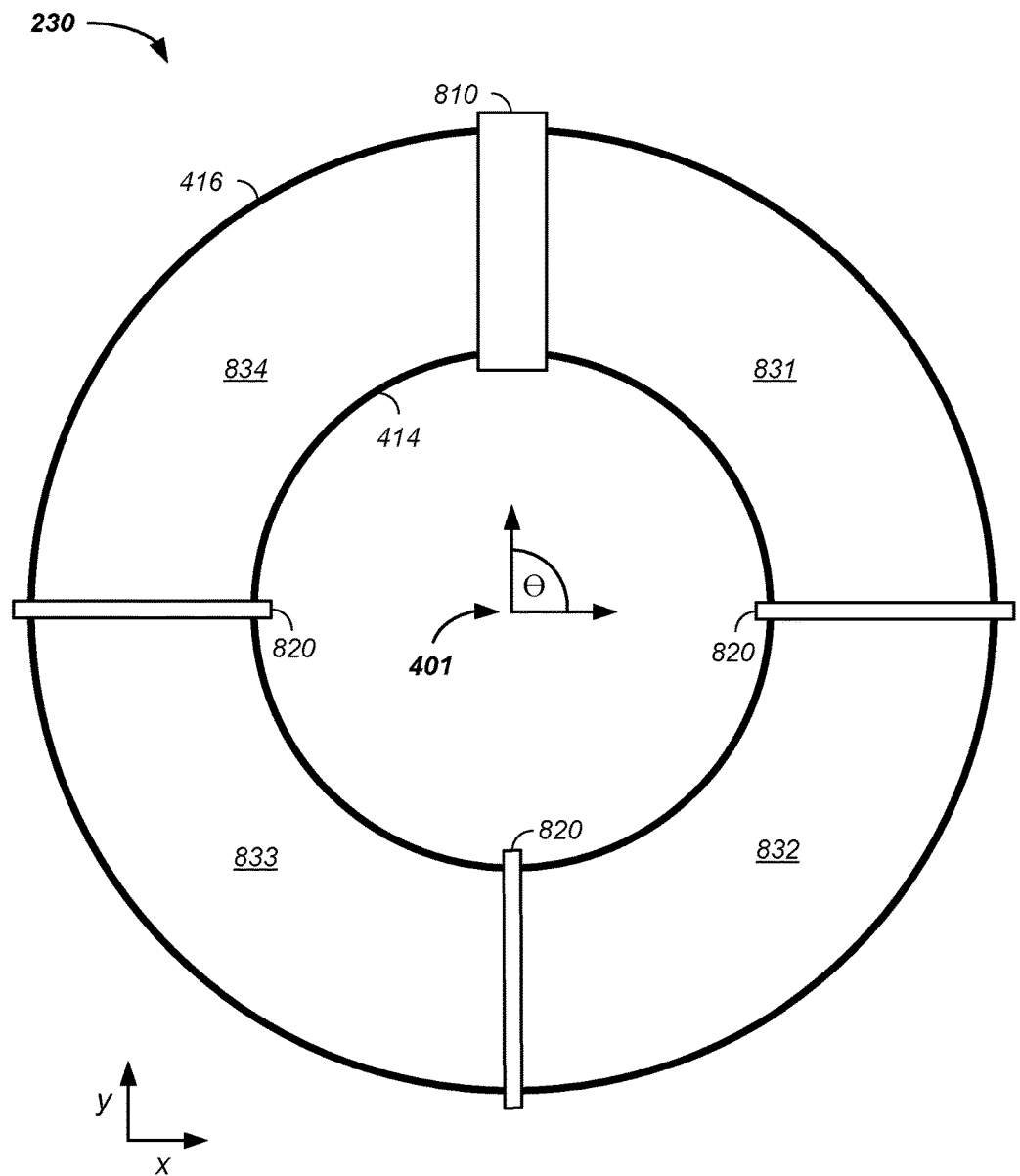
FIG. 8 illustrates a sectioned inductor.

Referring now to FIG. 8, an example of an inductor 230 configured with four spacers is illustrated. For clarity, the main inductor spacer 810 is positioned at the twelve o'clock position and the inductor segmenting winding spacers 820 are positioned relative to the main inductor winding spacer. The clock position used herein are for clarity of presentation. The spacers are optionally present at any position on the inductor and any coordinate system is optionally used. For example, referring still to FIG. 8, the three illustrated inductor segmenting winding spacers 820 are positioned at about the three o'clock, six o'clock, and nine o'clock positions. However, the main inductor spacer 810 is optionally present at any position and the inductor segmenting winding spacers 820 are positioned relative to the main inductor spacer 810. As illustrated, the four spacers segment the toroid into four sections. Particularly, the main inductor spacer 810 and the first inductor segmenting winding spacer at the three o'clock position create a first inductor section 831. The first of the inductor segmenting winding spacers at the three o'clock position and a second of the inductor segmenting winding spacers at the six o'clock position create a second inductor section 832. The second of the inductor segmenting winding spacers at the six o'clock position and a third of the inductor segmenting winding spacers at the nine o'clock position create a third inductor section 833. The third of the inductor segmenting winding spacers at the nine o'clock position and the main inductor spacer 810 at about the twelve o'clock position create a fourth inductor section 834. In this system, preferably a first turn of the winding 620 wraps the inductor core 610 in the first inductor section 831, a second turn of the winding 620 wraps the inductor core 610 in the second inductor section 832, a third turn of the winding 620 wraps the inductor core 610 in the third inductor section 833, and a fourth turn of the winding 620 wraps the inductor core 610 in the fourth inductor section 834. Generally, the number of inductor spacers 810 is set to create 2, 3, 4, 5, 6, 7, 8, 9, 10, 11, 12, 13, 14, 15, 16, 17, 18, 19, 20, or more inductor sections. Generally, the angle theta is the angle between two inductor sections from a central point 401 of the inductor 230. Each of the spacers 810, 820 is optionally a ring about the inductor core 610 or is a series of segments about forming a circumferential ring about the inductor core 610.

Inductor spacers provide an insulating layer between turns of the winding. Still referring to FIG. 8, an individual spacer 810, 820 preferably circumferentially surrounds the inductor core 610. Preferably, the individual spacers 810, 820 extend radially outwardly from an outer surface of the inductor core 610. The spacers 810, 820 optionally contact and/or proximally contact the inductor core 610, such as via an adhesive layer or via a spring loaded fit.

Figure 9:
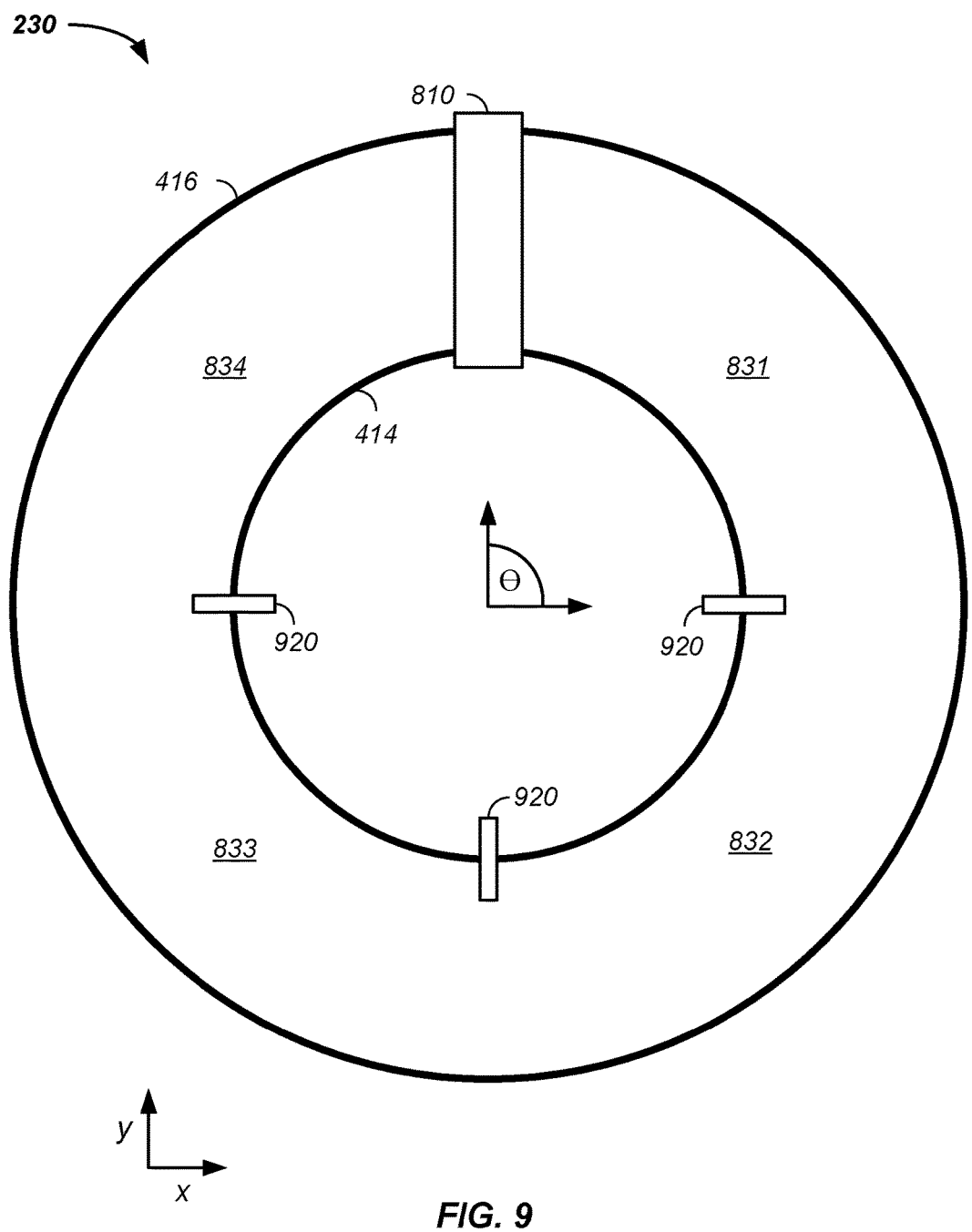
FIG. 9 illustrates partial circumferential inductor winding spacers.

Referring now to FIG. 9, optionally one or more of the spacers do not entirely circumferentially surround the inductor core 610. For example, short spacers 920 separate the individual turns of the winding at least in the central aperture 412 of the inductor core 610. In the illustrated example, the short spacers 920 separate the individual turns of the winding in the central aperture 412 of the inductor core 610 and along a portion of the inductor faces 417, where geometry dictates that the distance between individual turns of the winding 620 is small relative to average distance between the wires at the outer face 416.

Figure 10:
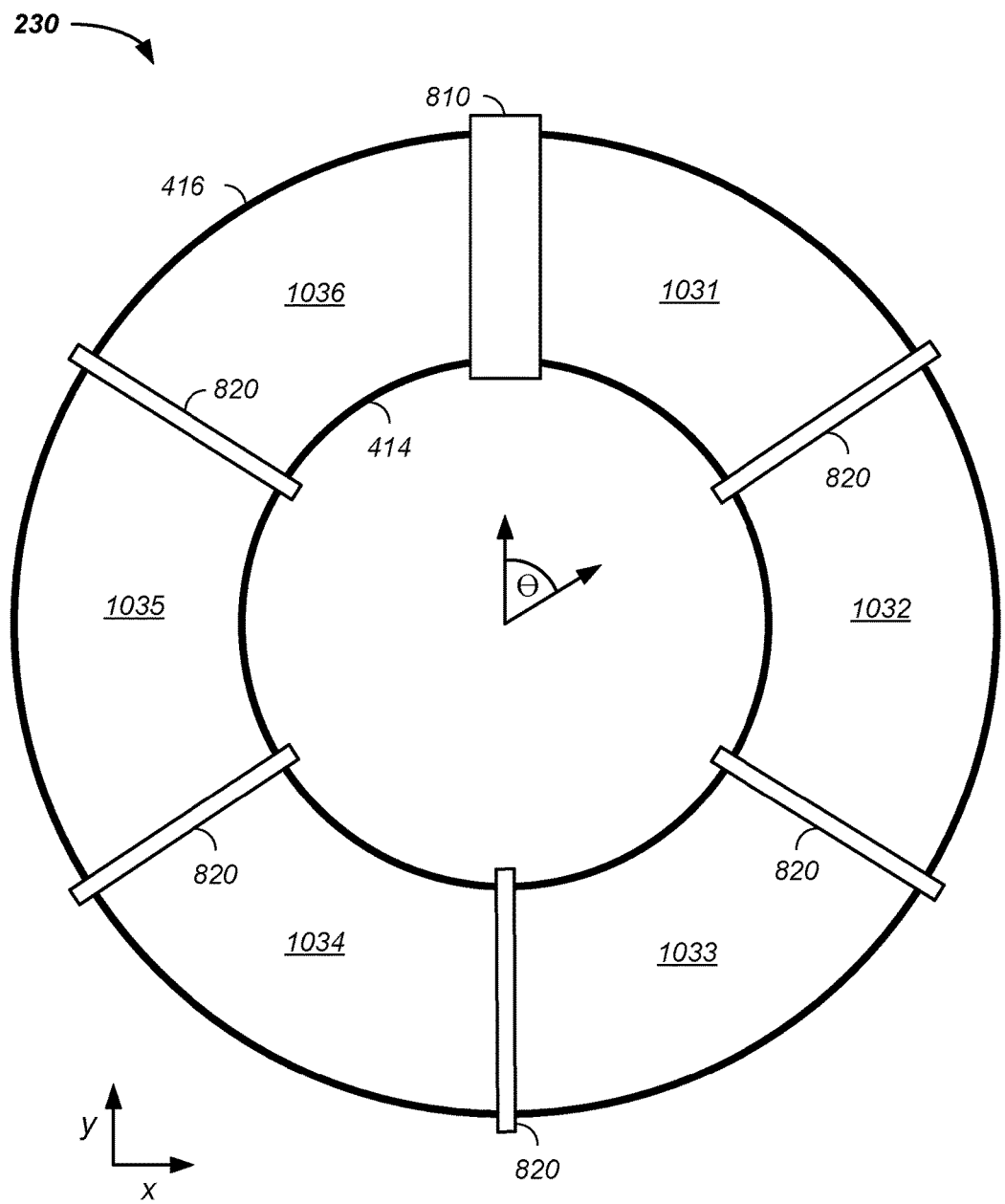
FIG. 10 illustrates an inductor with multiple winding spacers.
Figure 11:
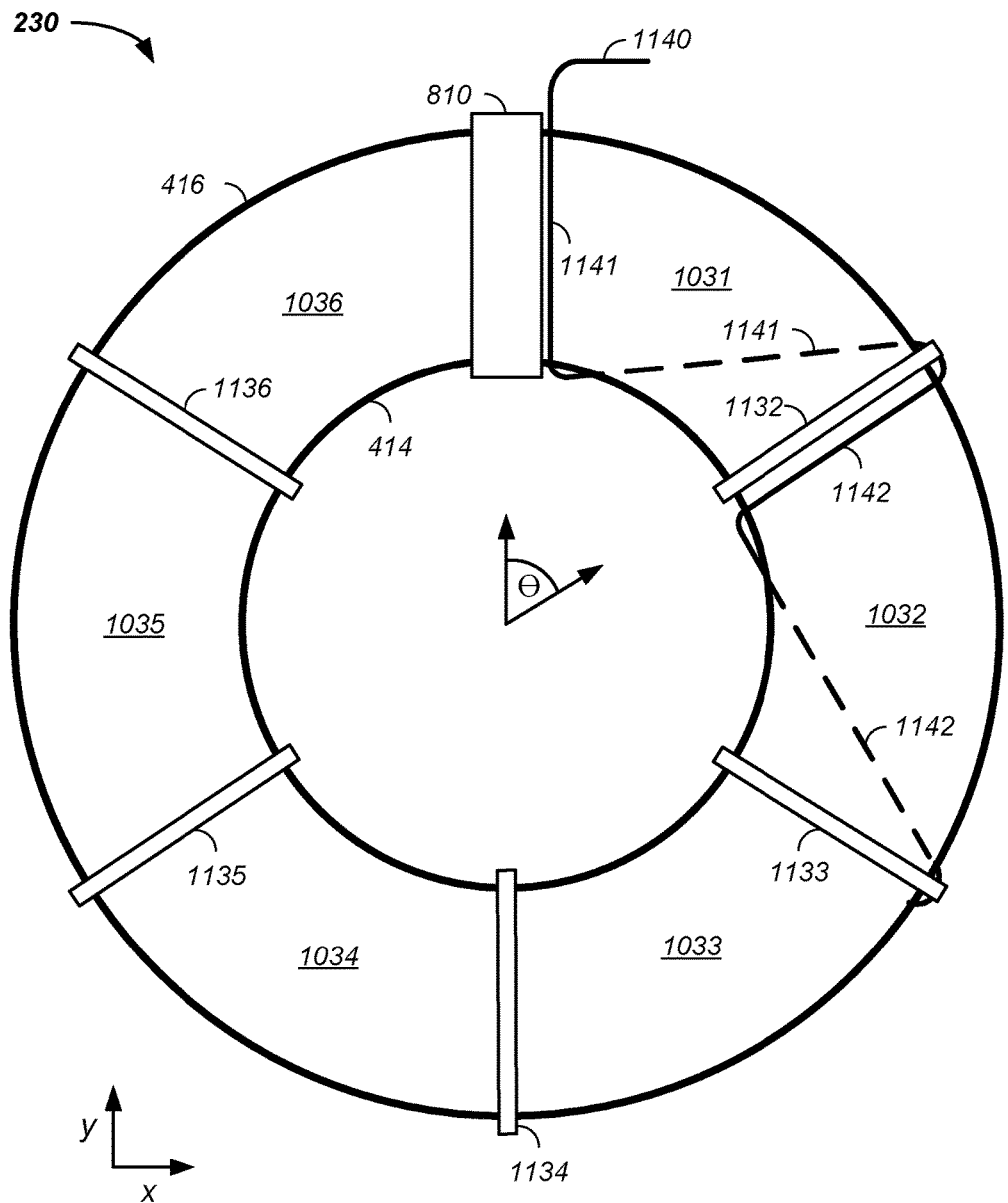
FIG. 11 illustrates two winding turns on an inductor.
Figure 12:
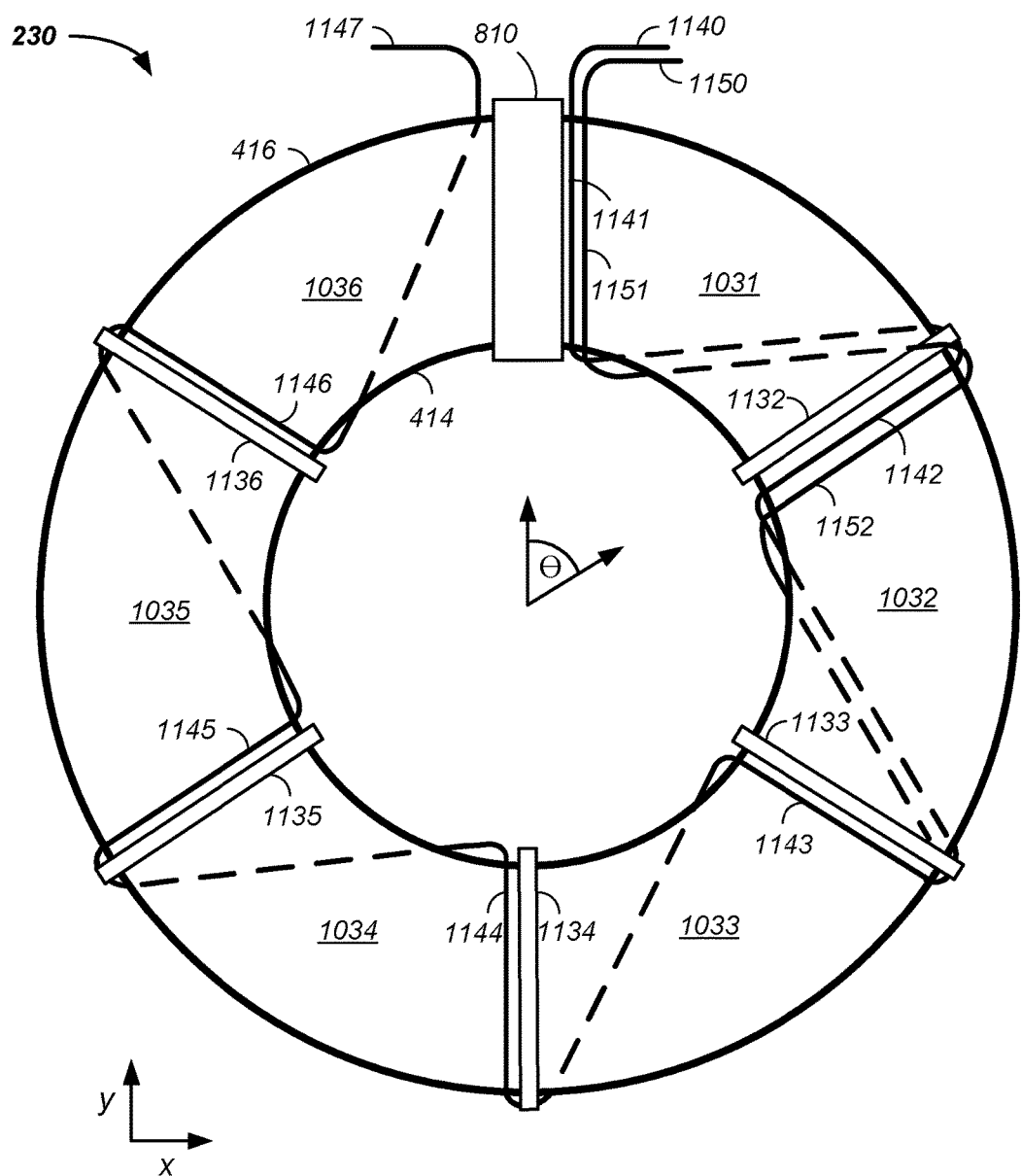
FIG. 12 illustrates multiple wires winding an inductor.

Referring now to FIGS. 10, 11, and 12, an example of an inductor 230 segmented into six sections using a main inductor spacer 810 and a set of inductor segmenting winding spacers 820 is provided. Referring now to FIG. 10, the main inductor spacer 810 and five inductor segmenting winding spacers 820 segment the periphery of the core into six regions 1031, 1032, 1033, 1034, 1035, and 1036.

Referring now to FIG. 11, two turns of a first winding are illustrated. A first winding wire 1140 is wound around the first region core 1031 in a first turn 1141. Similarly, the winding 620 is continued in a second turn 1142 about a second region of the core 1032. The first turn 1141 and the second turn 1142 are separated by a first segmenting winding spacer 1132.

Referring now to FIG. 12, six turns of a first winding are illustrated. Continuing from FIG. 11, the winding 620 is continued in a third turn 1143, a fourth turn 1144, a fifth turn 1145, and a sixth turn 1146. The first and second turns 1141, 1142 are separated by the first segmenting winding spacer 1132, the second and third turns 1142, 1143 are separated by the second segmenting winding spacer 1133, the third and fourth turns 1143, 1144 are separated by the third segmenting winding spacer 1134, the fourth and fifth turns 1144, 1145 are separated by the fourth segmenting winding spacer 1135, and the fifth and sixth turns 1145, 1146 are separated by the fifth segmenting winding spacer 1136. Further, the first and sixth turns 1141, 1146 are separated by the main inductor spacer 810. Similarly, the first two turns 1151, 1152 of a second winding wire 1150 are illustrated, that are separated by the first segmenting winding spacer 1132. Generally, any number of winding wires are wrapped or layered to form the winding 610 about the inductor core 610 of the inductor 230. An advantage of the system is that in a given inductor section, such as the first inductor section 1031, each of the winding wires are at about the same potential, which yields essentially no risk of corona potential within a given inductor section. Generally, an $m^{th}$ turn of an $n^{th}$ wire are within about 5, 10, 15, 30, 45, or 60 degrees of each other at any position on the inductor, such as at about the six o'clock position.

For a given winding wire, the first turn of the winding wire, such as the first turn 1141, proximate the input terminal is referred to herein as an initial input turn. For the given wire, the last turn of the wire before the output terminal, such as the sixth turn 1146, is referred to herein as the terminal output turn. The initial input turn and the terminal output turn are preferably separated by the main inductor spacer.

A given inductor segmenting winding spacer 820 optionally separates two consecutive winding turns of a winding wire winding the inductor core 610 of the inductor 230.

Figure 13:
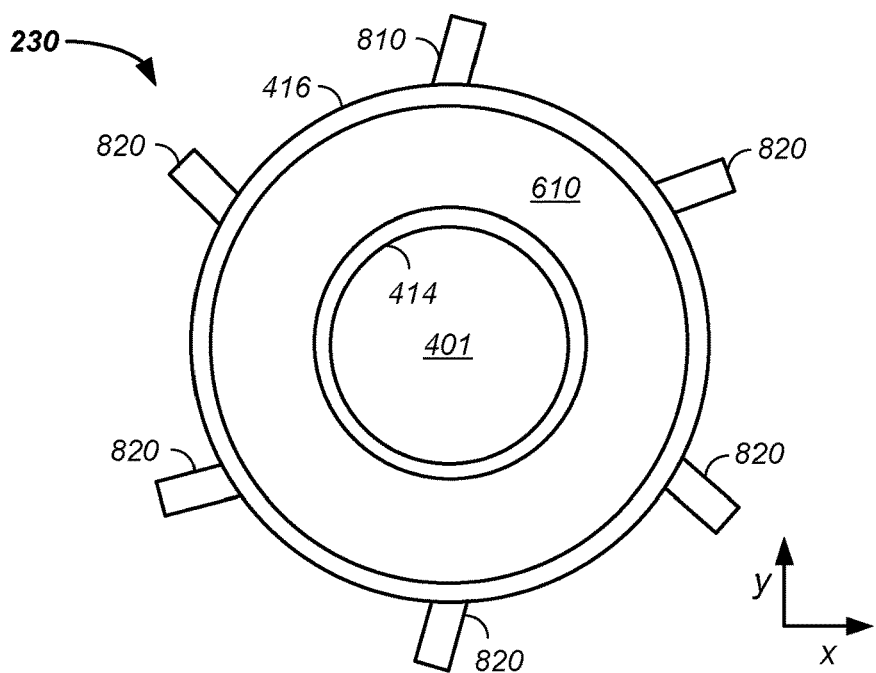
FIG. 13 illustrates tilted winding spacers on an inductor.
Figure 14:
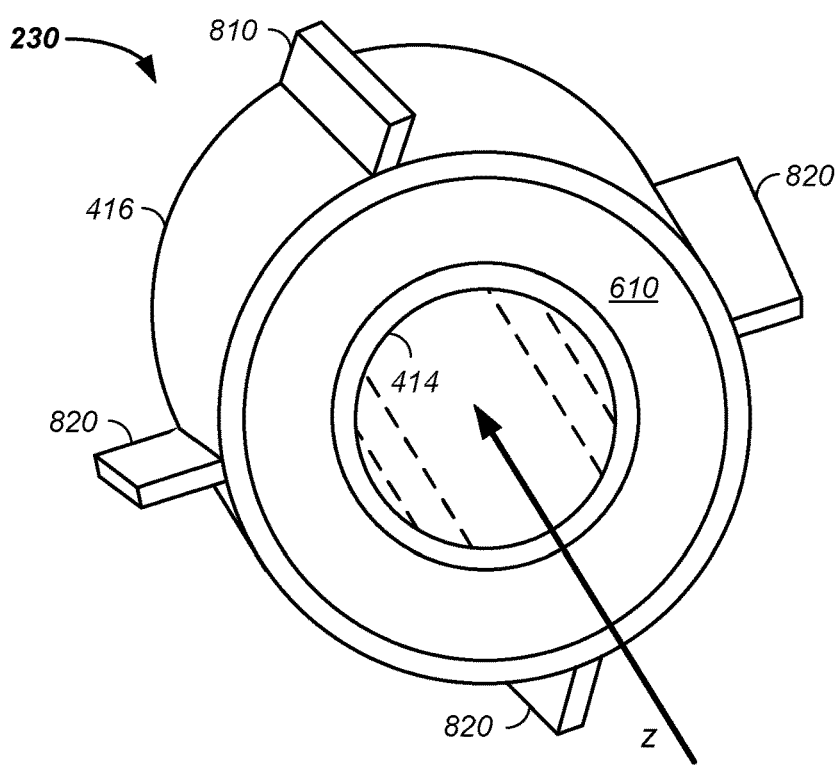
FIG. 14 illustrates tilted and rotated winding spacers on an inductor.

Referring now to FIG. 13, one embodiment of manufacture rotates the inductor core 610 as one or more winding wires are wrapped about the inductor core 610. For example, for a four turn winding, the core is rotated about 90 degrees with each turn. During the winding process, the inductor core 610 is optionally rotated at an about constant rate or is rotated and stopped with each turn. To aid in the winding process, the spacers are optionally tilted, rotated, or tilted and rotated. Referring now to FIG. 13, inductor spacers 810, 820 are illustrated that are tilted relative to a spacer about parallel to the outer face 416 of the inductor 230. For clarity of presentation, the inductor spacers are only illustrated on the outer edge of the inductor core 610. Tilted spacers on the outer edge of the inductor 230 have a length that is aligned with the z-axis, but are tilted along the x- and/or y-axes. More specifically, as the spacer 810, 820 extends radially outward from the inductor core 610, the spacer 810, 820 position changes in terms of both the x- and y-axes locations. Referring now to FIG. 14, inductor spacers are illustrated that are both tilted and rotated. For clarity of presentation, the inductor spacers are only illustrated on the outer edge of the inductor core 610. Tilted and rotated spacers on the outer edge of the inductor core 610 have both a length that is rotated relative to the z-axis and a height that is tilted relative to the x- and/or y-axes, as described supra.

Capacitor

Referring again to FIG. 2, capacitors 250 are used with inductors 230 to create a filter to remove harmonic distortion from current and voltage waveforms. A buss bar carries power from one point to another. The capacitor buss bar 260 mounting system minimizes space requirements and optimizes packaging. The buss bars use a toroid/heat sink integrated system solution, THISS®, (CTM Magnetics, Tempe, Ariz.) to filter output power 150 and customer generated input power 154. The efficient filter output terminal layout described herein minimizes the copper cross section necessary for the capacitor buss bars 260. The copper cross section is minimized for the capacitor buss bar by sending the bulk of the current directly to the output terminals 221, 223, 225. In these circuits, the current carrying capacity of the capacitor bus conductor is a small fraction of the full approximate line frequency load or fundamental frequency current sent to the output load via the output terminals 221, 223, 225. The termination of the THISS® technology filter inductor is integrated to the capacitor bank for each phase of the system. These buss bars are optionally manufactured out of any suitable material and are any suitable shape. For instance, the buss bars are optionally a flat strip or a hollow tube. In one example, flat strips of tinned copper with threaded inserts or tapped threaded holes are used for both mounting the capacitors mechanically as well as providing electrical connection to each capacitor. This system optimizes the packaging efficiency of the capacitors by mounting them vertically and staggering each capacitor from each side of the buss bar for maximum density in the vertical dimension. A common neutral buss bar or flex cable 265 is used between two phases to further reduce copper quantity and to minimize size. A jumper buss bar connects this common neutral point to another phase efficiently, such as through use of an about flat strip of copper. Connection fittings designed to reduce radio-frequency interference and power loss are optionally used. The buss bars are optionally designed for phase matching and for connecting to existing transmission apparatus. The buss bars optionally use a mechanical support spacer, 270, made from non-magnetic, non-conductive material with adequate thermal and mechanical properties, such as a suitable epoxy and glass combination, a Glastic® or a Garolite material. The integrated output terminal buss bars provide for material handling of the filter assembly as well as connection to the sine wave filtered load or motor. Though a three phase implementation is displayed, the implementation is readily adapted to integrate with other power systems.

Referring now to FIG. 15, an additional example of a capacitor bank 1500 is provided. In this example, a three phase system containing five total buss bars 260 including a common neutral buss bar 265 is provided. The illustrated system contains seven columns and three rows of capacitors 250 per phase or twenty-one capacitors per phase for each of three phases, U1, V1, W1. Spacers maintain separation of the component capacitors. A shared neutral point 270 illustrates two phases sharing a single shared neutral bus.

Cooling

In still yet another embodiment, the inductor 230 is cooled with a cooling system 240, such as with a fan, forced air, a heat sink, a heat transfer element or system, a thermal transfer potting compound, a liquid coolant, and/or a chill plate. Each of these optional cooling system elements are further described, infra. While, for clarity, individual cooling elements are described separately, the cooling elements are optionally combined into the cooling system in any permutation and/or combination.

Heat Sink

A heat sink 1640 is optionally attached to any of the electrical components described herein. Optionally, a heat sink 1640 or a heat sink fin is affixed to an internal surface of a cooling element container, where the heat sink fin protrudes into an immersion coolant, an immersion fluid, and/or into a potting compound to enhance thermal transfer away from the inductor 230 to the housing element.

Fan

In one example, a cooling fan is used to move air across any of the electrical components, such as the inductor 230 and/or the capacitor 250. The air flow is optionally a forced air flow. Optionally, the air flow is directed through a shroud 450 encompassing one, two, three or more inductors 230. Optionally, the shroud 450 encompasses one or more electrical components of one, two, three or more power phases. Optionally, the shroud 450 contains an air flow guiding element between individual power phases.

Thermal Grease

Any of the inductor components, such as the inductor core, inductor winding, a coating on the inductor core, and/or a coating on the inductor winding is optionally coated with a thermal grease to enhance thermal transfer of heat away from the inductor.

Bundt Cooling System

Figure 16:
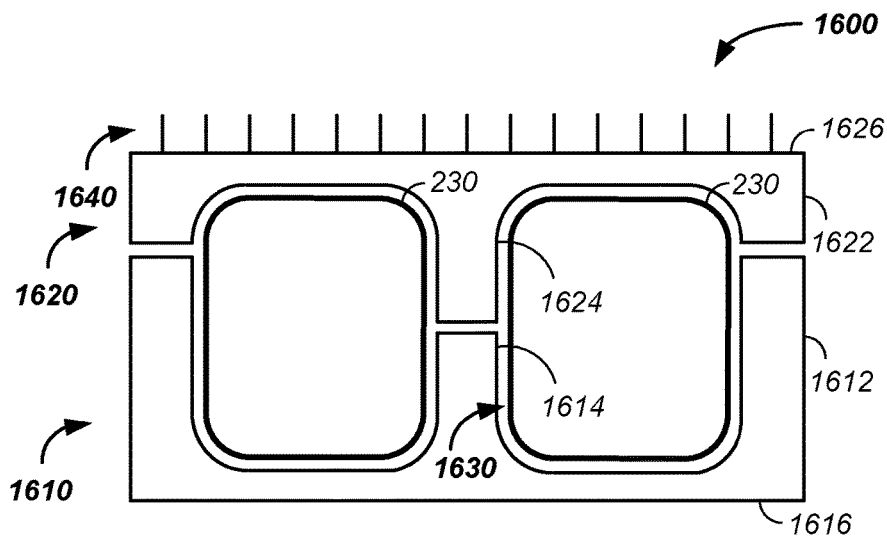
FIG. 16 illustrates a Bundt pan inductor cooling system.

In another example, a Bundt pan style inductor cooling system 1600 is described. Referring now to FIG. 16, a cross-section of a Bundt pan style cooling system is provided. A first element, an inductor guide 1610, optionally includes: an outer ring 1612 and/or an inner cooling segment 1614, elements of which are joined by an inductor positioning base 1616 to form an open inner ring having at least an outer wall. The inductor 230 is positioned within the inner ring of the inductor guide 1610 with an inductor face 417, such as the inductor front face 418, proximate the inductor positioning base 1616. The inductor guide 1610 is optionally about joined and/or is proximate to an inductor key 1620, where the inductor guide 1610 and the inductor key 1620 combine to form an inner ring cavity for positioning of the inductor 230. The inductor key 1620 optionally includes an outside ring 1622, a middle post 1624, and/or an inductor lid 1626. During use, the inductor lid 1626 is proximate an inductor face 417, such as the inductor back face 419. The inductor base 1610, inductor 230, and inductor lid 1620 are optionally positioned in any orientation, such as to mount the inductor 230 horizontally, vertically, or at an angle relative to gravity.

The Bundt style inductor cooling system 1600 facilitates thermal management of the inductor 230. The inductor guide 1610 and/or the inductor lid 1620 is at least partially made of a thermally transmitting material, where the inductor guide 1610 and/or the inductor lid 1620 draws heat away from the inductor 230. A thermal transfer agent 1630, such as a thermally conductive potting compound, a thermal grease, and/or a heat transfer liquid is optionally placed between an outer surface of the inductor 230 and an inner surface of the inductor guide 1610 and/or the inductor lid 1620. One or more heat sinks 1640 or heat sink fins are optionally attached to any surface of the inductor base 1610 and/or the inductor lid 1620. In one case, not illustrated, the heat sink fins function as a mechanical stand under the inductor guide 1610 through which air or a liquid coolant optionally flows. More generally, a heat sink 1640 is optionally attached to any of the electrical components described herein.

For example, the cooling system comprises at least two parts, such as a plurality of coolant containment parts or a bottom section of a cooling jacket and a top section of a cooling jacket. The two parts come together to surround or circumferentially surround the wound core during use. The top and bottom halves join each other along an axis coming down onto the toroid shape of the wound core, referred to as a z-axis. However, the pieces making up the cooling system are optionally assembled in any orientation, such as along x-axis and/or y-axis, referring to the axis planes of the toroid.

Further, the top and bottom sections of a cooling jacket are optionally equal in size or either piece could be from 1 to 99 percent of the mass of the sandwiched pair of pieces. For instance, the bottom piece may make up about 10, 25, 50, 75, or 90 percent of the combined cooling jacket assembly. Still further, the cooling jacket may be composed of multiple pieces, such as 3, 4, or more pieces, where the center pieces are rings sandwiched by the top and bottom section of the cooling jacket. Generally, any number of cooling pieces optionally come together along any combination of axes to form a jacket cooling the wound core. Each section of the cooling jacket optionally contains its own cooling in and cooling out lines.

Potting Material

Figure 17A:
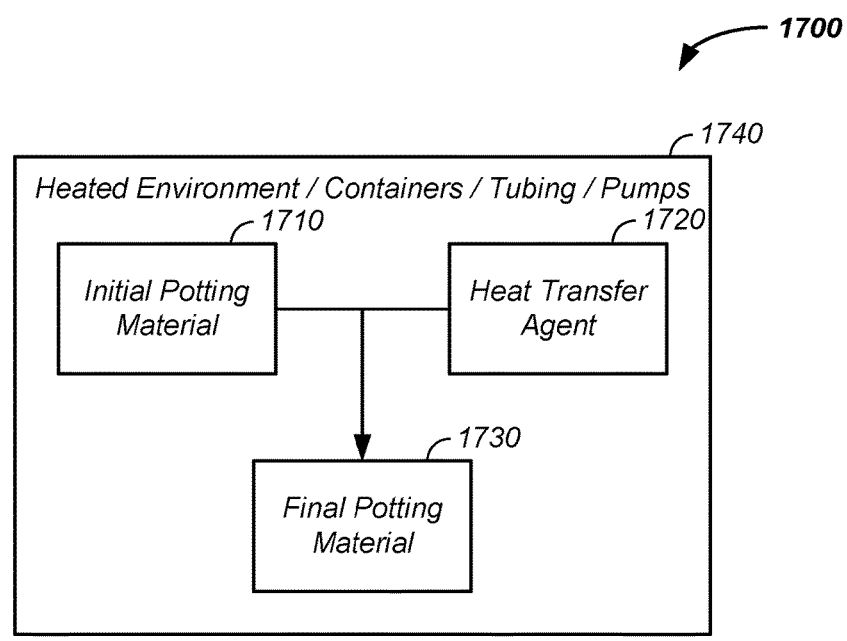
FIG. 17A illustrates formation of a heat transfer enhanced potting material.

Referring now to FIGS. 17 (A-C), the potting material 1760/potting compound/potting agent optionally and preferably comprises one or more of: a high thermal transfer coefficient; resistance to fissure when the mass of the inductor/conductor system has a large internal temperature change, such as greater than about 50, 100, or 150 degrees Centigrade; flexibility so as not to fissure with temperature variations, such as greater than 100 degrees Centigrade, in the potting mass; low thermal impedance between the inductor 230 and heat dissipation elements; sealing characteristics to seal the inductor assembly from the environment such that a unit can conform to various outdoor functions, such as exposure to water and salts; and/or mechanical integrity for holding the heat dissipating elements and inductor 230 together as a single module at high operating temperatures, such as up to about 150 or 200 degrees Centigrade. Examples of potting materials include: an electrical insulating material, a polyurethane; a urethane; a multi-part urethane; a polyurethane; a multi-component polyurethane; a polyurethane resin; a resin; a polyepoxide; an epoxy; a varnish; an epoxy varnish; a copolymer; a thermosetting polymer; a thermoplastic; a silicone based material; Conathane® (Cytec Industries, West Peterson, N.J.), such as Conathane EN-2551, 2553, 2552, 2550, 2534, 2523, 2521, and EN 7-24; Insulcast® (ITW Insulcast, Roseland, N.J.), such as Insulcast 333; Stycast® (Emerson and Cuming, Billerica, Mass.), such as Stycast 281; and/or an epoxy varnish potting compound. As described supra, the initial potting material 1710 is optionally mixed with a heat transfer agent 1720, such as silica sand or aluminum oxide. Preferable concentration by weight of the heat transfer agent 1720 in the final potting material 1730 is greater than twenty and less than eighty percent by weight. For example, the potting material 1760/potting agent/potting compound is about 25, 30, 35, 40, 45, 50, 55, 60, 65, or 70 percent silica sand and/or aluminum oxide by volume, yielding a potting compound with lower thermal impedance. The heat transfer enhanced potting material is further described, infra.

Heat Transfer Enhanced Potting Material

Referring again to FIG. 17A, a method of production and resulting apparatus of a heat transfer enhanced potting material 1700 is described. Generally, an initial potting material 1710 is mixed with a heat transfer agent 1720 to form a final potting material 1730 about any electrical component, such as about an inductor of a filter circuit, as described supra. Optionally and preferably, one or more of the initial potting material 1710, the heat transfer agent 1720, final potting material 1730, and/or any mixing, transfer pipe or tubing, and/or container are pre-heated or maintained at an elevated temperature to facility mixing and movement of components of the final potting material 1730 or any constituent thereof, as further described infra.

Referring again to FIG. 17B, without loss of generality, an example of a silicon dioxide enriched potting material 1750 is provided, where the silicon dioxide is an example of the heat transfer agent 1720. Generally, a first epoxy component 1752, such as an epoxy part A, is mixed with a silicon dioxide mixture 1754 and a second epoxy component 1756, such as an epoxy part B, with or without an additive 1758 to form a final potting material 1760, which is dispensed about an electrical component to form a potted electrical component, such as a potted inductor 1770.

Sand Mixture

Figure 17B:
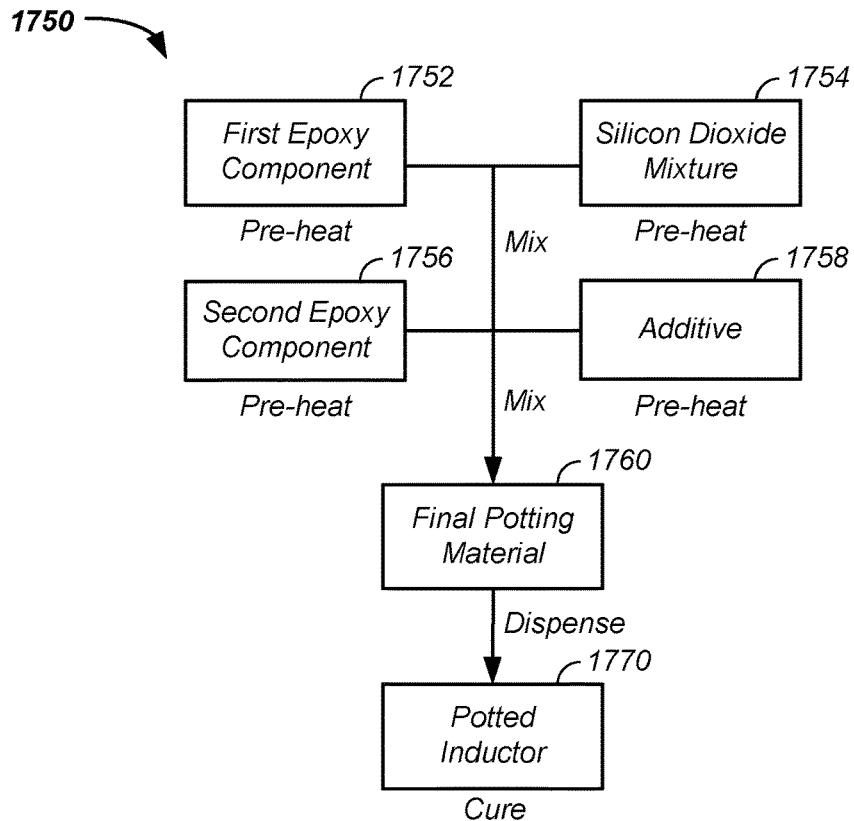
FIG. 17B illustrates an epoxy-sand potting material.
Figure 17C:
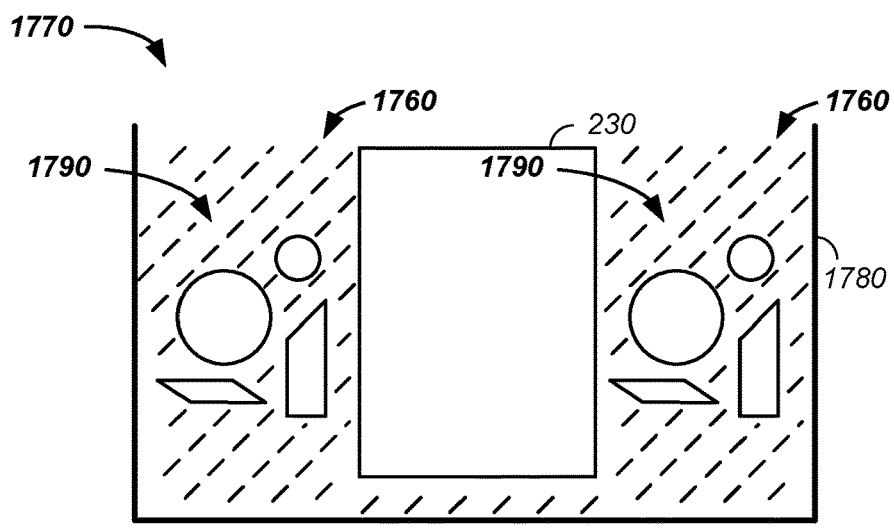
FIG. 17C illustrates the potting material about an electrical component.
Figure 18:
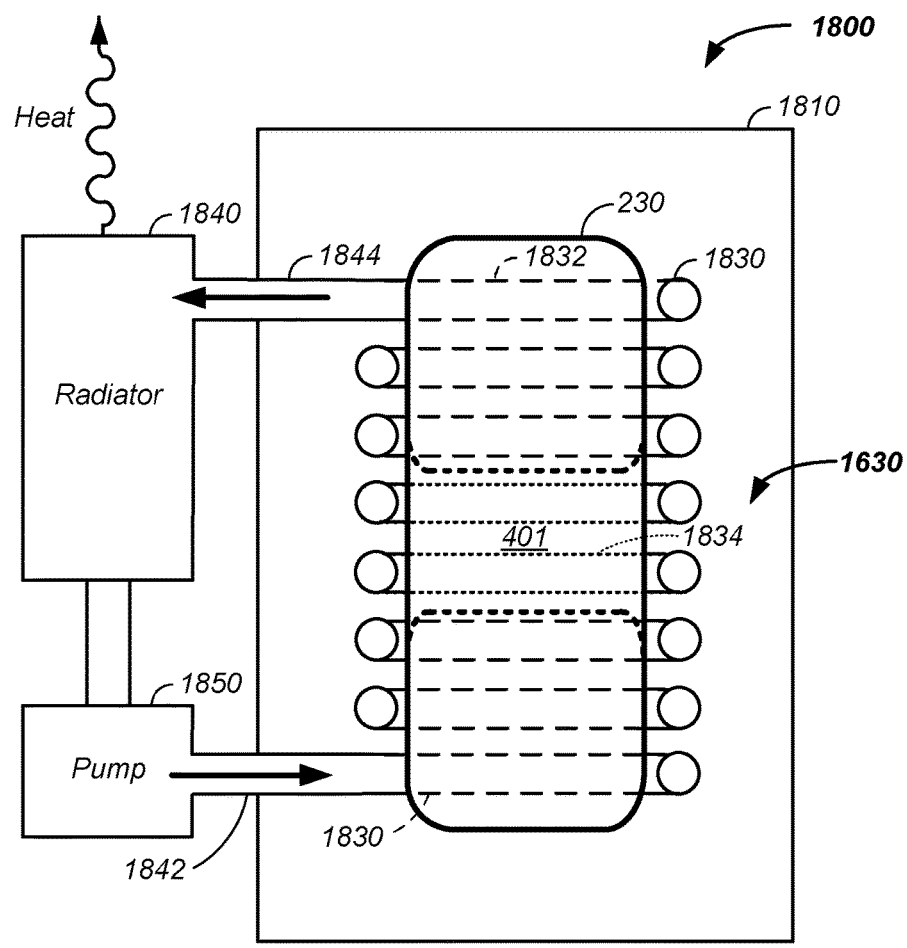
FIG. 18 illustrates a potted cooling line inductor cooling system.

Still referring to FIG. 17B and referring again to FIG. 17C, without loss of generality, the heat transfer agent 1720 is further described, where sand is the heat transfer agent 1720. A form of sand is the silicon dioxide mixture 1754.

Herein, the silicon dioxide component 1790 of the silicon dioxide mixture 1754 of the final potting material 1760 is used to refer to one or more of a silica mixture, silica, silicon dioxide, $SiO_2$, and/or a synthetic silica or sand. Generally, the silica purity in the silicon dioxide mixture 1754 is greater than 50, 60, 70, 80, 90, 95, 99, or 99.5%. The silica mixture optionally contains one or more additional components, such as iron oxide, aluminum oxide, titanium dioxide, calcium oxide, magnesium oxide, sodium oxide, and/or potassium oxide. However, preferably the concentration of each of the non-silicon oxides is less than 5, 4, 3, 2, 1, 0.5, or 0.2%. For example, the aluminum oxide concentration is optionally less than 2, 1, 0.5, 0.25, or 0.125%. However, as aluminum oxide functions as an expensive alternative to silicon dioxide, impurities of aluminum oxide are optionally used. Optionally and preferably, the final concentration of silicon dioxide and/or the silicon dioxide mixture 1754 in the potting material is between 10 and 75%, more preferably in excess of 25% and still more preferably 30±5%, 35±5%, 40±5%, 45±5%, 50±5%, 55±5%, or 60±5% by weight. The silicon dioxide mixture constituents are optionally of any shape, such as spherical, crystalline, rounded silica, angular silica, and/or whole grain silica. The individual silicon dioxide mixture constituents are preferably greater than one and less than one thousand micrometers in average diameter and/or have an inner-quartile top size of less than 5, 15, 30, 45, 250, 500, 1000, or 5000 micrometers. Optionally, silica, the individual silicon dioxide components 1790, and/or crystals of the silicon dioxide mixture 1754 comprise a ninety-fifth percentile particle size of less than 10, 20, 40, 80, 160, 320, 640, 1280, or 2560 micrometers. Optional types of silica include whole grain silica, round silica, angular silica, and/or sub-angular grain shaped silica. Optionally, the silicon dioxide mixture 1754 is screened to select particle size, particle size ranges, and/or particle size distributions prior to use.

Additive

Still referring to FIG. 17B, the additive 1758 is optionally mixed into the potting material in place of the silicon dioxide mixture 1754 or in combination with the silicon dioxide mixture. For example, a thermal transfer enhancing agent is optionally mixed with the potting agent to aid in heat dissipation from the inductor during use. While metal oxides are optionally used as the additive, the metal oxides are expensive. The inventor has discovered that silicon dioxide functions as a readily obtainable additive that is affordable, obtainable in desired particle sizes, and functions as a heat transfer agent in the potting material. Optional additives include iron oxide, aluminum oxide, a coloring oxide, an alkaline earth, and/or a transition metal.

Referring again to FIG. 17C, the final potting material 1760 is illustrated about an inductor 230 in a housing 1780.

Heating/Mixing Process

Referring again to FIG. 17B, one or more constituents of the final potting material 1760 are optionally and preferably preheated, such as to greater than 80, 90, 100, 110, 120, 130, or 140 degrees Fahrenheit to facility movement of the one or more constituents through corresponding shipping containers, storage containers, tubing, mixers, and/or pumps. Mixing of the constituents of the final potting material 1760 is optionally and preferably performed on preheated constituents and/or during heating. Optionally, one, many, or all of the mixing steps use one or more pumps for each constituent moving the corresponding constituent though connection pipes, conduit, tubing, or flow lines, where the connection pipes are also optionally and preferably preheated. One or more flow meters, heated connection pipes, and/or a scales are used to control mixing ratios, where the preferred mixing ratios are described supra.

For clarity of presentation and without loss of generality, an example of a heating/mixing process is provided. An epoxy part A, such as in a 55 gallon shipping drum, is preheated to 110 degrees Fahrenheit. Optionally, during preheating, the epoxy part A is mixed through rolling of the shipping drum during heating, such as for greater than 0.1, 1, 4, 8, 16, or 24 hours. The heat transfer agent 1720, such as silica, is also optionally and preferably heated to 110 degrees Fahrenheit and mixed with the epoxy part A in a mixing container. The resulting mixed epoxy part A and silica is combined with an epoxy part B, in the mixing container or a subsequent container, where again the epoxy part B is optionally and preferably preheated, moved through a heated line using a pump, and measured. Optionally, an additive is added at any step, such as after mixing the epoxy part A and the silica and before mixing in the epoxy part B. The resulting mixture, such as the final potting mixture 1760, is subsequently dispensed into a container on, under, beside, and/or about an electrical part to be contained, such as an inductor, and/or about a cooling line, as described infra.

The resulting electrical system element potted in a solid material and heat transfer agent yields an enhanced heat transfer compound as the heat transfer of the heat transfer agent 1720 and/or additive 1758 exceeds that of the raw potting material 1710. For example the heat transfer of epoxy and silica are about 0.001 and 2 W/m-K, respectively. The inventor has determined that the higher heat transfer rate of the heat transfer agent enhanced potting material allows use of a smaller inductor due to the increased efficiency at reduced operating temperatures and that less potting material is used for the same heat transfer, both of which reduce size and cost of the electrical system.

Potted Cooling System

In still another example, a thermally potted cooling inductor cooling system 1800 is described. In the potted cooling system, one or more inductors 230 are positioned within a container 1810. A thermal transfer agent 1630, such as a thermally conductive potting agent is placed substantially around the inductor 230 inside the container 1810. The thermally conductive potting agent is any material, compound, or mixture used to transfer heat away from the inductor 230, such as a resin, a thermoplastic, and/or an encapsulant. Optionally, one or more cooling lines 1830 run through the thermal transfer agent. The cooling lines 1830 optionally wrap 1832 the inductor 230 in one or more turns to form a cooling coil and/or pass through 1834 the inductor 230 with one or more turns. Optionally, a coolant runs through the coolant line 1830 to remove heat to a radiator 1840. The radiator is optionally attached to the housing 1810 or is a stand-alone unit removed from the housing. A pump 1850 is optionally positioned anywhere in the system to move the coolant sequentially through a cooling line input 1842, through the cooling line 1830 to pick up heat from the inductor 230, through a cooling line output 1844, through the radiator 1840 to dissipate heat, and optionally back into the pump 1850. Generally, the thermal transfer agent 1630 facilitates movement of heat, relative to air around the inductor 230, to one or more of: a heat sink 1640, the cooling line 1830, to the housing 1810, and/or to the ambient environment.

Inductor Cooling Line

Figure 19:
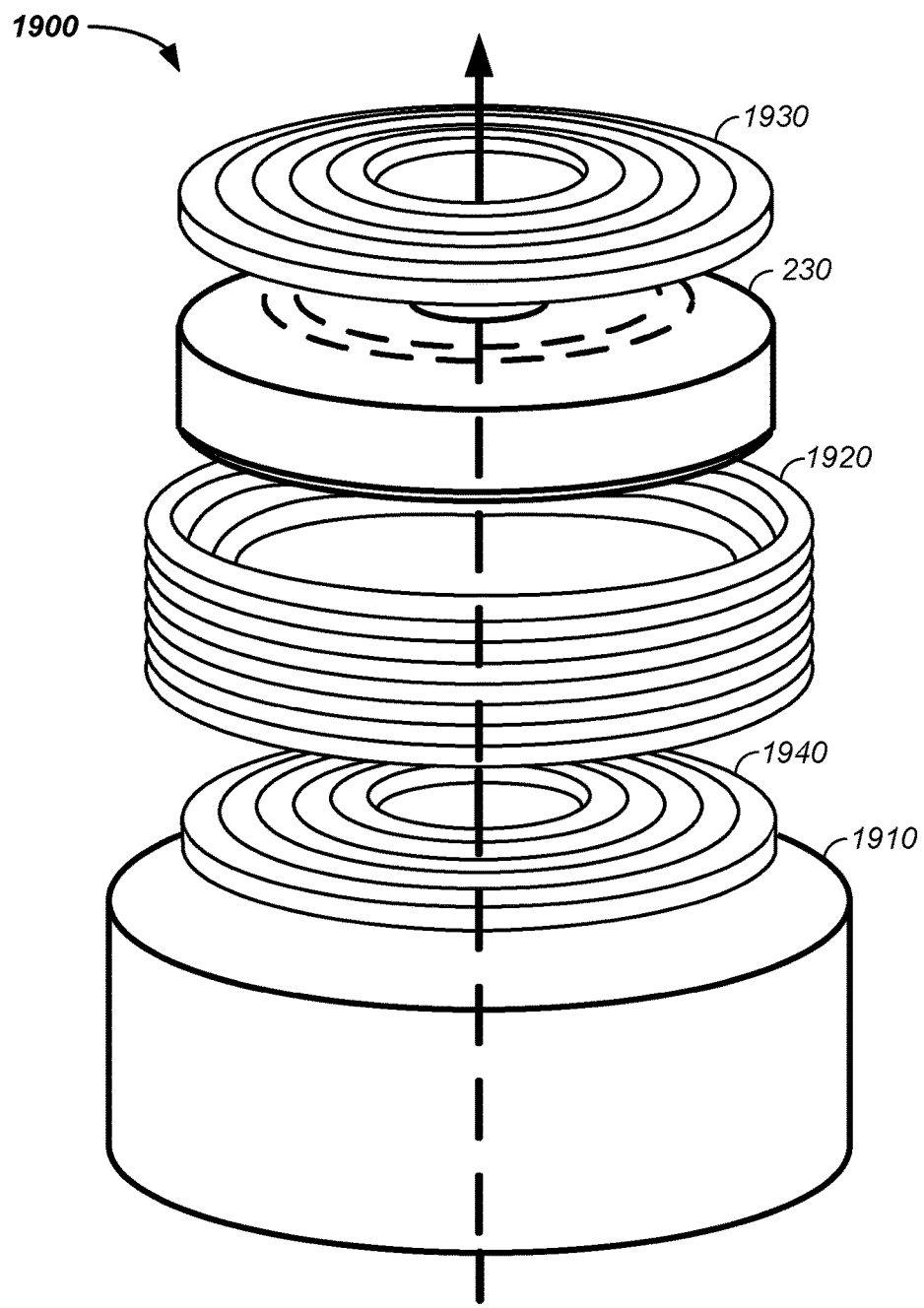
FIG. 19 illustrates a wrapped inductor cooling system.

In yet another example, an oil/coolant immersed inductor cooling system is provided. Referring now to FIG. 19, an expanded view example of a liquid cooled induction system 1900 is provided. In the illustrated example, an inductor 230 is placed into a cooling liquid container 1910. The container 1910 is preferably enclosed, but at least holds an immersion coolant. The immersion coolant is preferably in direct contact with the inductor 230 and/or the windings of the inductor 230. Optionally, a solid heat transfer material, such as the thermally conductive potting compound described supra, is used in place of the liquid immersion coolant. Optionally, the immersion coolant directly contacts at least a portion of the inductor core 610 of the inductor 230, such as near the input terminal and/or the output terminal. Further, the container 1910 preferably has mounting pads designed to hold the inductor 230 off of the inner surface of the container 1910 to increase coolant contact with the inductor 230. For example, the inductor 230 preferably has feet that allow for immersion coolant contact with a bottom side of the inductor 230 to further facilitate heat transfer from the inductor to the cooling fluid. The mounting feet are optionally placed on a bottom side of the container to facilitate cooling air flow under the container 1910.

Heat from a circulating coolant, separate from the immersion coolant, is preferably removed via a heat exchanger. In one example, the circulating coolant flows through an exit path 1844, through a heat exchanger, such as a radiator 1840, and is returned to the container 1910 via a return path 1842. Optionally a fan is used to remove heat from the heat exchanger. Typically, a pump 1850 is used in the circulating path to move the circulating coolant.

Still referring to FIG. 19, the use of the circulating fluid to cool the inductor is further described. Optionally, the cooling line is attached to a radiator 1840 or outside flow through cooling source. Circulating coolant optionally flows through a cooling coil:

circumferentially surrounding or making at least one cooling line turn 1920 or circumferential turn about the outer face 416 of the inductor 230 or on an inductor edge;

forming a path, such as an about concentrically expanding upper ring 1930, with subsequent turns of the cooling line forming an upper cooling surface about parallel to the inductor front face 418;

forming a path, such as an about concentrically expanding lower ring 1940, with subsequent turns of the cooling line forming a lower cooling surface about parallel to the inductor back face 419; and a cooling line running through the inductor 230 using a non-electrically conducting cooling coil or cooling coil segment.

Optionally, the coolant flows sequentially through one or more of the expanding upper ring 1930, the cooling line turn 1920, and the expanding lower ring 1940 or vise-versa. Optionally, parallel cooling lines run about, through, and/or near the inductor 230.

Coolant/Inductor Contact

Figure 20:
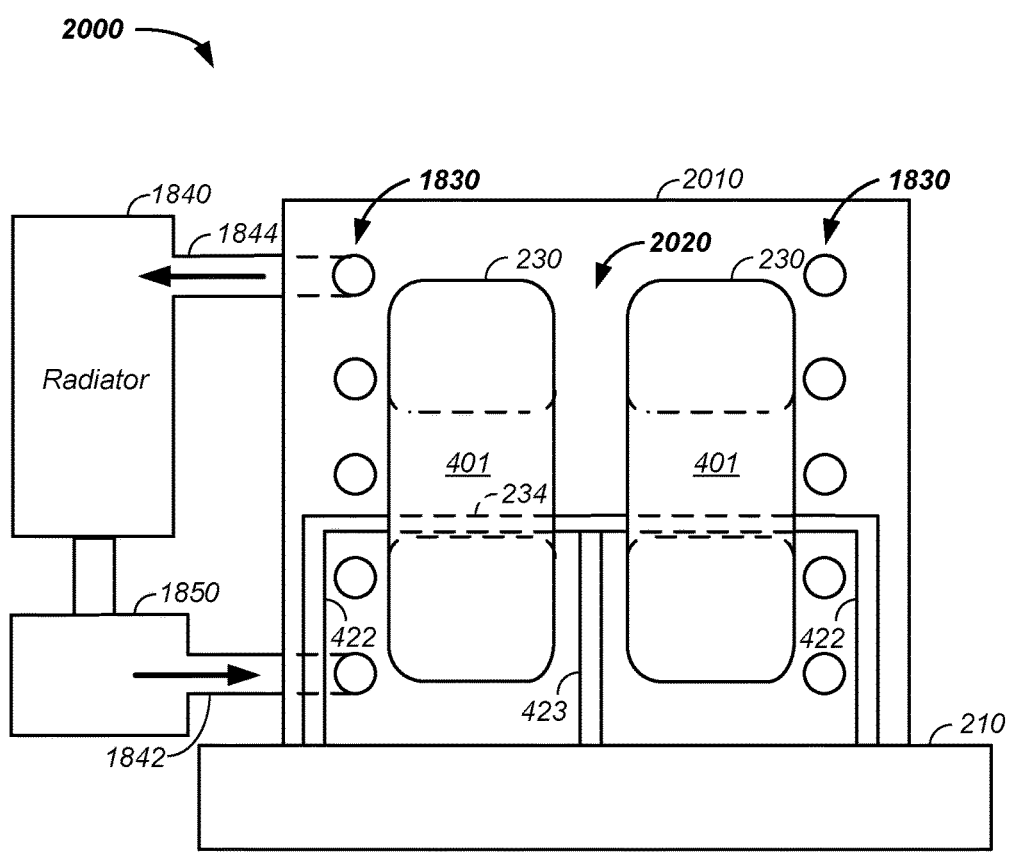
FIG. 20 illustrates an oil/coolant immersed cooling system.

In yet still another example, referring now to FIG. 20, heat is transferred from the inductor 230 to a heat transfer solution 2020 directly contacting at least part of the inductor 230.

In one case, the heat transfer solution 2020 transfers heat from the inductor 230 to an inductor housing 2010. In this case, the inductor housing 2010 radiates the heat to the surrounding environment, such as through a heat sink 1640.

In another case, the inductor 230 is in direct contact with the heat transfer solution 2020, such as partially or totally immersed in a non-conductive liquid coolant. The heat transfer solution 2020 absorbs heat energy from the inductor 230 and transfers a portion of that heat to a cooling line 1830 and/or a cooling coil and a coolant therein. The cooling line 1830, through which a coolant flows runs through the heat transfer solution 2020. The coolant caries the heat out of the inductor housing 2010 where the heat is removed from the system, such as in a heat exchanger or radiator 1840. The heat exchanger radiates the heat outside of the sealed inductor housing 2010. The process of heat removal transfer allows the inductor 230 to maintain an about steady state temperature under load.

For instance, an inductor 230 with an annular core, a doughnut shaped inductor, an inductor with a toroidal core, or a substantially circular shaped inductor is at least partially immersed in an immersion coolant, where the coolant is in intimate and direct thermal contact with a magnet wire, a winding coating, or the windings 610 about a core of the inductor 230. Optionally, the inductor 230 is fully immersed or sunk in the coolant. For example, an annular shaped inductor is fully immersed in an insulating coolant that is in intimate thermal contact with the heated magnet wire heat of the toroid surface area. Due to the direct contact of the coolant with the magnet wire or a coating on the magnet wire, the coolant is substantially non-conducting.

The immersion coolant comprises any appropriate coolant, such as a gas, liquid, gas/liquid, or suspended solid at any temperature or pressure. For example, the coolant optionally comprises: a non-conducting liquid, a transformer oil, a mineral oil, a colligative agent, a fluorocarbon, a chlorocarbon, a fluorochlorocarbon, a deionized water/alcohol mixture, or a mixture of non-conducting liquids. Less preferably, the coolant is de-ionized water. Due to pinholes in the coating on the magnet wire, slow leakage of ions into the de-ionized water results in an electrically conductive coolant, which would short circuit the system. Hence, if de-ionized water is used as a coolant, then the coating should prevent ion transport. Alternatively, the de-ionized cooling water is periodically filtered and/or changed. Optionally, an oxygen absorber is added into the coolant, which prevents ozonation of the oxygen due the removal of the oxygen from the coolant.

Still referring to FIG. 20, the inductor housing 2010 optionally encloses two or more inductors 230. The inductors 230 are optionally vertically mounted using mounting hardware 422 and a clamp bar 234. The clamp bar optionally runs through the two or more inductors 230. An optional clamp bar post 423 is positioned between the inductors 230.

Chill Plate

Often, an inductor 230 in an electrical system is positioned in industry in a sensitive area, such as in an area containing heat sensitive electronics or equipment. In an inductor 230 cooling process, heat removed from the inductor 230 is typically dispersed in the local environment, which can disrupt proper function of the sensitive electronics or equipment.

Figure 21:
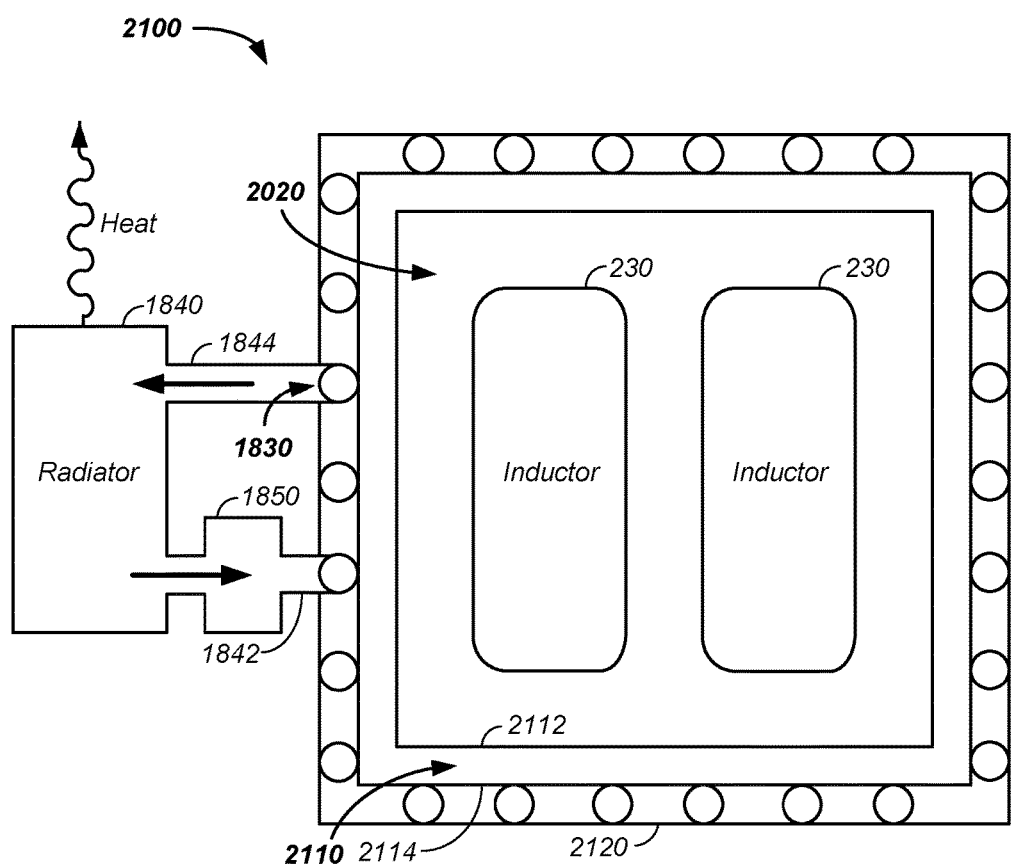
FIG. 21 illustrates use of a chill plate in cooling an inductor.

In yet still another example, a chill plate is optionally used to minimize heat transfer from the inductor 230 to the local surrounding environment, which reduces risk of damage to surrounding electronics. Referring now to FIG. 21, one or more inductors 230 are placed into a heat transfer medium. Moving outward from an inductor, FIG. 21 is described in terms of layers. In a first layer about the inductor, a thermal transfer agent is used, such as an immersion coolant 2020, described supra. Optionally, the heat transfer medium is a solid, a semi-solid, or a potting compound, as described supra. In a second layer about the immersion coolant, a heat transfer interface 2110 is used. The heat transfer interface is preferably a solid having an inner wall interface 2112 and an outer wall interface 2114. In a third layer, a chill plate is used. In one case, the chill plate is hollow and/or has passages to allow flow of a circulating coolant. In another case, the chill plate contains cooling lines 1830 through which a circulating coolant flows. An optional fourth layer is an outer housing or air.

In use, the inductor 230 generates heat, which is transferred to the immersion coolant. The immersion coolant transfers heat to the heat transfer interface 2110 through the inner wall surface 2112. Subsequently, the heat transfer interface 2110 transfers heat through the outer wall interface 2114 to the chill plate. Heat is removed from the chill plate through the use of the circulating fluid, which removes the heat to an outside environment removed from the sensitive area in the local environment about the inductor 230.

Phase Change Cooling

Figure 22:
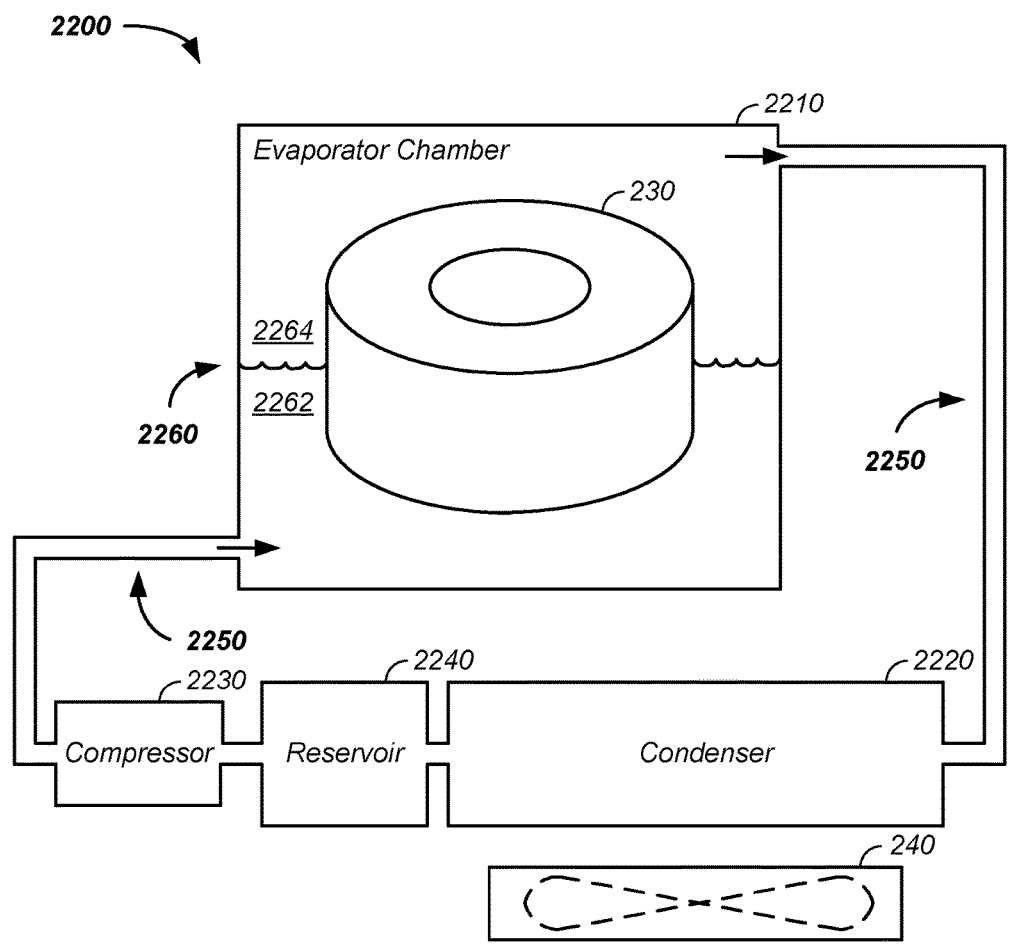
FIG. 22 illustrates a refrigerant phase change on the surface of an inductor.

Referring now to FIG. 22, a phase change inductor cooling system 2200 is illustrated. In the phase change inductor cooling system 2200, a refrigerant 2260 is present about the inductor 230, such as in direct contact with an element of the inductor 230, in a first liquid refrigerant phase 2262 and in a second gas refrigerant phase 2264. The phase change from a liquid to a gas requires energy or heat input. Heat produced by the inductor 230 is used to phase change the refrigerant 2260 from a liquid phase to a gas phase, which reduces the heat of the environment about the inductor 230 and hence cools the inductor 230.

Still referring to FIG. 22, an example of the phase change inductor cooling system 2200 is provided. An evaporator chamber 2210, which encloses the inductor 230, is used to allow the compressed refrigerant 2260 to evaporate from liquid refrigerant 2262 to gas refrigerant 2264 while absorbing heat in the process. The heated and/or gas phase refrigerant 2260 is removed from the evaporator chamber 2210, such as through a refrigeration circulation line 2250 or outlet and is optionally recirculated in the cooling system 2200. The outlet optionally carries gas, liquid, or a combination of gas and liquid. Subsequently, the refrigerant 2260 is optionally condensed at an opposite side of the cooling cycle in a condenser 2220, which is located outside of the cooled compartment or evaporation chamber 2210. The condenser 2220 is used to compress or force the refrigerant gas 2264 through a heat exchange coil, which condenses the refrigerant gas 2264 into a refrigerant liquid 2262, thus removing the heat previously absorbed from the inductor 230. A fan 240 is optionally used to remove the released heat from the condenser 2220. Optionally, a reservoir 2240 is used to contain a reserve of the refrigerant 2240 in the recirculation system. Subsequently, a gas compressor 2230 or pump is optionally used to move the refrigerant 2260 through the refrigerant circulation line 2250. The compressor 2230 is a mechanical device that increases the pressure of a gas by reducing its volume. Herein, the compressor 2230 or optionally a pump increases the pressure on a fluid and transports the fluid through the refrigeration circulation line 2250 back to the evaporation chamber 2210 through an inlet, where the process repeats. Preferably the outlet is vertically above the inlet, the inlet is into a region containing liquid, and the outlet is in a region containing gas. In one case, the refrigerant 2260 comprises 1,1,1,2-Tetrafluoroethane, R-134a, Genetron 134a, Suva 134a or HFC-134a, which is a haloalkane refrigerant with thermodynamic properties similar to dichlorodifluoromethane, R-12. Generally, any non-conductive refrigerant is optionally used in the phase change inductor cooling system 2200. Optionally, the non-conductive refrigerant is an insulator material resistant to flow of electricity or a dielectric material having a high dielectric constant or a resistance greater than 1, 10, or 100 Ohms.

Cooling Multiple Inductors

In yet another example, the cooling system optionally simultaneously cools multiple inductors 230. For instance, a series of two or more inductor cores of an inductor/converter system are aligned along a single axis, where a single axis penetrates through a hollow geometric center of each core. A cooling line or a potting material optionally runs through the hollow geometric center.

Cooling System

Preferably cooling elements work in combination where the cooling elements include one or more of:
- a thermal transfer agent;
- a thermally conductive potting agent;
- a circulating coolant;
- a fan;
- a shroud;
- vertical inductor mounting hardware 422;
- a stand holding inductors at two or more heights from a base plate 210;
- a cooling line 1830;
  - a wrapping cooling line 1832 about the inductor 230;
  - a concentric cooling line on a face 417 of the inductor 230
  - a pass through cooling line 1834 passing through the inductor 230
- a cooling coil;
- a heat sink 1640;
- a chill plate 2120; and
  - coolant flowing through the chill plate.

In another embodiment, the winding 620 comprises a wire having a non-circular cross-sectional shape. For example, the winding 620 comprises a rectangular, rhombus, parallelogram, or square shape. In one case, the height or a cross-sectional shape normal or perpendicular to the length of the wire is more than ten percent larger or smaller than the width of the wire, such as more than 15, 20, 25, 30, 35, 40, 50, 75, or 100 the length.

Filtering

The inductor 230 is optionally used as part of a filter to: process one or more phases and/or is used to process carrier waves and/or harmonics at frequencies greater than one kiloHertz.

Winding

Figure 23:
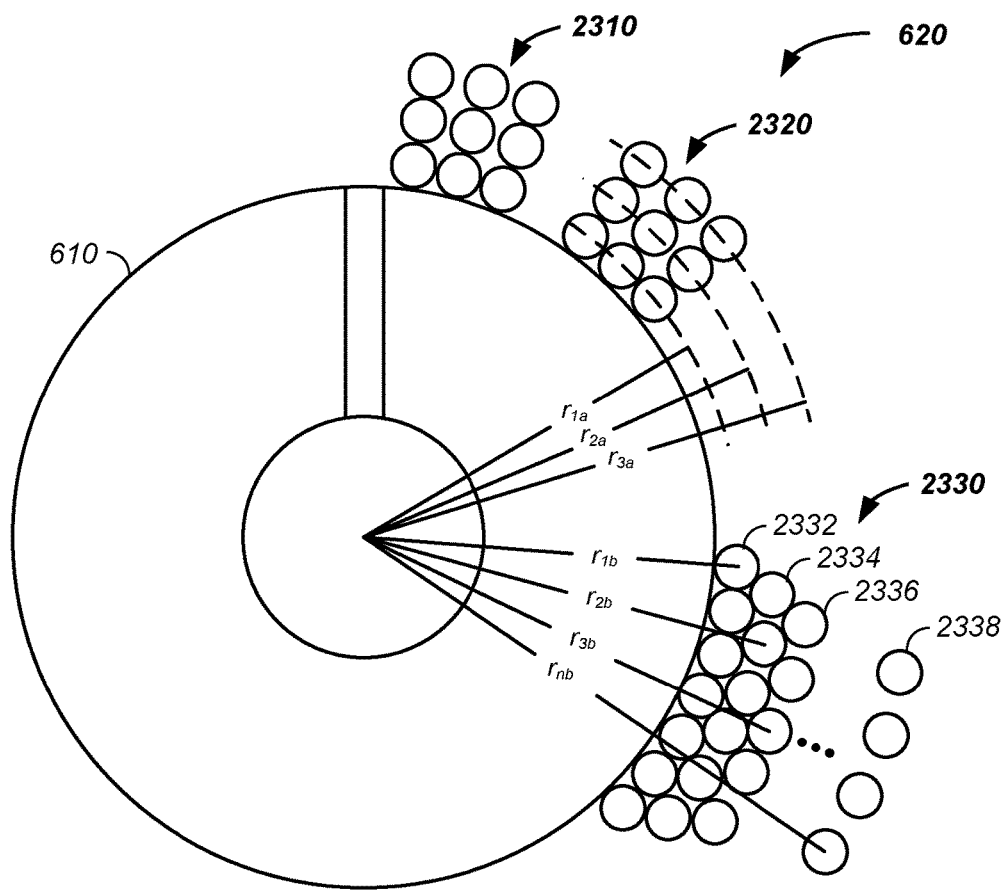
FIG. 23 illustrates multiple turns, each turn wound in parallel.

Referring now to FIG. 23, the inductor core 610 is wound with the winding 620 using one or more turns. Optionally, individual windings are grouped into turn locations, as described supra. As illustrated in FIG. 22, a first turn location 2310 is wound with a first turn of a first wire, a second turn location 2320 is wound with a second turn of the first wire, and a third turn location is wound with a third turn of the first wire, where the process is repeated n times, where n is a positive integer. Optionally, a second, third, fourth, . . . , $a^{th}$ wires wound with each of the $a^{th}$ wires are wound with a first, second, third, . . . , $b^{th}$ turn sequentially in the n locations, where the $a^{th}$ wires are optionally wired electrically in parallel, where a and b are positive integers. As illustrated in the second turn location 2320, the turns are optionally stacked. As illustrated in the third turn location 2330, the turns are optionally stacked in a semi-close packed orientation, where a first layer of turns 2332, a second layer of turns 2334, a third layer of turns 2336, and a $c^{th}$ layer of turns comprise increased radii from a center of the inductor core 610, where c is a positive integer.

Figure 24A:
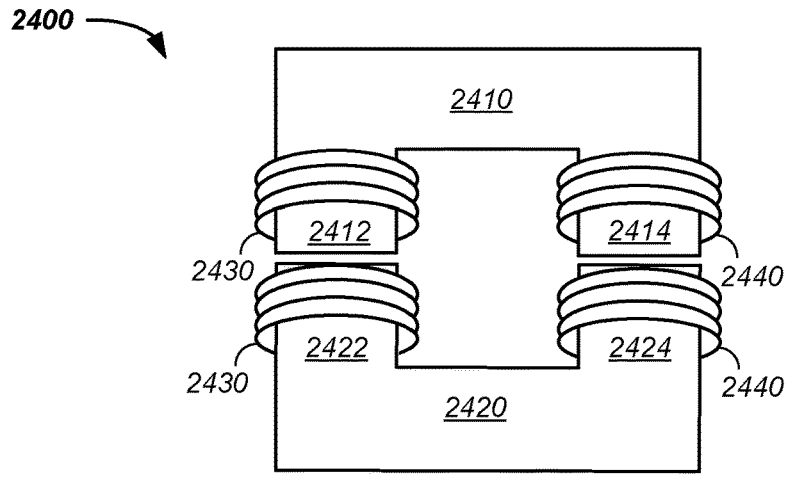
FIG. 24A and FIG. 24C illustrate a U-core inductor and FIG. 24B illustrates an E-core inductor.
Figure 24B:
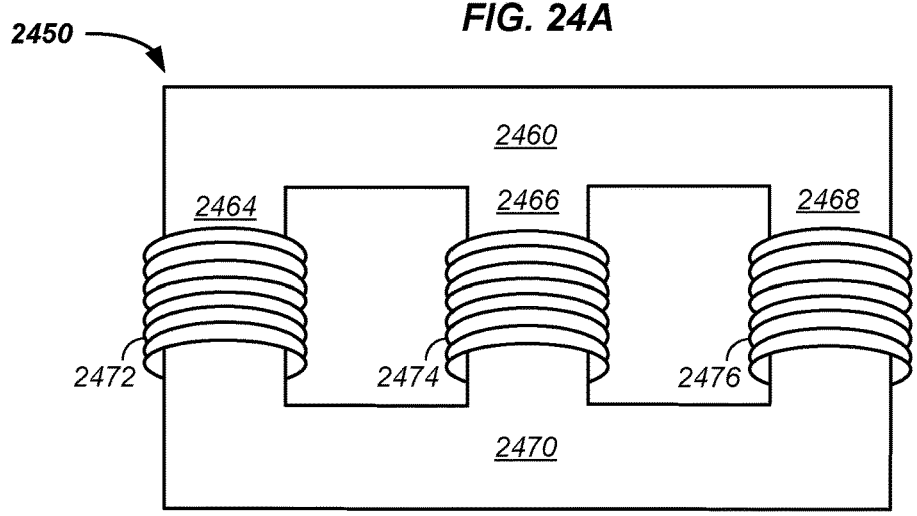

Still referring to FIG. 23 and now referring to FIGS. 24(A-C), the inductor core is optionally of any shape. An annular core is illustrated in FIG. 23, a 2-phase U-core inductor 2400 is illustrated in FIG. 24A, and a 3-phase E-core inductor 2450 is illustrated in FIG. 24B, where each core is wound with a winding using one or more turns as further described, infra.

Figure 24C:
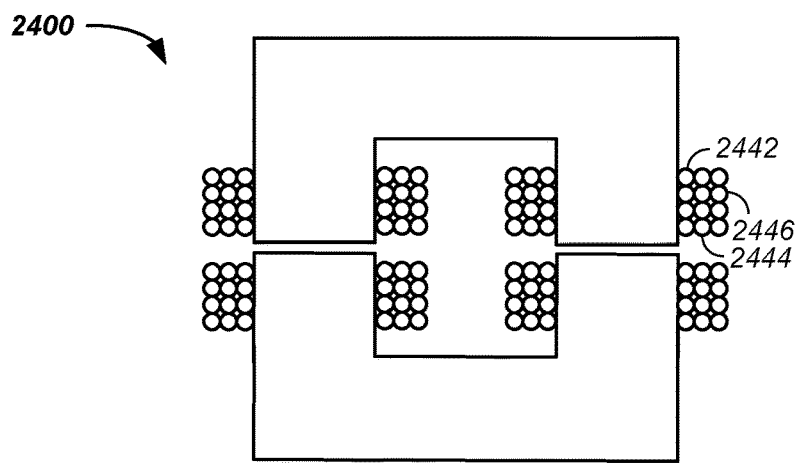

Referring again to FIGS. 24A and 24C, the U-core inductor 2400 is further described. The U-core inductor 2400 comprises a core loop comprising: a first C-element backbone 2410 and a second C-element 2420 backbone where ends of the C-elements comprise: a first yoke and a second yoke. As illustrated, the first yoke comprises a first yoke-first half 2412 and a first yoke-second half 2422 separated by an optional gap for ease of manufacture. Similarly, the second yoke comprises a second yoke-first half 2414 and a second yoke-second half 2424 again separated by an optional gap for ease of manufacture. The first yoke is wound with a first phase winding 2430, shown with missing turns to show the gap, and the second yoke is wound with a second phase winding 2440, again illustrated with missing coils to show the gap. Referring now to FIG. 24C, the second phase winding 2440 is illustrated with three layers of turns, a first layer 2442, a second layer 2444, and a third layer 2446, where any number of layers with any stacking geometry is optionally used. Individual layers are optionally wired electrically in parallel.

Referring now to FIG. 24B, the E-core inductor 2450 is further described. The E-core comprises: a first E-core backbone 2460 and a second E-core backbone 2462 connected by three yokes, a first E-yoke 2464, a second E-yoke 2466, and a third E-yoke 2468. The three yokes each optionally have gaps for ease of manufacture; however, as illustrated a first E-yoke winding 2472, a second E-yoke winding 2474, and a third E-yoke winding 2476 hide the optional gaps.

Referring again to FIG. 23 and FIGS. 24(A-C), any of the gaps, turns, windings, winding layers, and/or core materials described herein are optionally used for any magnet core, such as the annular, "U", and "E" cores as well as a core for a single phase, such as a straight rod-shaped core.

Core Material

Figure 25:
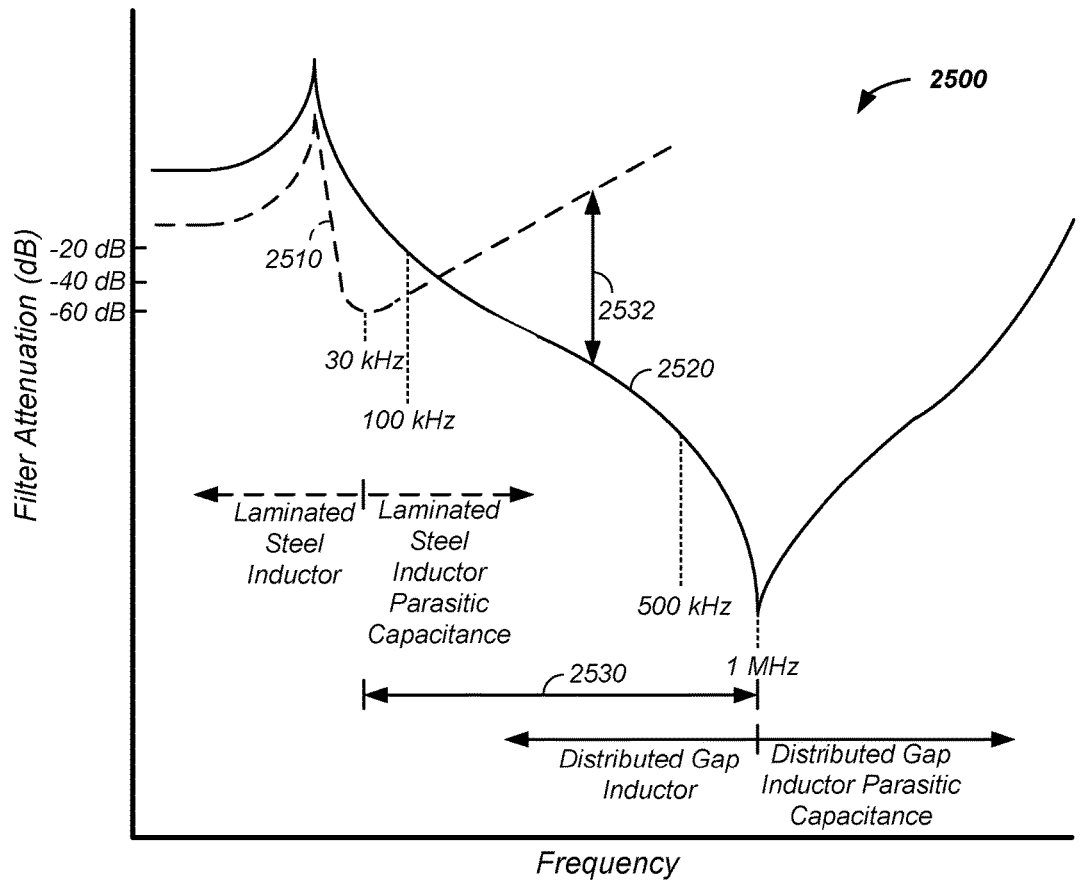
FIG. 25 illustrates filter attenuation for iron and powdered cores.

Referring now to FIG. 25, L-C filtering performance of core materials 2500 are described and compared with Bode curves. A circuit, such as an inductor-capacitor or LC circuit, further described infra, generally functions over a frequency range to attenuate noise, and/or upper frequency harmonics of the carrier frequency by greater than 10, 20, 30, 40, 50, 60, 70, 80, 90, 95, 99, or 99.9 percent or greater than 20, 30, 40, 50, 60, or 70 decibels. For a traditional solid, non-powdered, iron based core, iron core filter performance 2510, such as for a 60 Hz/100 ampere signal, is illustrated as a dashed line, where the traditional iron core is any iron-steel, steel, laminated steel, ferrite, ferromagnetic, and/or ferromagnetic based substantially solid core. The curve shows enhanced filter attenuation, from a peak at $1/(2\pi(LC)^{1/2})$, at about 600 Hertz down to a minimum, at the minimum resonance frequency, after which point the core material rapidly degrades due to laminated steel inductor parasitic capacitance. Generally, inductor filter attenuation ability degrades beyond a minimum resonance frequency for a given current, where beyond the minimum resonance frequency a laminated steel and/or silicon steel inductor yields parasitic capacitance. For iron, the minimum resonant frequency occurs at about thirty kiloHertz, such as for 60 Hz at 100 amperes, beyond which the iron overheats and/or fails as an inductor. Generally, for ampere levels greater than about 30, 50, or 100 amperes, iron-steel cores fail to effectively attenuate at frequencies greater than about 10, 20, or 30 kHz. However, for the distributed gap inductor described herein, the filter attenuation performance continues to improve, such as compared to the solid iron core inductor 2532, past one kiloHertz, such as past 30, 50, 100, or 200 kiloHertz up to about 500 kiloHertz, 1 megaHertz (MHz), or 3 MHz even at high ampere levels, such as greater than 20, 30, 50, or 100 amperes, as illustrated with the distributed gap filter performance curve 2520. As such, the distributed gap core material in the inductor of an inductor-capacitor circuit continues to function as an inductor in frequency ranges 2530 where a solid iron based inductor core fails to function as an inductor, such as past the about 10, 20, or 30 kiloHertz. In a first example, for a 30 kHz carrier frequency, the traditional steel-iron core cannot filter a first harmonic at 60 kHz or a second harmonic at 90 kHz, whereas the distributed gap cores described herein can filter the first and second harmonics at 60 and 90 kHz, respectively. In a second example, the distributed gap based inductor core can continue to suppress harmonics from about 30 to 1000 kHz, from 50 to 1000 kHz, and/or from 100 to 500 kHz. In a third example, use of the distributed gap core material and/or non-iron-steel material in the an LC filter attenuates 60 dB, for at least a first three odd harmonics, of the carrier frequency as the first three harmonics are still on a filtered left side or lower frequency side of an inductor resonance point and/or self-resonance point, such as illustrated on a Bode plot. Hence, the distributed gap cores described herein perform: (1) as inductors at higher frequency than is possible with solid iron core inductors and (2) with greater filter attenuation performance than is possible with iron inductors to enhance efficiency.

Filter Circuit

Figure 26:
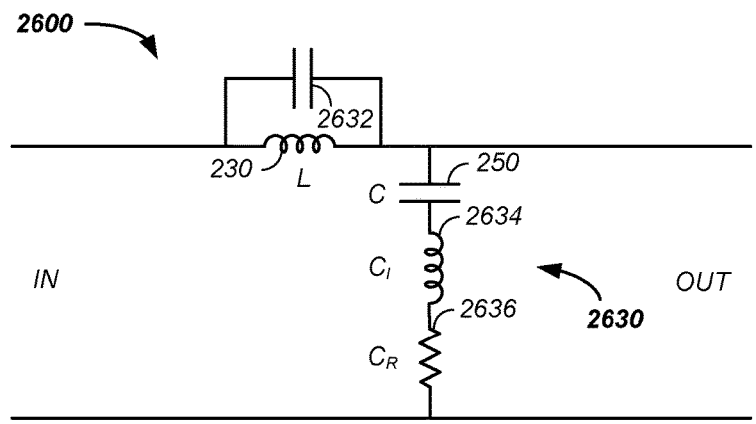
FIG. 26 illustrates a high frequency inductor-capacitor filter.

Referring now to FIG. 26, a parasitic capacitance removing LC filter 2600 is illustrated, which is an LC filter with optional extra electrical components. The LC filter includes at least the inductor 230 and the capacitor 250, described supra. The optional electrical components 2630 function to remove noise and/or to process parasitic capacitance.

High Frequency LC Filter:

Referring now to FIG. 26, the high frequency LC filter 145, which is a low-pass filter, is further described. An example of a parasitic capacitance removing LC filter 2600 is illustrated. However, the only required elements of the high frequency LC filter 145 are the inductor (L) 230, such as any of the inductors described herein, and the capacitor (C) 250. Optionally, additional circuit elements are used, such as to filter and/or remove parasitic capacitance. In one example, a parasitic capacitance filter 2630 uses one or more of: (1) a parasitic capacitance capacitor 2632 wired electrically in parallel with the inductor 230; and/or (2) a set of parasitic capacitance capacitors wired in series, where the set of capacitors is wired in parallel with the inductor 230. In another example, the optional electrical components of the parasitic capacitance removing LC filter include: (1) a parasitic capacitance inductor and/or a parasitic capacitance resistor wired in series with the capacitor 250; (2) one or both of a resistor, $C_R$, 2636 and a second inductor, $C_I$, 2634 wired in series with the capacitor 250; and/or (3) a resistor wired in series with the inductor 230, where the resistor wired in series with the inductor 230 are optionally electrically in parallel with the parasitic capacitance capacitor 2632 (not illustrated).

Variable Current Operation

Generally, power loss is related to the square of current time resistance. Hence, current is the dominant term in power loss. Therefore, for efficiency, the operating current of a device is preferably kept low. For example, instead of turning on a device, such as an air conditioner operating at a high voltage and current, fully on and off, it is more efficient to replace the on/off relay with a drive to run the device continuously, such as at a lower voltage of twenty-five volts with a corresponding lower current. However, the drive outputs a noisy signal, which can hinder the device. A filter, such as an inductor capacitance (LC) filter, is used to filter the high frequency noise allowing operation of the device at a fixed lower current or a variable lower current. At high currents, traditional laminated steel inductors in the LC filter loose efficiency and/or fail, whereas distributed gap based inductors still operate efficiently. Differences in filtering abilities of the laminated steel inductor-capacitor and the distributed gap inductor-capacitor are further described herein.

LC Filter

Figure 27A:
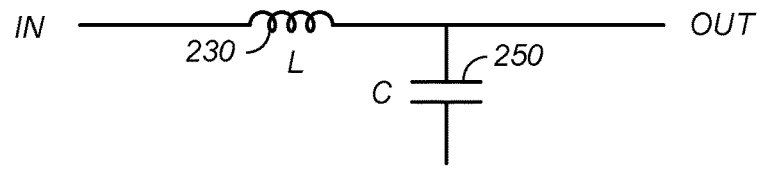
FIG. 27A illustrates an inductor-capacitor filter and FIG. 27B illustrates corresponding filter attenuation profiles as a function of frequency.
Figure 27B:
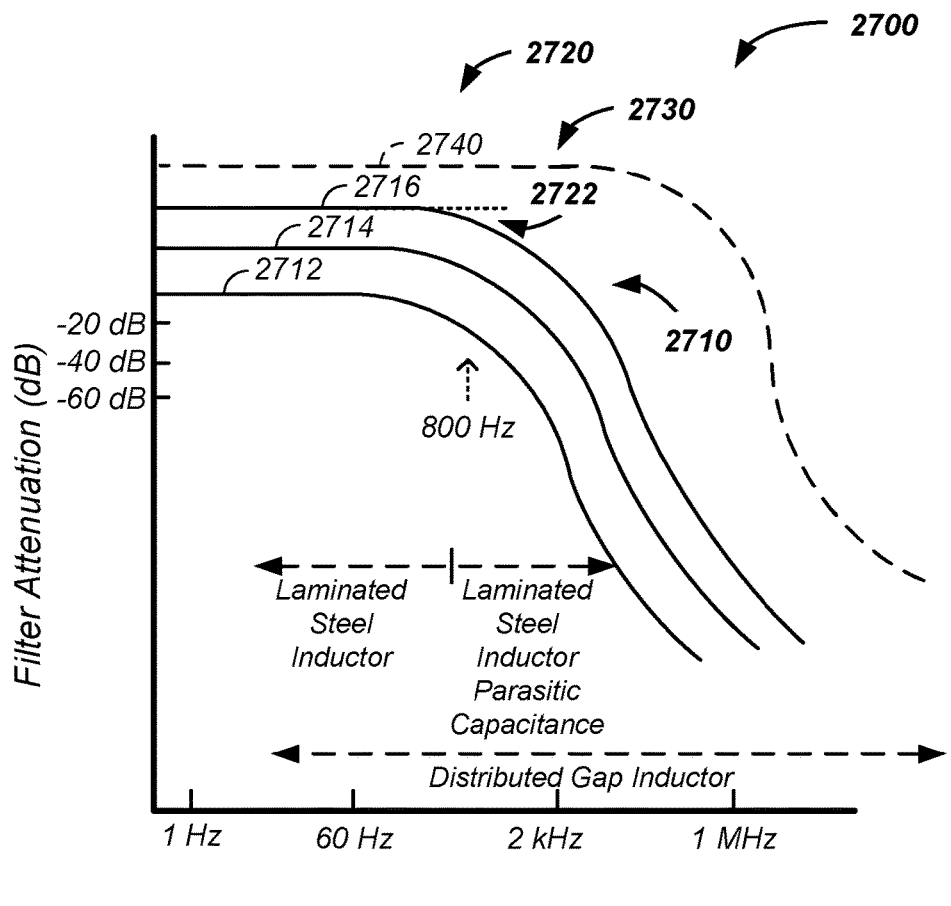

Referring now to FIG. 27A, an inductor-capacitor filter is illustrated, which is referred to herein as an LC filter. The LC filter optionally uses a traditional laminated steel inductor or a distributed gap inductor, as described supra. Generally, an inductor has increasing attenuation as a function a frequency and a capacitor tends to favor higher frequencies. Hence, an inductor, wired in series, has an increasing attenuation as a function of frequency and the capacitor, linked closer to ground and acting as a drain, discriminates against higher frequencies. For a drive filter system using low current, a traditional laminated steel inductor suffices. However at higher currents, such as at greater than 50 or 100 amperes, the traditional laminated steel inductors fail to efficiently pass the carrier frequency, such as at above 500, 600, 700, 800, 900, or 1000 Hz and fail to attenuate the noise above 30, 50, 100, or 200 kHz, as illustrated in FIG. 25 and FIG. 27B. In stark contrast, the distributed gap inductor, described supra, continues to pass the carrier frequency far beyond 500 or 1000 Hz up to 0.25, 0.5, or 1.0 MHz and reduces higher frequency noise, such as in the range of up to 1-3 MHz before parasitic capacitance becomes a concern, as further described infra.

High Frequency LC Filter

Referring now to FIG. 27B, LC filter attenuation as a function of frequency 2700 is illustrated for LC filters using traditional laminated steel inductors 2710, which are referred to herein as traditional LC filters. The illustrated filter shapes are offset along the y-axis for clarity of presentation. The traditional laminated steel inductors in an LC circuit efficiently pass low frequencies, such as up to about 500 Hz. However, at higher frequencies, such as at greater than 600, 700, or 800 Hz, the traditional LC filters begin to attenuate the signal resulting in an efficiency loss 2722 or falloff from no attenuation. Using a traditional laminated steel inductor, the position of the roll-off in efficiency is controllable to a limited degree using various capacitor and filter combinations as illustrated by a first traditional LC filter combination 2712, a second traditional LC filter combination 2714, and a third traditional LC filter combination 2716. However, the roll-off in efficiency 2722 occurs at about 800 Hz regardless of the component parameters in a traditional LC filter 2710 due to the physical properties of the steel in the laminated steel. Thus, use of a traditional laminated steel inductor in an LC filter results in lost efficiency at greater than 600 to 800 Hz with still increasing loss in efficiency at still higher frequencies, such as at 1, 1.5, or 2 kHz. In stark contrast, use of a distributed gap core in the inductor in a distributed gap LC filter 2730 efficiently passes higher frequencies, such as greater than 800, 2,000, 10,000, 50,000, or 500,000 Hz.

High Frequency Notched LC Filter

When an LC filter is on or off, efficiency is greatest and when an LC filter is switching between on and off, efficiency is degraded. Hence, an LC filter is optionally and preferably driven at lower frequencies to enhance overall efficiency. Returning to the example of a fundamental frequency of 800 Hz, the distributed gap LC filter 2730 is optionally used to remove very high frequency noise, such as at greater than 0.5, 1, or 2 MHz. However, the distributed gap LC filter 2730 is optionally used with a second low-pass filter and/or a notch filter to reduce high frequency noise in a range exceeding 1, 2, 3, 5, or 10 kHz and less than 100, 500, or 1000 kHz. The second LC filter, notch filter, and related filters are described infra.

Figure 28A:
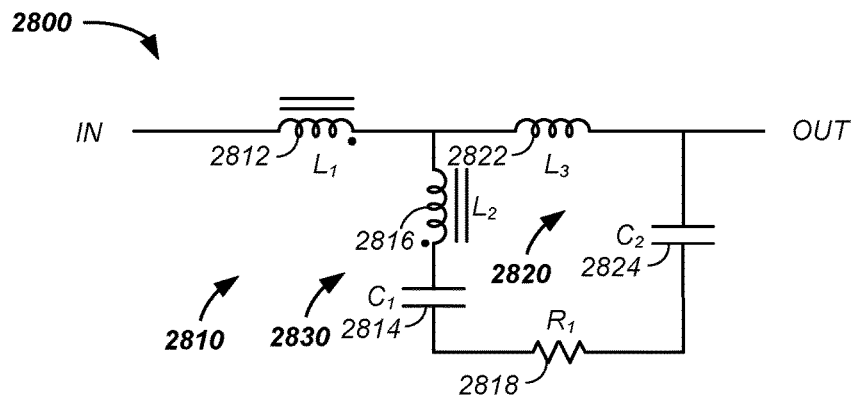
FIG. 28A illustrates a high roll-off low pass filter and FIG. 28B illustrates corresponding filter attenuation profiles as a function of frequency.

Referring now FIG. 28A, a notched low-pass filter circuit is illustrated. A notched low-pass filter 2800 is also referred to herein as a first low-pass filter 2270. Generally, the first low-pass filter 2810 is coupled with either: (1) the traditional laminated steel inductors 2710 or (2) more preferably the distributed gap LC filter 2740, either of which are herein referred to as a second low-pass filter 2820. Several examples, infra, illustrate the first low-pass filter coupled to the second low-pass filter.

Still referring to FIG. 28A, in a first example, the first low-pass filter 2810 comprises a first inductor, $L_1$, 2812 connected in series to a third inductor, $L_3$, 2822 of the second low-pass filter 2820 and a second capacitor, $C_2$, 2814 connected in parallel to the second low-pass filter 2820, which is referred to herein as an LC-LC filter. The LC-LC filter yields a sharper cutoff of the combined low-pass filter.

Still referring to FIG. 28A, in a second example, the first low-pass filter 2810 comprises: (1) a first inductor, $L_1$, 2812 connected in series to a third inductor, $L_3$, 2822 of the second low-pass filter 2820 and (2) a notch filter 2830 comprising a second inductor, $L_2$, 2816, where the first inductor to second inductor ($L_1$ to $L_2$) coupling is between 0.3 and 1.0 and preferably about 0.9±0.1, where $L_2$ is wired in series with the first capacitor, $C_1$, 2814, where the notch filter 2830 is connected in parallel to the second low-pass filter 2820. The resulting filter is referred to herein as any of: (1) an LLC-LC filter, (2) a notched LC filter, (3) the notched low-pass filter 2800, and/or (4) a low pass filter combined with a notch filter and a high frequency roll off filter. In use, generally the second inductor, $L_2$, 2816 and the first capacitor, $C_1$, 2814 combine to attenuate a range or notch of frequencies, where the range of attenuated frequencies is optionally configured using different parameters for the second inductor, $L_2$, 2822 and the first capacitor, $C_1$, 2814 to attenuate fundamental and/or harmonic frequencies in the range of 1, 2, 3, 5, or 10 kHz to 20, 50, 100, 500, or 1000 kHz. The effect of the notch filter 2830 is a notched shape or attenuated profile 2722 in the base distributed gap based LC filter shape.

Figure 28B:
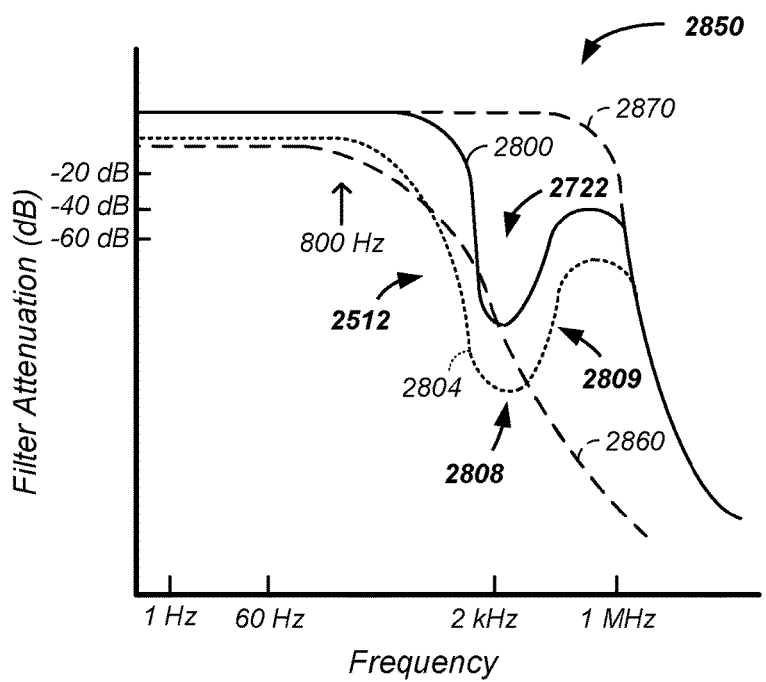

Referring now to FIG. 28B, filtering efficiencies 2850 are compared for a traditional laminated steel based LC filter 2860, a distributed gap based LC filter 2870, and the notched low-pass filter 2800. As described, supra, the traditional laminated steel based LC filter 2860 attenuates some carrier frequency signal at 800 Hz, which reduces efficiency of the LC filter. Also, as described supra, while the distributed gap based LC filter 2870 efficiently passes the carrier frequency at 800 Hz, efficient attenuation of the fundamental frequency occurs at relatively high frequencies, such as at greater than 500 kHz. However, the notched low-pass filter 2800 both: (1) efficiently passes the carrier frequency at 800 Hz and (2) via the notch filter 2830 attenuates the fundamental frequency at a low frequency, such as at 2 kHz±0.5 to 1 kHz, where the lower switching frequency enhances efficiency of the filter.

Still referring to FIG. 28B, the notch 2802 of the notched low-pass filter 2800 is controllable in terms of: (1) frequency of maximum notch attenuation 2808, (2) roll-off shape/slope of the short-pass filter 2512, and (3) degree of attenuation through selection of the parameters of the second inductor, $L_2$, 2816 and/or the first capacitor, $C_1$, 2814 and optionally with a resistor in series with the second inductor 2816 and first capacitor 2814, where the resistor is used to broaden the notch. One illustrative example is a second notched low-pass filter 2804, which illustrates an altered roll-off shape 2806, notch minimum 2808, and recovery slope 2809 of the notch filter relative to the first notched low-pass filter 2800.

Still referring to FIG. 28B, via selection of parameters of at least one of the second inductor, $L_2$, 2816 and/or the first capacitor, $C_1$, 2814 in view of selection of at parameters for other elements of the notched low-pass filter 2800, the overall notched low-pass filter shape results in any of:
- less than 2 or 5 dB attenuation of the carrier frequency at 500, 600, 700, 800, 900, or 1,000 Hz;
- greater than 20, 40, 60, or 80 dB of attenuation at 1, 2, 3, 4, or 5 kHz;
- a ratio of a carrier frequency attenuated less than 10 dB to an attenuation frequency attenuated at greater than 60 dB of less than 800 to 2000, 8:20, 1:2, 1:3, 1:4, or 1:5;
- a width of 50% of maximum attenuation of the notch filter of less than 1, 2, 3, 4, 5, 10, 50, or 100 kHz;
- a width of 50% of maximum attenuation of the notch filter of greater than 1, 2, 3, 4, 5, 10, 50, or 100 kHz;
- a maximum notch filter attenuation within 1 kHz of 1, 2, 3, 4, 5, 7, and 10 kHz; and/or
- a maximum notch filter attenuation at greater than any of 1, 2, 3, 5, 10, 20, and 50 kHz and less than any of 3, 5, 10, 20, 50, 100, 500, or 1,000 kHz.

To further clarify the invention and without loss of generality, example parameters for the first low-pass filter 2810 are provided in Table 3.

TABLE 3

| | Notch Filter | | | |
| --- | --- | --- | --- | --- |
| | Notch Filter | | | |
| Purpose | $L_1$ (µH) | $L_2$ (µH) | $C_1$ (µF) | $R_1$ (Ohm) |
| best filter | 10 ± 5 | 4 ± 3 | 300 ± 50 | 2 ± 2 |

To further clarify the invention and without loss of generality, example parameters for the notched low-pass filter 2800 are provided in Table 4.

TABLE 4

| | Notched Low-Pass Filter | | | | | |
| --- | --- | --- | --- | --- | --- | --- |
| | First Low-Pass Filter | | | | Second Low-Pass Filter | |
| Purpose | $L_1$ (µH) | $L_2$ (µH) | $C_1$ (µF) | $R_1$ (Ohm) | $L_3$ (µH) | $C_2$ (µF) |
| 800 Hz carrier; 2000 Hz notch | 12 ± 5 | 3 ± 2 | 300 ± 50 | 3 ± 2 | 30 ± 20 | 200 ± 100 |

Herein, a set of fixed numbers, such as 1, 2, 3, 4, 5, 10, or 20 optionally means at least any number in the set of fixed number and/or less than any number in the set of fixed numbers.

In still yet another embodiment, the invention comprises and combination and/or permutation of any of the elements described herein.

The particular implementations shown and described are illustrative of the invention and its best mode and are not intended to otherwise limit the scope of the present invention in any way. Indeed, for the sake of brevity, conventional manufacturing, connection, preparation, and other functional aspects of the system may not be described in detail. While single PWM frequency, single voltage, single power modules, in differing orientations and configurations have been discussed, adaptations and multiple frequencies, voltages, and modules may be implemented in accordance with various aspects of the present invention. Furthermore, the connecting lines shown in the various figures are intended to represent exemplary functional relationships and/or physical couplings between the various elements. Many alternative or additional functional relationships or physical connections may be present in a practical system.

In the foregoing description, the invention has been described with reference to specific exemplary embodiments; however, it will be appreciated that various modifications and changes may be made without departing from the scope of the present invention as set forth herein. The description and figures are to be regarded in an illustrative manner, rather than a restrictive one and all such modifications are intended to be included within the scope of the present invention. Accordingly, the scope of the invention should be determined by the generic embodiments described herein and their legal equivalents rather than by merely the specific examples described above. For example, the steps recited in any method or process embodiment may be executed in any order and are not limited to the explicit order presented in the specific examples. Additionally, the components and/or elements recited in any apparatus embodiment may be assembled or otherwise operationally configured in a variety of permutations to produce substantially the same result as the present invention and are accordingly not limited to the specific configuration recited in the specific examples.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

Although the invention has been described herein with reference to certain preferred embodiments, one skilled in the art will readily appreciate that other applications may be substituted for those set forth herein without departing from the spirit and scope of the present invention. Accordingly, the invention should only be limited by the Claims included below.

The invention claimed is:

1. A method for potting an electrical component, comprising the steps of:
   placing said electrical component in a housing;
   preheating both a potting agent and a heat transfer agent to in excess of ninety-five degrees Fahrenheit;
   mixing said potting agent, comprising a thermal conductivity of less than 0.3 W/m-K, with said heat transfer agent, comprising a thermal conductivity of greater than 0.5 W/m-K, to form a potting material; and
   dispensing said potting material about said electrical component in said housing to form a potted electrical component, said potting material positioned about said electrical component, within said housing, and within a quarter inch of said electrical component,
   wherein said heat transfer agent comprises particles, wherein ninety-five percent of said particles comprise a diameter of less than 1500 micrometers,
   wherein said potting agent comprises at least thirty percent by mass of said potting material, and
   wherein said heat transfer agent comprises at least thirty percent by mass of said potting material.

2. The method of claim 1, said potted electrical component comprising an inductor, said inductor further comprising:
   a distributed gap inductor core material, comprising:
      a plurality of layered particles, a first set of alternating layers of said layered particles comprising a magnetic material, a second set of alternating layers of said layered particles comprising a substantially non-magnetic material; and
      a gap material between said plurality of layered particles, said gap material forming an average closest distance between two adjacent particles, of said layered particles, of less than one millimeter,
      wherein a majority of said layered particles comprise average layer thicknesses of less than one millimeter; and
   a winding, said winding circumferentially surrounding at least a portion of said inductor core, said potting material within one millimeter of an outer surface of said winding,
   wherein said heat transfer agent comprises greater than seventy-five percent silicon dioxide.

3. The method of claim 2, further comprising the step of:
   electrically connecting said inductor and a capacitor to a high frequency converter comprising a switching device, said switching device comprising:
      a silicon carbide metal-oxide-semiconductor field-effect transistor, said high frequency converter configured to yield: (1) current of at least fifty amperes; (2) voltage of at least one hundred volts; and (3) high frequency harmonics in a range greater than fifty kiloHertz.

4. The method of claim 1, further comprising the step of:
   embedding at least one cooling line in said potting material, said cooling line configured for use cooling an inductor, said potted electrical component comprising said inductor.

5. The method of claim 1, further comprising the step of:
   configuring said potted electrical component and a capacitor to deliver filtered primary power of at least 50 amperes at greater than 740 Hz to a permanent magnet motor, said potted electrical component comprising a potted inductor, said filtered primary power comprising a harmonic at 2000 Hz attenuated by at least 60 dB.

6. The method of claim 5, said potting material comprising at least ten percent by weight silicon dioxide, said potting material comprising a solid material in contact with said inductor.

* * * * *